US012625620B2

(12) United States Patent
Ahn et al.

(10) Patent No.: US 12,625,620 B2
(45) Date of Patent: *May 12, 2026

(54) NON-VOLATILE MEMORY DEVICE, STORAGE DEVICE, OPERATING METHOD OF STORAGE CONTROLLER, AND OPERATING METHOD OF THE STORAGE DEVICE

(71) Applicant: SAMSUNG ELECTRONICS CO., LTD., Suwon-si (KR)

(72) Inventors: Hyojin Ahn, Suwon-si (KR); Seoyeong Lee, Suwon-si (KR); Hoon Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/945,678

(22) Filed: Nov. 13, 2024

(65) Prior Publication Data

US 2025/0068333 A1 Feb. 27, 2025

Related U.S. Application Data

(63) Continuation of application No. 18/215,320, filed on Jun. 28, 2023, now Pat. No. 12,189,965.

(30) Foreign Application Priority Data

Oct. 12, 2022 (KR) ........................ 10-2022-0130917

(51) Int. Cl.
G06F 12/00 (2006.01)
G06F 3/06 (2006.01)
(Continued)

(52) U.S. Cl.
CPC .......... G06F 3/0619 (2013.01); G06F 3/0659 (2013.01); G06F 3/0679 (2013.01);
(Continued)

(58) Field of Classification Search
CPC . G06F 3/0659; G06F 3/0679; G11C 16/0483; G11C 16/08; G11C 16/26;
(Continued)

(56) References Cited

U.S. PATENT DOCUMENTS

| | | | |
|---|---|---|---|
| 7,269,092 B1 * | 9/2007 | Miwa | G11C 29/028 365/230.06 |
| 7,907,444 B2 | 3/2011 | Sarin et al. | |

(Continued)

FOREIGN PATENT DOCUMENTS

| | | | |
|---|---|---|---|
| CN | 2045551 U | * | 6/1988 |
| CN | 202454287 U | | 9/2012 |

(Continued)

*Primary Examiner* — Shawn X Gu
*Assistant Examiner* — Mohammad S Hasan
(74) *Attorney, Agent, or Firm* — Sughrue Mion, PLLC

(57) ABSTRACT

In some embodiments, an operating method of a storage device includes obtaining a plurality of points by searching for a first valley point between threshold voltage distributions of selection memory cells coupled to a selection word line of a plurality of word lines; calculating, using a first function, a first voltage level that corresponds to a first reference count value; calculating, using a second function, a second voltage level that corresponds to the first reference count value; classifying the selection memory cells into a plurality of coupling patterns according to an aggressor cell group of each of adjacent memory cells coupled to at least one adjacent word line adjacent to the selection word line; and performing a read operation, based on the plurality of coupling patterns of the selection memory cells, the first voltage level, and the second voltage level.

20 Claims, 39 Drawing Sheets

(51) Int. Cl.

| | |
|---|---|
| *G11C 16/04* | (2006.01) |
| *G11C 16/08* | (2006.01) |
| *G11C 16/26* | (2006.01) |
| *H10B 43/27* | (2023.01) |

(52) U.S. Cl.
CPC .......... *G11C 16/0483* (2013.01); *G11C 16/08* (2013.01); *G11C 16/26* (2013.01); *H10B 43/27* (2023.02)

(58) Field of Classification Search
CPC . G11C 16/3427; G11C 11/5642; G11C 16/24; G11C 16/34; G11C 16/30; H10B 43/27
See application file for complete search history.

(56) References Cited

U.S. PATENT DOCUMENTS

| | | | |
|---|---|---|---|
| 8,817,545 | B2 | 8/2014 | Seol et al. |
| 9,671,969 | B2 | 6/2017 | Shim et al. |
| 9,734,898 | B2 | 8/2017 | Seol et al. |
| 9,864,544 | B2 | 1/2018 | Oh et al. |
| 10,152,380 | B2 | 12/2018 | Yim et al. |
| 10,340,947 | B2 | 7/2019 | Oh et al. |
| 10,600,489 | B2 | 3/2020 | Kodama et al. |
| 10,691,346 | B2 | 6/2020 | Han |
| 10,790,035 | B2 | 9/2020 | Choi et al. |
| 11,048,585 | B2 | 6/2021 | Kim |
| 11,264,102 | B2 | 3/2022 | Tachi et al. |
| 11,322,208 | B2 | 5/2022 | Seo et al. |
| 11,355,203 | B2 | 6/2022 | Alhussien et al. |
| 11,474,890 | B2 | 10/2022 | Kim |
| 2006/0098492 | A1 | 5/2006 | Lee |
| 2010/0039861 | A1* | 2/2010 | Park ................... G11C 16/3427 365/185.11 |
| 2010/0124121 | A1 | 5/2010 | Seo |
| 2018/0107540 | A1* | 4/2018 | Lee ................... G11C 16/3431 |
| 2018/0262096 | A1* | 9/2018 | Hsu ................... H02M 3/33507 |
| 2019/0295671 | A1* | 9/2019 | Bang ..................... G11C 16/26 |
| 2021/0375364 | A1 | 12/2021 | Liikanen et al. |
| 2022/0020424 | A1* | 1/2022 | Yudanov ............ G11C 11/4085 |
| 2024/0126453 | A1 | 4/2024 | Ahn |

FOREIGN PATENT DOCUMENTS

| | | | |
|---|---|---|---|
| CN | 110277127 A | | 9/2019 |
| KR | 20090019491 A | * | 8/2007 |
| KR | 10-1100547 B1 | | 12/2011 |
| KR | 10-2017-0120442 A | | 10/2017 |
| KR | 10-2021-0003633 A | | 1/2021 |

* cited by examiner

BLKb

FIG. 25

| Vsrs1 | Vrd11' | Vrd21' | Vrd31' | Vrd41' | Vrd51' | Vrd61' | Vrd71' |
|-------|--------|--------|--------|--------|--------|--------|--------|
| Vsrs2 | Vrd12' | Vrd22' | Vrd32' | Vrd42' | Vrd52' | Vrd62' | Vrd72' |
| Vsrs3 | Vrd13' | Vrd23' | Vrd33' | Vrd43' | Vrd53' | Vrd63' | Vrd73' |
| Vsrs4 | Vrd14' | Vrd24' | Vrd34' | Vrd44' | Vrd54' | Vrd64' | Vrd74' |

Figure 33:
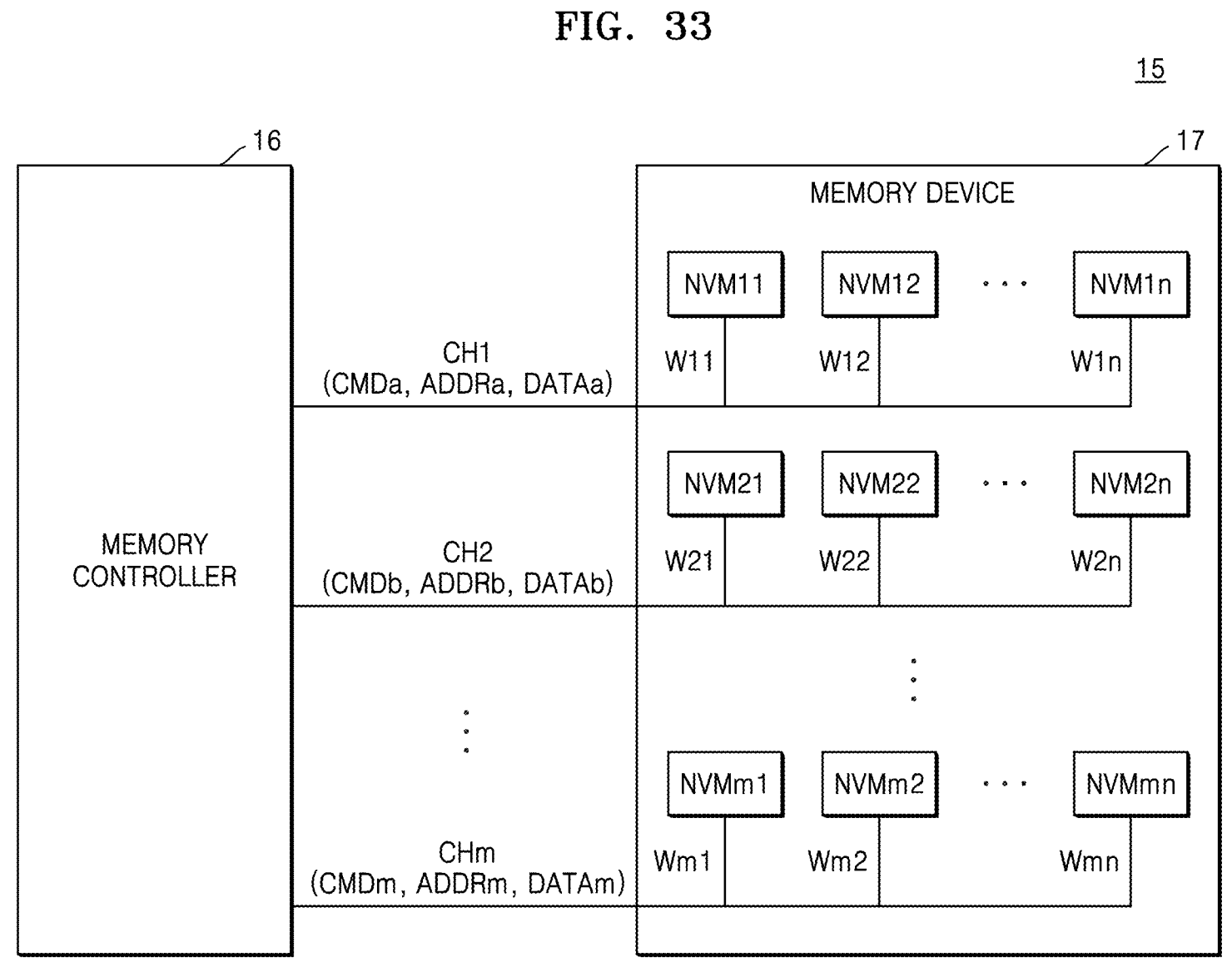

MEMORY DEVICE

17

| NVM11 | NVM12 | · · · | NVM1n |
| W11 | W12 | | W1n |

CH1
(CMDa, ADDRa, DATAa)

| NVM21 | NVM22 | · · · | NVM2n |
| W21 | W22 | | W2n |

CH2
(CMDb, ADDRb, DATAb)

· · ·

| NVMm1 | NVMm2 | · · · | NVMmn |
| Wm1 | Wm2 | | Wmn |

CHm
(CMDm, ADDRm, DATAm)

16

MEMORY CONTROLLER

NON-VOLATILE MEMORY DEVICE, STORAGE DEVICE, OPERATING METHOD OF STORAGE CONTROLLER, AND OPERATING METHOD OF THE STORAGE DEVICE

CROSS-REFERENCE TO RELATED APPLICATIONS

This application is a continuation application of U.S. patent application Ser. No. 18/215,320, filed on Jun. 28, 2023, which claims priority to Korean Patent Application No. 10-2022-0130917, filed on Oct. 12, 2022, in the Korean Intellectual Property Office, the disclosures of which are incorporated by reference herein in their entireties.

BACKGROUND

1. Field

The present disclosure relates generally to electronic devices, and more particularly, to a non-volatile memory device configured to perform a data recovery read operation, a storage device, an operating method of a storage controller, and an operating method of the storage device.

2. Description of Related Art

Semiconductor memory devices may be classified into volatile memory devices, such as, but not limited to, dynamic random access memory (DRAM) and static RAM (SRAM), and non-volatile memory devices, such as, but not limited to, electrically erasable and programmable read-only memory (EEPROM), ferroelectric RAM (FRAM), phase-change RAM (PRAM), magnetic RAM (MRAM), and flash memory. Volatile memory devices may lose stored data when power supply is interrupted, while non-volatile memory devices retain stored data even when power supply is interrupted.

Related devices using non-volatile memory devices may include, for example, an Moving Picture Experts Group 1 (MPEG-1) audio layer 3 (MP3) player, a digital camera, a mobile phone, a camcorder, a flash card, a solid-state disk (SSD), and the like. As the number of related devices using non-volatile memory devices as a storage device increases, the capacity of the non-volatile memory devices has increased.

SUMMARY

The present disclosure provides a non-volatile memory device, a storage device, an operating method of a storage controller, and an operating method of the storage device, which may improve the performance of a data recovery read operation.

According to an aspect of the present disclosure, an operating method of a storage device is provided. The operating method includes obtaining a plurality of points by searching for a first valley point between threshold voltage distributions of selection memory cells coupled to a selection word line of a plurality of word lines. Each point of the plurality of points comprising a read voltage level and a memory cell count value. The operating method further includes calculating, using a first function, a first voltage level that corresponds to a first reference count value. The first function corresponds to first points from among the plurality of points having first read voltage levels higher than or equal to a valley read voltage level of the first valley point. The first reference count value is smaller than a first memory cell count value of the first valley point. The operating method further includes calculating, using a second function, a second voltage level that corresponds to the first reference count value. The second function corresponds to second points from among the plurality of points having second read voltage levels smaller than or equal to the valley read voltage level of the first valley point. The operating method further includes classifying the selection memory cells into a plurality of coupling patterns according to an aggressor cell group of each of adjacent memory cells coupled to at least one adjacent word line adjacent to the selection word line. The operating method further includes performing a read operation, based on the plurality of coupling patterns of the selection memory cells, the first voltage level, and the second voltage level.

According to an aspect of the present disclosure, a storage device is provided. The storage device includes a non-volatile memory comprising a plurality of memory cells respectively coupled to a plurality of word lines, and a storage controller configured to provide, to the non-volatile memory, a read command and a selection address, and instruct the non-volatile memory to read data stored in selection memory cells coupled to a selection word line from among the plurality of word lines. The storage controller is further configured to obtain a plurality of points by searching for a valley point between threshold voltage distributions of the selection memory cells. Each point of the plurality of points includes a read voltage level and a memory cell count value. The storage controller is further configured to calculate, using a first function, a first voltage level that corresponds to a first reference count value. The first function corresponds to first points from among the plurality of points having first read voltage levels higher than or equal to a valley read voltage level of the valley point. The first reference count value is smaller than a first memory cell count value of the valley point. The storage controller is further configured to calculate, using a second function, a second voltage level that corresponds to the first reference count value. The second function corresponds to second points from among the plurality of points having second read voltage levels smaller than or equal to the valley read voltage level of the valley point. The storage controller is further configured to classify the selection memory cells into a plurality of coupling patterns according to an aggressor cell group of each of adjacent memory cells coupled to at least one adjacent word line adjacent to the selection word line. The storage controller is further configured to calculate a third read voltage level to be applied to the selection memory cells, based on the plurality of coupling patterns of the selection memory cells, the first voltage level, and the second voltage level.

According to an aspect of the present disclosure, an operating method of a storage controller is provided. The operating method includes obtaining a plurality of points by searching for a valley point between threshold voltage distributions of selection memory cells of a plurality of word lines. Each point of the plurality of points include a read voltage level and a memory cell count value. The operating method further includes calculating, using a first function, a first voltage level that corresponds to a first reference count value. The first function corresponds to first points from among the plurality of points having first read voltage levels higher than or equal to a valley read voltage level of the valley point. The first reference count value is smaller than a first memory cell count value of the valley point. The operating method further includes calculating, using a second function, a second voltage level that corresponds to the first reference count value. The second function corresponds to second points from among the plurality of points having second read voltage levels smaller than or equal to the valley read voltage level of the valley point. The operating method further includes grouping, into a plurality of aggressor cell groups, adjacent memory cells connected to at least one adjacent word line. The at least one adjacent word line is adjacent to a selection word line coupled to the selection memory cells. The operating method further includes classifying the selection memory cells into a plurality of coupling patterns according to each of the plurality of aggressor cell groups. The operating method further includes calculating a third read voltage level to be applied to the selection memory cells, based on the plurality of coupling patterns of the selection memory cells, the first voltage level, and the second voltage level.

According to an aspect of the present disclosure, a non-volatile memory device is provided. The non-volatile memory device includes a memory cell array including a plurality of memory cells coupled to a plurality of word lines, a voltage generator configured to generate word line voltages that are applied to the plurality of word lines, and a control logic circuit configured to provide a voltage control signal to the voltage generator. The voltage control signal instructs generation of the word line voltages. The voltage generator is further configured to sequentially apply, during a first period, a plurality of read voltages to a selection word line from among the plurality of word lines. The plurality of read voltages are configured to search for a valley point between threshold voltage distributions of selection memory cells coupled to the selection word line. The voltage generator is further configured to apply, during a second period, at least one group determination read voltage to at least one adjacent word line, which is adjacent to the selection word line. The at least one group determination read voltage is configured to group a plurality of aggressor cell groups of adjacent memory cells coupled to the at least one adjacent word line. The voltage generator is further configured to sequentially apply, during a third period, sub-read voltages to the selection word line. The sub-read voltages corresponds to a plurality of coupling patterns of the selection memory cells having been determined according to the plurality of aggressor cell groups. The sub-read voltages include a first voltage level corresponding to a reference count value in a first linear function that minimizes first distances between the first linear function and points comprising first read voltages and memory cell count values corresponding to the first read voltages in the threshold voltage distributions of the selection memory cells. The first read voltages have levels higher than or equal to a level of a valley read voltage corresponding to the valley point, from among the plurality of read voltages. The reference count value is smaller than a memory cell count value corresponding to the valley point. The sub-read voltages further include a second voltage level corresponding to the reference count value in a second linear function that minimizes second distances between the second linear function and points comprising second read voltages and memory cell count values corresponding to the second read voltages in the threshold voltage distributions of the selection memory cells. The second read voltages have levels equal to or smaller than the level of the valley read voltage corresponding to the valley point, from among the plurality of read voltages.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings, in which:

FIG. 25 illustrates a table of sub-read voltage sets for a triple-level cell (TLC), according to an embodiment;

FIG. 33 is a block diagram of a memory system, according to an embodiment;

FIG. 36 is a diagram of a memory device, according to an embodiment; and

DETAILED DESCRIPTION

Figure 1:
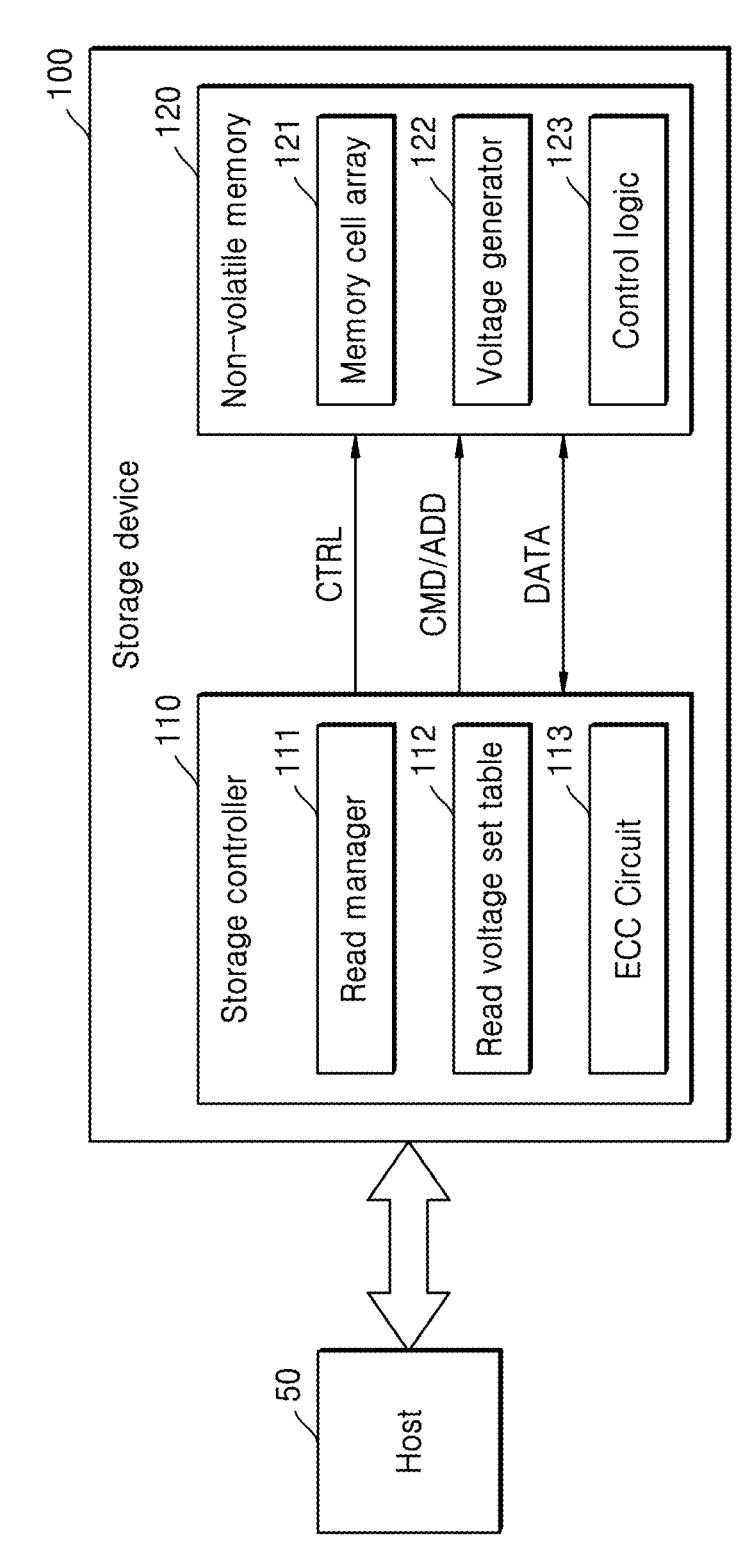
FIG. 1 is a block diagram of a storage system, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art are to recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

Hereinafter, various embodiments of the present disclosure are described with reference to the accompanying drawings.

FIG. 1 is a block diagram of a storage system 10, according to an embodiment.

Referring to FIG. 1, the storage system 10 may include a host 50 and a storage device 100.

The host 50 may communicate with the storage device 100 through an interface. Herein, the interface may be implemented as, for example, non-volatile memory-express (NVMe), NVMe management interface (MI), or NVMe Over Fabric (NVMeof). However, the present disclosure is not limited in this regard. For example, the interface may comply with one or more memory storage standards and/or protocols.

The host 50 may provide the storage device 100 with a write request requesting the storage of data in the storage device 100. Alternatively or additionally, the host 50 may provide a logical address for identifying data and data to the storage device 100. In an embodiment, the logical address may be included in the write request.

The host 50 may provide the storage device 100 with a read request requesting the provision of data stored in the storage device 100. Alternatively or additionally, the host 50 may provide the logical address for identifying data to the storage device 100. In an embodiment, the logical address may be included in the read request.

The storage device 100 may include a storage controller 110 and a non-volatile memory 120. The storage controller 110 and the non-volatile memory 120 may be integrated into one semiconductor device. In an embodiment, the storage controller 110 and the non-volatile memory 120 may be integrated into one semiconductor device and constitute a memory card. For example, the non-volatile memory 120 and the storage controller 110 may be integrated into one semiconductor device and constitute a personal computer (PC) card, a compact flash card, a smart media card, a memory stick, a multimedia card, a secure digital (SD) card, a universal flash storage (UFS) device, or the like. In an optional or additional embodiment, the storage controller 110 and the non-volatile memory 120 may be integrated into one semiconductor device and constitute a solid-state disk/drive (SSD).

In response to a request (e.g., the write request and/or the read request) provided from the host 50, the storage controller 110 may control the non-volatile memory 120 to read data stored in the non-volatile memory 120 and/or write (or program) data to the non-volatile memory 120. That is, the storage controller 110 may control a write operation (or a program operation), a read operation, and an erase operation on the non-volatile memory 120 by providing a command/address CMD/ADD and a control signal CTRL to the non-volatile memory 120. Alternatively or additionally, data to be written and read data may be transmitted and received between the storage controller 110 and the non-volatile memory 120.

In an embodiment, the storage controller 110 may provide a read command and a selection address to the non-volatile memory 120. That is, the read command may refer to a command for instructing the reading of data stored in selection memory cells connected to a selection word line out of a plurality of word lines. The selection address may be an address corresponding to the selection word line.

The storage controller 110 may communicate with the host 50 via one or more standard interfaces. For example, the storage controller 110 may include an interface circuit (not shown), which provides one or more standard interfaces between the host 50 and the storage controller 110. The standard interfaces may include, but not be limited to, advanced technology attachment (ATA), serial ATA (SATA), external SATA (e-SATA), small computer small interface (SCSI), serial attached SCSI (SAS), peripheral component interconnection (PCI), PCI express (PCIe), Institute of Electrical and Electronics Engineers (IEEE) 1394 (FireWire), universal serial bus (USB), secure digital (SD) card, multimedia card (MMC), embedded MMC (eMMC), a UFS device, and a compact flash (CF) card interface.

The storage controller 110 may include a read manager 111, a read voltage set table 112, and an error correction code (ECC) circuit (hereinafter, "ECC circuit") 113.

The read manager 111 may control the non-volatile memory 120 to read data stored in the non-volatile memory 120 in response to the read request provided from the host 50. For example, in response to the read request, the read manager 111 may provide the non-volatile memory 120 with the command/address CMD/ADD for instructing the reading of data. In an embodiment, the command for instructing the reading of data may be referred to as a read command.

The read manager 111 may manage and/or adjust read voltages. For example, when read data is not corrected by the ECC circuit 113, the read manager 111 may adjust a read voltage used by the non-volatile memory 120. The read voltage may refer to a voltage applied to a word line to read data stored in programmed memory cells. The adjusted read voltage may be included in the control signal CTRL. For example, when the read data is not corrected by the ECC circuit 113, the read manager 111 may calculate read voltages to be used for a data recovery read operation. The data recovery read operation may refer to a read operation performed in response to a read voltage corresponding to a state of memory cells connected to a word line adjacent to a selected word line. For example, the read manager 111 may control the non-volatile memory 120 to read data based on a managed read voltage and/or an adjusted read voltage.

In an embodiment, the read manager 111 may use a default read voltage set in response to the read request. When data read due to the default read voltage set is not corrected by the ECC circuit 113, the read manager 111 may use a history read voltage set. When the data read due to the history read voltage set is not corrected by the ECC circuit 113, the read manager 111 may use an optimum read voltage set. As used herein, a read voltage set may be referred to as the default read voltage set, the optimum read voltage set, and/or the history read voltage set.

The default read voltage set may include a read voltage in which a degradation degree of a memory block including a memory cell or memory cells is not reflected. The read voltage included in the default read voltage set may be referred to as a default read voltage, and a type of the default read voltage may vary according to a type of the memory cell. The optimum read voltage set may include a read voltage corresponding to an intersection between different threshold voltage distributions of memory cells. Alternatively or additionally, the optimum read voltage set may include a read voltage obtained as a result of executing a recovery code. The read voltage included in the optimum read voltage set may be referred to as an optimum read voltage, and a type of the optimum read voltage may vary according to the type of the memory cell.

A read pass may be a result of a read operation corresponding to normal data and/or a case in which read data includes an error. Alternatively or additionally, the read pass may be a result of a read operation corresponding to a case in which the read data includes an error that is correctable by the ECC circuit 113. A read fail may be a result of a read operation corresponding to a case in which the read data includes an error that is uncorrectable by the ECC circuit 113.

The read voltage set table 112 may store read voltages calculated by the read manager 111. In some embodiments, the read voltage set table 112 may store the default read voltage set, the optimum read voltage set, and/or the history read voltage set. In an embodiment, the read voltage set table 112 may store read voltages to be used for the data recovery read operation.

The ECC circuit 113 may detect an error in data read by the non-volatile memory 120 and correct the error. In an embodiment, the ECC circuit 113 may generate an ECC for data to be stored in the non-volatile memory 120. The generated ECC may be stored in the non-volatile memory 120 together with data. The ECC circuit 113 may detect the error in data read by the non-volatile memory 120 and correct the error, based on the stored ECC. For example, the ECC circuit 113 may have a predetermined error correction capability. Data including error bits (or fail bits) that exceed the error correction capability of the ECC circuit 113 may be referred to as uncorrectable ECC (UECC) data. In an embodiment, the UECC data may occur when the read operation performed by using each of the default read voltage set, the history read voltage set, and the optimum read voltage set has failed.

The non-volatile memory 120 may include a flash memory device including flash memory cells. However, the present disclosure is not limited in this regard. Hereinafter, the non-volatile memory 120 may be assumed to be a flash memory device. The flash memory cell may be referred to as a memory cell.

The non-volatile memory 120 may include a memory cell array 121. The memory cell array 121 may include a plurality of memory blocks. Each of the memory blocks may include a plurality of memory cells in regions where a plurality of word lines intersect with a plurality of bit lines. The plurality of memory cells may have a plurality of threshold voltage distributions according to programmed data. For example, when each of the memory cells is a single-level cell (SLC) configured to store one bit per memory cell, the memory cells may have two (2) threshold voltage distributions according to a program state. For another example, when each of the memory cells is a multi-level cell (MLC) configured to store two (2) bits per memory cell, the memory cells may have four (4) threshold voltage distributions according to a program state. For yet another example, when each of the memory cells is a triple-level cell (TLC) configured to store three (3) bits per memory cell, the memory cells may have eight (8) threshold voltage distributions according to a program state. When each of the memory cells stores at least four (4) bits per memory cell, the memory cells may have at least 16 threshold voltage distributions according to a program state. One threshold voltage distribution may correspond to a specific state of the memory cell.

The non-volatile memory 120 may include a voltage generator 122. The voltage generator 122 may generate word line voltages and apply the word line voltages to the plurality of word lines. The voltage generator 122 is described below with reference to FIG. 2.

The non-volatile memory 120 may include a control logic 123. The control logic 123 may control the voltage generator 122 to generate word line voltages. The control logic 123 may be referred to as a control logic circuit. The control logic 123 is described below with reference to FIG. 2.

According to an embodiment, a data recovery read operation may be performed by using an optimum read voltage, which is calculated according to an aggressor cell group of adjacent memory cells, and thus, the performance of a read operation may be improved.

Figure 2:
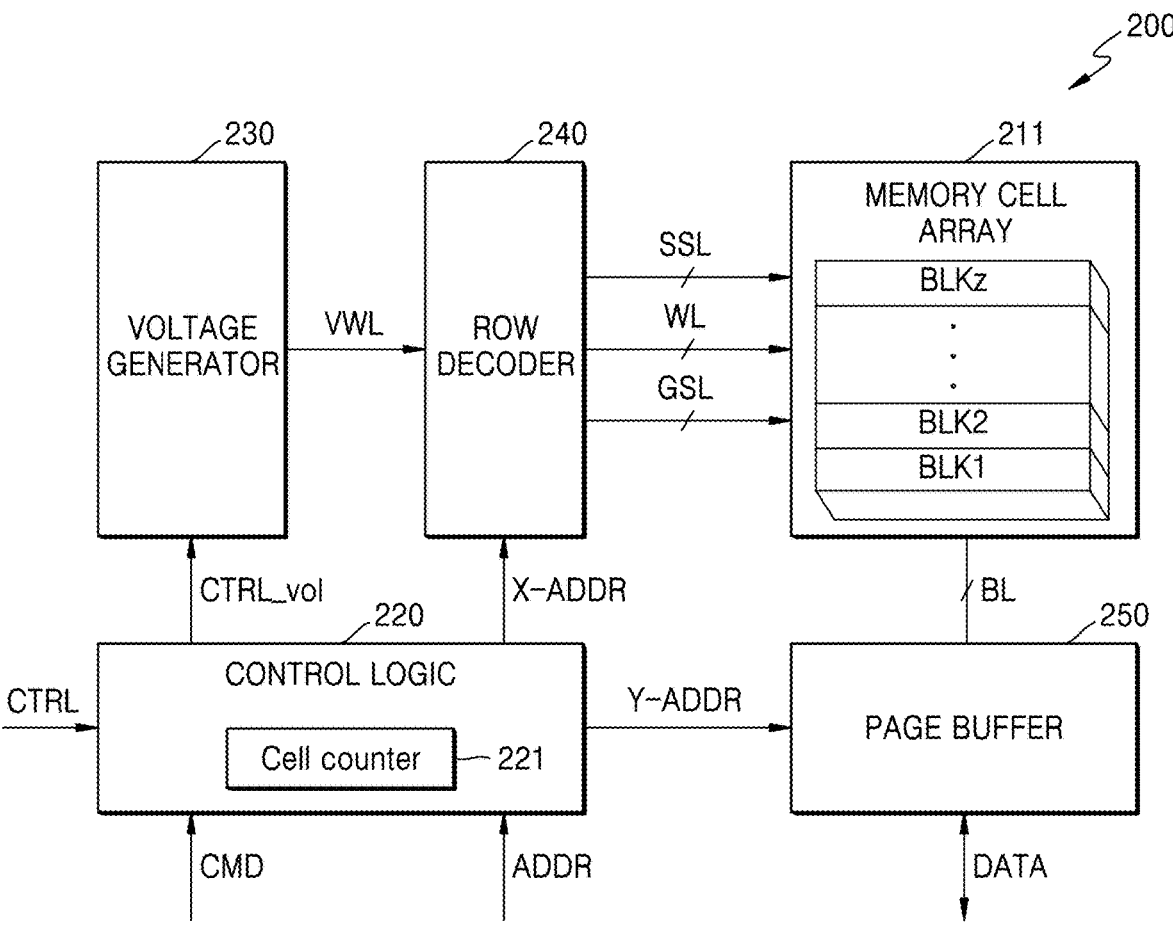
FIG. 2 is a diagram of a non-volatile memory, according to an embodiment.

FIG. 2 is a diagram of a non-volatile memory 200, according to an embodiment.

Referring to FIG. 2, the non-volatile memory 200 may include a memory cell array 211, a control logic 220, a voltage generator 230, a row decoder 240, and a page buffer circuit 250. In an optional or additional embodiment, the non-volatile memory 200 may include a data input/output (I/O) circuit and/or an I/O interface.

The non-volatile memory 200 may include or may be similar in many respects to the non-volatile memory 120 described above with reference to FIG. 1, and may include additional features not mentioned above.

The memory cell array 211 may include a plurality of memory cells and be connected to word lines WL, string selection lines SSL, ground selection lines GSL, and a plurality of bit lines BL. For example, the memory cell array 211 may be connected to the row decoder 240 through word lines WL, string selection lines SSL, and ground selection lines GSL and be connected to the page buffer circuit 250 through the plurality of bit lines BL.

The memory cell array 211 may include a plurality of memory blocks BLK1 to BLKz (hereinafter, "BLK" generally), where z is an integer greater than zero (0). For example, each memory block of the plurality of memory blocks BLK may have a three-dimensional (3D) structure (or a vertical structure). That is, each of memory blocks BLK may include structures extending in first to third directions. For example, each of memory blocks BLK may include a plurality of NAND strings extending in a third direction. In an embodiment, the plurality of NAND strings may be a predetermined distance apart from each other in the first and second directions. The plurality of memory blocks BLK may be selected by the row decoder 240. For example, the row decoder 240 may select a memory block corresponding to a block address out of the plurality of memory blocks BLK.

Each of the memory cells included in the memory cell array 211 may store at least one bit. For example, each of the memory cells may be an SLC configured to store one (1)-bit data. For another example, each of the memory cells may be an MLC configured to store two (2)-bit data. For yet another example, each of the memory cells may be a TLC configured to store three (3)-bit data. For yet another example, each of the memory cells may be a quad-level cell (or quadruple-level cell) (QLC) configured to store four (4)-bit data. However, the present disclosure is not limited in this regard. That is, the memory cells included in the memory cell array 211 may be configured to store more than four (4) bits of data.

The plurality of memory blocks BLK may include at least one of a single-level cell block including SLCs, a multi-level cell block including MLCs, a triple-level cell block including TLCs, and a quad-level cell block including QLCs. That is, from among the plurality of memory blocks BLK included in the memory cell array 211, some memory blocks may be SLC blocks, and other memory blocks may be MLC blocks, TLC blocks, and/or QLC blocks.

In an embodiment, the memory cell array 211 may be configured to place the plurality of memory cells into an erase state, when an erase voltage is applied to the memory cell array 211. Alternatively or additionally, the memory cell array 211 may be configured to place the plurality of memory cells into a program state, when a program voltage is applied to the memory cell array 211. In this case, each of the memory cells may have an erase state or at least one program state, according to a threshold voltage. That is, states of each of the memory cells may include the erase state and the at least one program state, and a predetermined state of each of the memory cells may be the erase state or a predetermined program state.

The control logic 220 may control various operations in the non-volatile memory 200. For example, the control logic 220 may write data to the memory cell array 211 and/or output various control signals for reading data from the memory cell array 211, based on a command CMD, an address ADDR, and a control signal CTRL.

The various control signals output from the control logic 220 may be provided to the voltage generator 230, the row decoder 240, and the page buffer circuit 250. The control logic 220 may provide a voltage control signal CTRL_vol to the voltage generator 230.

In some embodiments, the control logic 220 may further include a cell counter 221. The cell counter 221 may count the number of memory cells that fall within a predetermined threshold voltage range, from data sensed by the page buffer circuit 250. The cell counter 221 may generate a memory cell count value indicating the number of memory cells. In an embodiment, a memory cell that is counted may be referred to as an OFF cell. In an optional or additional embodiment, a memory cell that is counted may be referred to as an ON cell.

The voltage generator 230 may be connected to the memory cell array 211 through a plurality of word lines WL. The voltage generator 230 may generate various voltages for performing a program operation, a read operation, and an erase operation on the memory cell array 211, based on the voltage control signal CTRL_vol. The voltage generator 230 may generate word line voltages VWL, for example, a program voltage, a verification voltage, a read voltage, and an erase voltage.

The program voltage, the verification voltage, the read voltage, and the erase voltage, which may be generated by the voltage generator 230, may be provided to a selected word line out of the plurality of word lines WL. The selected word line may be at least one word line selected by a row address X-ADDR. The selected word line may be referred to as a selection word line.

At the erase operation, the voltage generator 230 may apply the erase voltage to a well and/or a common source line of a memory block. Alternatively or additionally, the voltage generator 230 may apply an erase permission voltage (e.g., a ground voltage) to the word lines WL of the memory block or word lines WL corresponding to some sub-blocks, based on an erase address. At an erase verification operation, the voltage generator 230 may apply an erase verification voltage to the word lines WL of one memory block or apply the erase verification voltage by a unit of one word line.

At a program operation, the voltage generator 230 may apply a program voltage to the selection word line of the plurality of word lines WL and apply a program pass voltage to unselected word lines of the plurality of word lines WL. At a program verification operation, the voltage generator 230 may apply a program verification voltage to the selection word line and apply a verification pass voltage to the unselected word lines.

At a normal read operation, the voltage generator 230 may apply a read voltage to the selection word line and apply a read pass voltage to the unselected word lines.

At a data recovery read operation, the voltage generator 230 may apply a read pass voltage to the selection word line and apply a read voltage to at least one word line adjacent to the selection word line. Alternatively or additionally, the voltage generator 230 may apply a read voltage to the selection word line and apply a read voltage to at least one word line adjacent to the selection word line. A word line adjacent to the selection word line may be referred to as an adjacent word line.

The row decoder 240 may select a predetermined word line out of the word lines WL in response to a row address X-ADDR received from the control logic 220. For example, at the program operation, the row decoder 240 may provide a program voltage to the selected word line. Alternatively or additionally, the row decoder 240 may select some of the string selection lines SSL and/or some of the ground selection lines GSL in response to the row address X-ADDR received from the control logic 220.

The page buffer circuit 250 may be connected to the memory cell array 211 through the plurality of bit lines BL. The page buffer circuit 250 may select some bit lines out of the plurality of bit lines BL in response to a column address Y-ADDR received from the control logic 220. At a verification operation (e.g., the erase verification operation and/or the program verification operation) and/or the read operation, the page buffer circuit 250 may operate as a sense amplifier and sense data stored in the selected memory cell through the selected bit line. Moreover, at the program operation, the page buffer circuit 250 may operate as a write driver and input desired data in the memory cell array 211. The page buffer circuit 250 may include a plurality of page buffers. For example, each of the page buffers may be connected to at least one bit line.

The page buffer circuit 250 may store data read from the memory cell array 211 and/or store data to be stored in the memory cell array 211.

The page buffer circuit 250 may include a plurality of page buffers respectively connected to the plurality of bit lines BL. The plurality of page buffers may be located to respectively correspond to the plurality of bit lines BL. Each of the page buffers may include a plurality of latches. Hereinafter, the page buffer circuit 250 may be defined as including the page buffer connected to each of the bit lines BL. However, in some embodiments, terms may be defined differently. For example, one page buffer may be provided to correspond to a plurality of bit lines BL, and a unit of component arranged to correspond to each bit line BL may be defined as a page buffer unit.

In an embodiment, the control logic 220, the voltage generator 230, the row decoder 240, and the page buffer circuit 250 may be included in a peripheral circuit.

Figure 3:
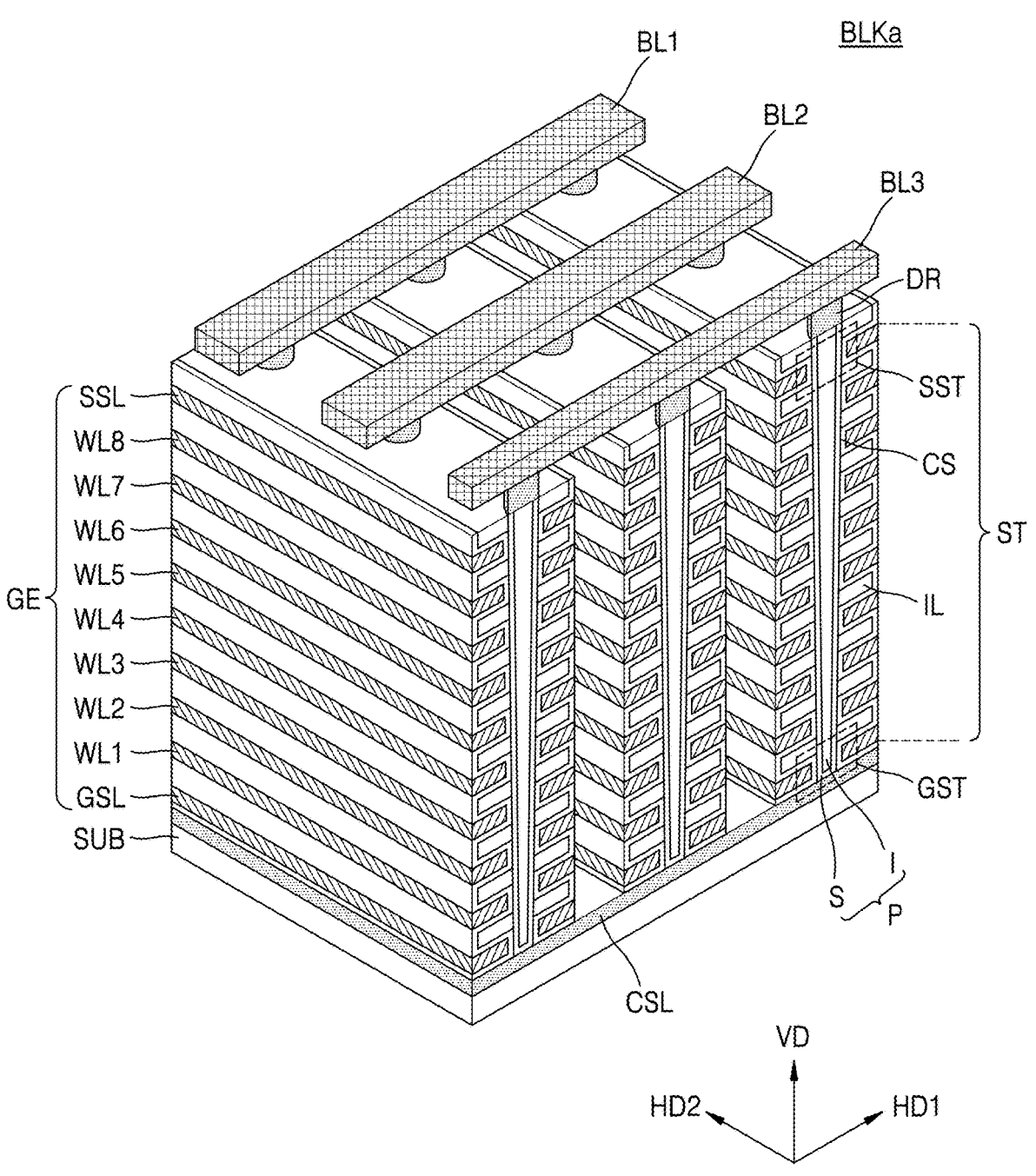
FIG. 3 is a perspective view of a memory block, according to an embodiment.

FIG. 3 is a perspective view of a memory block BLKa according to an embodiment. That is, the memory block BLKa of FIG. 3 may include or may be similar in many respects to at least one of the plurality of memory blocks BLK1 to BLKz of FIGS. 1 and 2, and may include additional features not mentioned above.

Referring to FIG. 3, the memory block BLKa may include a stack ST, which extends on a substrate SUB in a vertical direction VD. For example, the memory block BLKa may include a single stack ST between the substrate SUB and first to third bit lines BL1 to BL3. A common source line CSL may be on the substrate SUB. On the substrate SUB between two (2) adjacent common source lines CSL, insulating films IL extending in the second lateral direction HD2 may be sequentially provided in the vertical direction VD. The insulating films IL may be a predetermined distance apart from each other in the vertical direction VD. On the substrate SUB between two (2) adjacent common source lines CSL, pillars P may pass through the plurality of insulating films IL in the vertical direction VD. As used herein, a pillar may be referred to as a channel hole. Each of the pillars P may be formed in a cup shape (or a cylindrical shape with a closed bottom), which extends in the vertical direction VD). Specifically, a surface layer S of each of the pillars P may include a silicon material of a first type and function as a channel region. Moreover, an inner layer I of each of the pillars P may include an insulating material (e.g., silicon oxide) and/or an air gap.

In a region between two (2) adjacent common source lines CSL, a charge storage layer CS may be provided along exposed surfaces of the insulating films IL, the pillars P, and the substrate SUB. The charge storage layer CS may include a gate insulating layer, a charge trap layer, and a block insulating layer. For example, the charge storage layer CS may have an oxide-nitride-oxide (ONO) structure. In a region between two (2) adjacent common source lines CSL, a gate electrode GE including, for example, selected lines GSL and SSL and word lines WL1 to WL8, may be provided on an exposed surface of the charge storage layer CS. Drains DR may be provided on the plurality of pillars P, respectively. On the drains DR, the first to third bit lines BL1 to BL3 may extend in the first lateral direction HD1 and be a predetermined distance apart from each other in the second lateral direction HD2.

Figure 4:
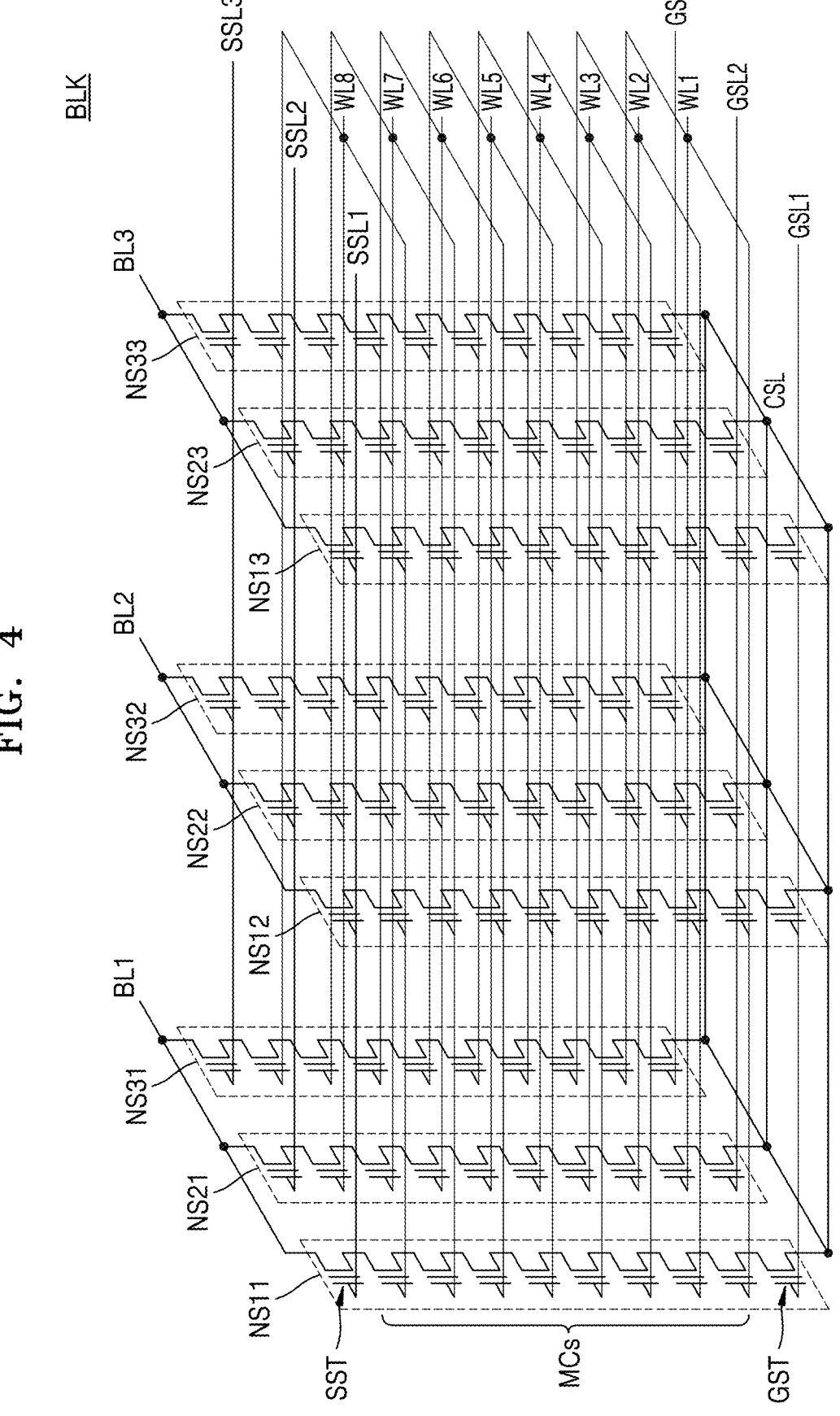
FIG. 4 is a circuit diagram of a memory block, according to an embodiment.

FIG. 4 is a circuit diagram of a memory block BLK, according to an embodiment. That is, the memory block BLK of FIG. 4 may include or may be similar in many respects to at least one of the plurality of memory blocks BLK1 to BLKz of FIGS. 1 and 2, and the memory block BLKa of FIG. 3, and may include additional features not mentioned above.

Referring to FIG. 4, the memory block BLK may include NAND strings NS11 to NS33, and each (e.g., NS11) of the NAND strings NS11 to NS33 may include a string selection transistor SST, a plurality of memory cells MCs, and a ground selection transistor GST, which may be connected, (e.g., coupled) in series. The string selection transistor SST, the ground selection transistor GST, and the memory cells MCs, which are in each of the NAND strings NS11 to NS33, may form a structure that is stacked on a substrate in a vertical direction (e.g., an orthogonal direction with respect to a plane of the substrate surface).

In an embodiment, bit lines (e.g., first to third bit lines BL1 to BL3 may extend in a first direction, and word lines (e.g., WL1 to WL8) may extend in a second direction. The NAND strings NS11, NS21, and NS31 may be between the first bit line BL1 and a common source line CSL. The NAND strings NS12, NS22, and NS32 may be between the second bit line BL2 and the common source line CSL. The NAND strings NS13, NS23, NS33 may be between the third bit line BL3 and the common source line CSL.

The string selection transistor SST may be connected to string selection lines SSL1 to SSL3 corresponding thereto. The memory cells MCs may be respectively connected to the word lines WL1 to WL8 corresponding thereto. The ground selection transistor GST may be connected to ground selection lines GSL1 to GSL3 corresponding thereto. The string selection transistor SST may be connected to a bit line corresponding thereto, and the ground selection transistor GST may be connected to the common source line CSL. It is to be understood that the number of NAND strings, the number of word lines, the number of bit lines, the number of ground selection lines, and the number of string selection lines may be variously changed according to some embodiments.

Figure 5:
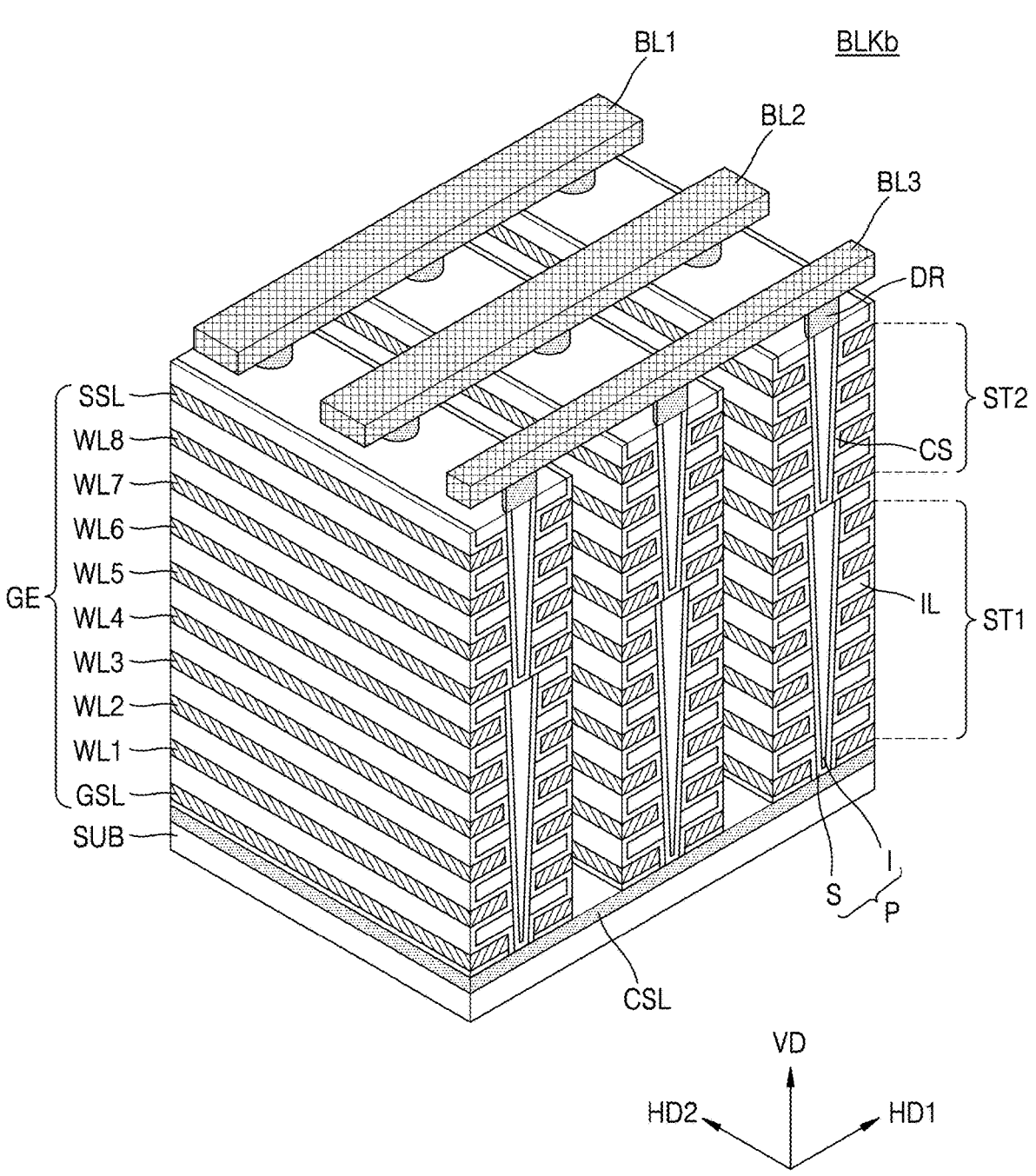
FIG. 5 is a is a perspective view of a memory block, according to an embodiment.

FIG. 5 is a perspective view of a memory block BLKb according to an embodiment.

Referring to FIG. 5, the memory block BLKb may correspond to a modified example of the memory block BLKa shown in FIG. 3, and the description provided above with reference to FIG. 3 may be applied to the present embodiment. The memory block BLKb may include a first stack ST1 and a second stack ST2, which are stacked in a vertical direction VD over a substrate SUB. For example, the memory block BLKb may include two (2) stacks (e.g., ST1 and ST2) between the substrate SUB and first to third bit lines (e.g., BL1 to BL3). Thus, the memory block BLKb may have a multi-stack structure. For example, the memory block BLKb may have a two (2)-stack structure. However, the present disclosure is not limited in this regard. In some embodiments, the memory block BLKb may include at least three (3) stacks between the substrate SUB and the first to third bit lines BL1 to BL3.

A size of a plurality of pillars P (or a size of a channel hole or a channel length) may vary according to a position of a word line due to, for example, inconsistencies of a manufacturing process. For example, as the position of the word line nears a lower end of the memory block BLKb (e.g., closer to the substrate SUB), a size of each of a plurality of pillars P corresponding to the word line may become smaller. Consequently, as the size of each of the plurality of pillars P becomes smaller (e.g. decreases), the degradation of the word line corresponding thereto may become greater (e.g., increases). Accordingly, the degradation of the word line closest to the lower end of the memory block BLKb may be greater than the degradation of the word line closest to an upper end of the memory block BLKb.

Figure 6:
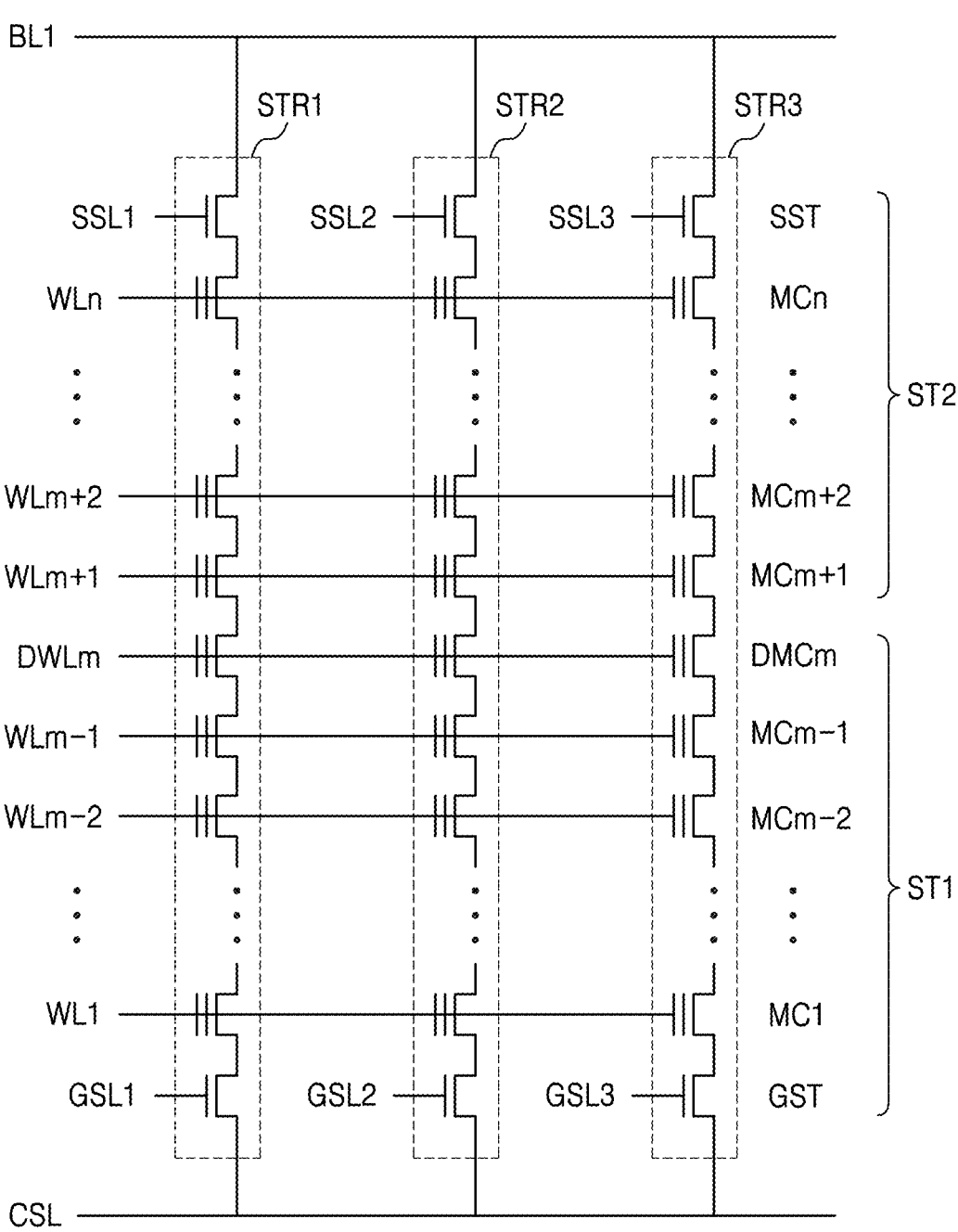
FIG. 6 is a circuit diagram of a memory block, according to an embodiment.

FIG. 6 is a circuit diagram of a memory block BLKb, according to an embodiment. The memory block BLKb of FIG. 6 may include or may be similar in many respects to the memory block BLKb of FIG. 5, and may include additional features not mentioned above. In particular, FIG. 6 is a circuit diagram of first to third strings (e.g., STR1 to STR3), which may be connected (e.g., coupled) to the first bit line BL1 and to a common source line CSL, from among strings included in the memory block BLKb of FIG. 5. Each of the first to third strings STR1 to STR3 may include or may be similar in many respects to the NAND string described above with reference to FIG. 5.

Referring to FIG. 6, each of the first to third strings STR1 to STR3 may include a string selection transistor SST selected by first to third string selection lines (e.g., SSL1 to SSL3), first to n-th memory cells (e.g., MC1 to MCn) controlled by first to n-th word lines (e.g., WL1 to WLn), dummy memory cells DMCm controlled by a dummy word line DWLm, and a ground selection transistor GST selected by ground selection lines (e.g., GSL1 to GSL3), where m and n may be distinct positive integers that are greater than one (1). In some embodiments, m may be smaller than n (e.g., m<n).

Each of the first to third strings STR1 to STR3 may be separated into a first stack ST1 and a second stack ST2 based on the dummy word line DWLm. For example, the first stack ST1 may include first to m−1-th memory cells (e.g., MC1 to MCm−1) connected to first to m−1-th word lines (e.g., WL1 to WLm−1) and the dummy memory cells DMCm connected to the dummy word line DWLm. Alternatively or additionally, the second stack ST2 may include m+1-th to n-th memory cells (e.g., MCm+1 to MCn), which may be connected to m+1-th to n-th word lines (e.g., WLm+1 to WLn), respectively.

Figure 7:
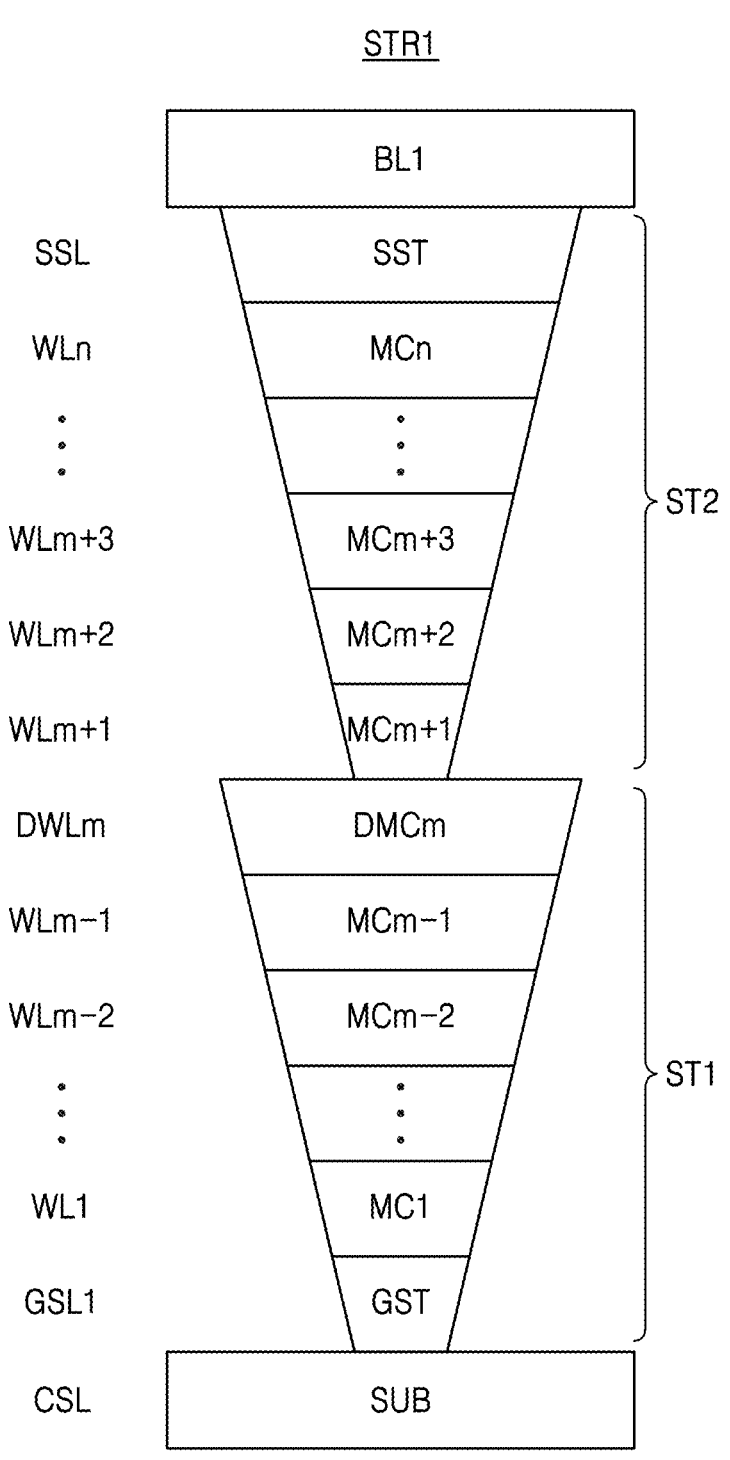
FIG. 7 is a diagram of a vertical cross-section of a cell string, according to an embodiment.

FIG. 7 is a diagram of a vertical cross-section of a NAND string as shown in FIG. 6. In particular, FIG. 7 illustrates a vertical cross-section of the first NAND string STR1 of FIG. 6. Although FIG. 7 depicts the first NAND string STR1, other NAND strings of the memory block BLKb (e.g., second NAND string STR2, third NAND string STR3) may have at least a similar structure as the structure depicted in FIG. 7.

Referring to FIG. 7, a dummy word line DWLm may be at a junction between a first stack ST1 and a second stack ST2. The dummy word line DWLm shown in FIG. 7 may be included in the first stack ST1, without being limited in this regard. For example, in an embodiment, the dummy word line DWLm may be included in the second stack ST2. Alternatively or additionally, the dummy word line DWLm may be included in both the first stack ST1 and the second stack ST2. For example, two (2) dummy word lines DWLm may be in the first stack ST1, and two (2) dummy word lines DWLm may be in the second stack ST2.

The first stack ST1 may include a ground selection transistor GST, first to m-1-th memory cells (e.g., MC1 to MCm−1), and a dummy memory cell DMCm. In the first stack ST1, a size of each of the first to m−1-th memory cells MC1 to MCm−1 may be reduced in one direction (e.g., a direction from a first bit line BL1 toward a substrate SUB).

The second stack ST2 may include m+1-th to n-th memory cells (e.g., MCm+1 to MCn). In the second stack ST2, a size of each of the m+1-th to n-th memory cells MCm+1 to MCn may be reduced in one direction (e.g., a direction from the first string selection line SSL1 to the m+1-th word line WLm+1).

Figure 8:
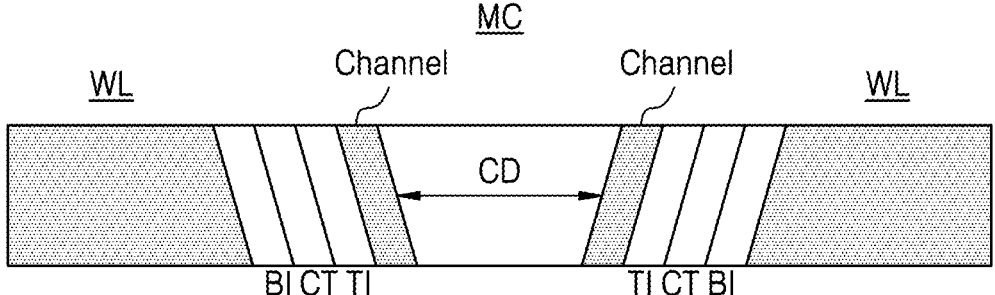
FIG. 8 is a diagram of a vertical cross-section of a memory cell, according to an embodiment.

FIG. 8 is a diagram of a vertical cross-section of a memory cell MC, according to an embodiment.

Referring to FIG. 8, the memory cell MC may have a cylindrical structure in which a channel diameter CD (or a critical dimension (CD) of a channel hole) is reduced in one direction (e.g., a downward direction). An air gap may be present inside the memory cell MC. A channel may include a P-type silicon and form a current path. The memory cell MC may include a data storage layer of a cylindrical type, which surrounds the channel. The data storage layer may include a tunnel insulating layer TI, a charge trap layer CT, and a blocking insulating layer BI. Each of word lines WL may include a gate electrode film that surrounds the data storage layer.

As the channel diameter CD becomes smaller, the degradation of each of the word lines WL corresponding thereto may become greater. Accordingly, the degradation of the word line WL close to a lower end of the memory block (e.g., BLKb) may be greater than the degradation of the word line WL close to the an upper end of the memory block.

Figure 9:
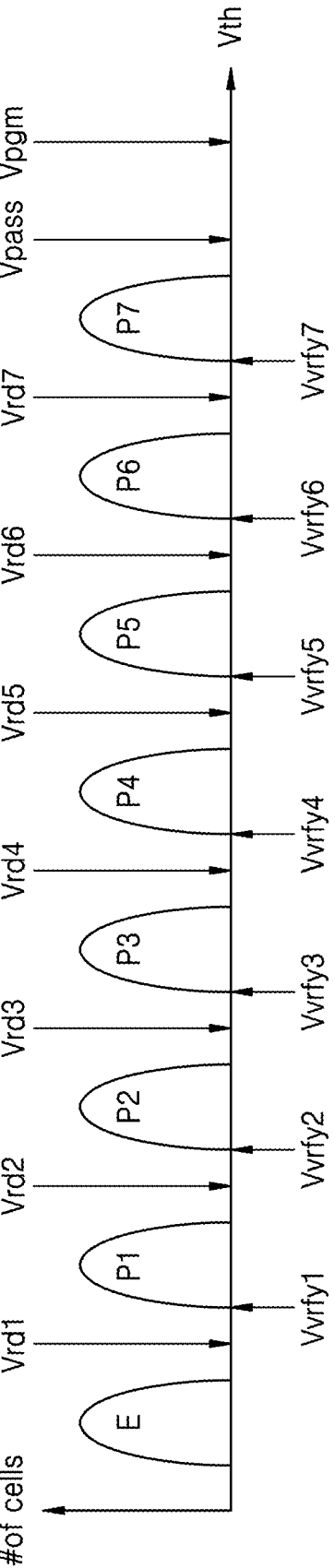
FIG. 9 is a graph showing states of a plurality of memory cells, according to an embodiment.

FIG. 9 is a graph illustrating states of a plurality of memory cells, according to an embodiment.

FIG. 9 illustrates state E, and states P1 to P7 of a TLC. Although the embodiment shown in FIG. 9 is based on TLC, the present disclosure is not limited in this regard. For example, the following embodiments described below may be applied to an SLC having two (2) states (e.g., E and P1), an MLC having four (4) states (e.g., E and P1 to P3), and a QLC having 16 states (e.g., E and P1 to P15). However, in the following embodiments, the memory cell may be assumed to be a TLC.

In FIG. 9, an abscissa denotes a threshold voltage Vth of the memory cell, and an ordinate denotes the number of memory cells (e.g., #of cells) corresponding to the threshold voltage Vth or a memory cell count value.

The TLC may have any one state out of eight (8) states (e.g., states E and P1 to P7. For example, an erase TLC may have an erase state E. For another example, a programmed TLC may have any one program state of first to seventh program states (e.g., P1 to P7).

In a program operation, after a pass voltage Vpass is applied to the word lines WL, for example, a program voltage Vpgm may be applied to a selection word line. A result (or verification) of the program operation in the erase state E and the first to seventh states P1 to P7 of the TLC may be determined by sequentially applying first to seventh program verification voltages Vvrfy1 to Vvrfy7 to the selection word line.

The pass voltage Vpass may be a voltage sufficient to turn on the memory cell. For example, the pass voltage Vpass may be a program pass voltage in a program operation.

In an embodiment, as shown in FIG. 9, the TLC may be programmed such that areas of threshold voltage distributions corresponding respectively to the erase state E and the first to seventh program states P1 to P7 of the TLC are equal to each other.

In an optional or additional embodiment, the TLC may be programmed such that an area of a threshold voltage distribution corresponding to at least one state of the TLC is different from each of areas of threshold voltage distributions corresponding to the remaining states of the TLC. For example, the TLC may be programmed such that areas of threshold voltage distributions corresponding to some states (e.g., E and P1 to P5) of the TLC are equal to each other, an area of a threshold voltage distribution corresponding to the sixth program state P6 is greater than each of the areas of the threshold voltage distributions corresponding to some states (e.g., E and P1 to P5) of the TLC, and an area of a threshold voltage distribution corresponding to a seventh program state P7 is smaller than each of the areas of the threshold voltage distributions corresponding to some states (e.g., E and P1 to P5) of the TLC.

Hereinafter, an area of a threshold voltage distribution corresponding to a state may be referred to as an area of that state.

In a read operation, the erase state E and the first to seventh program states E and P1 to P7 of the TLC may be determined by applying first to seventh read voltages Vrd1 to Vrd7 to the selection word line and applying the pass voltage Vpass to an unselected word line. Each of the first to seventh read voltages Vrd1 to Vrd7 may be referred to as a default read voltage, and the first to seventh read voltages Vrd1 to Vrd7 may be referred to as being included in a default read voltage set. The pass voltage Vpass may be referred to, for example, as a read pass voltage.

The first read voltage Vrd1 may have a voltage level between the erase state E and a first program state P1. The second read voltage Vrd2 may have a voltage level between the first program state P1 and a second program state P2. In the above-described manner, an i-th read voltage (where i is a positive integer greater than two (2)) may have a voltage level between an i−1-th program state and an i-th program state.

When the first read voltage Vrd1 is applied to the selection word line, a memory cell that is in the erase state E may become an ON cell, and memory cells that are in any one of the first to seventh program states P1 to P7 may become OFF cells. When the second read voltage Vrd2 is applied to the selection word line, a memory cell that is in the erase state E or the first program state P1 may become an ON cell, and a memory cell that is in any one of the second to seventh program states P2 to P7 may become an OFF cell. In the above-described manner, when the i-th read voltage is applied to the selection word line, a memory cell that is in the erase state E or an i−1-th program state may become an ON cell, and a memory cell that is in any one of the i-th to j-th program states (where j is a positive integer greater than or equal to i) may become an OFF cell.

Figure 10:
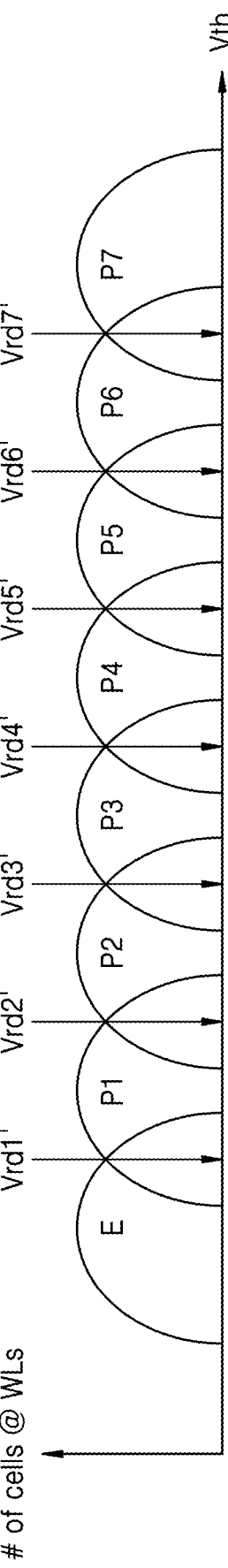
FIG. 10 is a graph showing states in which a plurality of memory cells are degraded, according to an embodiment.

FIG. 10 is a graph illustrating states in which a plurality of memory cells are degraded, according to an embodiment.

Referring to FIG. 10, threshold voltage distributions of the plurality of memory cells may be degraded due to various factors. The various factors may include, but not be limited to, charge leakage, read disturbance, program disturbance, coupling between adjacent memory cells, temperature change, voltage change, and the degradation of memory cells due to repeated program and erase operations. That is, the threshold voltage distributions may be distorted, widened, and/or shifted by coupling between adjacent memory cells (and/or word line interference). Alternatively or additionally, during a retention period, a degree of charge loss of selection memory cells may vary due to the influence of states of adjacent memory cells, and thus, a degree to which a threshold voltage distribution of each of the selection memory cells widens may be further increased.

According to a degree of degradation of the threshold voltage distributions, a read operation performed by using conventional read voltages (or default read voltage sets) (e.g., the first to seventh read voltages Vrd1 to Vrd7 shown in FIG. 9) may cause a read fail. Accordingly, a read operation may be performed again by using first to seventh optimum read voltages Vrd1' to Vrd7' as shown in FIG. 10.

However, if the degree of degradation of the threshold voltage distributions is high, it may be difficult to determine states E and P1 to P7 of a TLC even by using the first to seventh optimum read voltages Vrd1' to Vrd7'. Thus, patterns coupled to selection memory cells connected to a selection word line may be classified according to a state of adjacent memory cells connected to at least one adjacent word line that is physically adjacent to the selection word line. Accordingly, it may be necessary to calculate subdivided read voltages.

Figure 11:
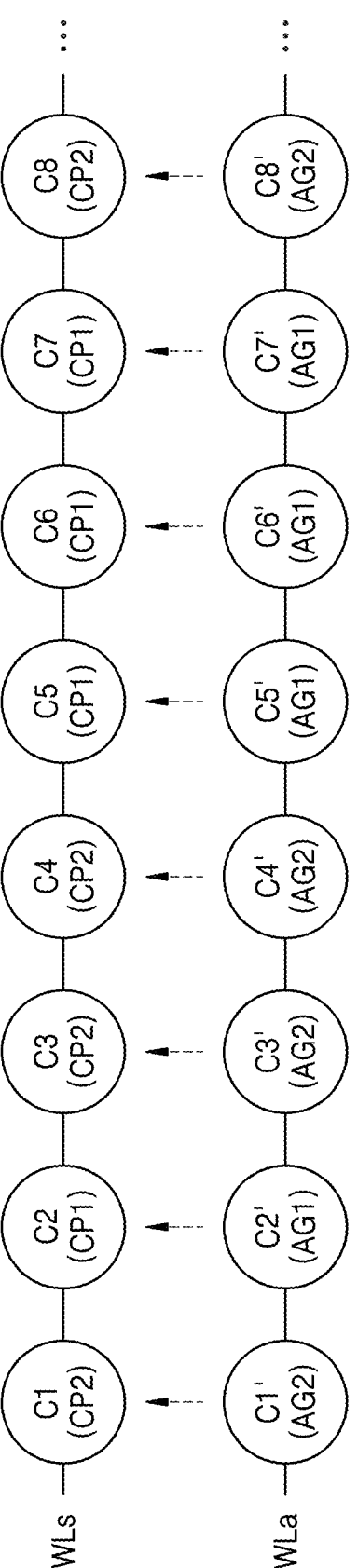
FIG. 11 is a diagram of a coupling pattern and an aggressor cell group, according to an embodiment.

FIG. 11 is a diagram illustrating a coupling pattern and an aggressor cell group, according to an embodiment.

Referring to FIG. 11, a selection word line WLs may include a plurality of selection memory cells C1 to C8. An adjacent word line WLa may include a plurality of adjacent memory cells C1' to C8'. FIG. 11 illustrates an example in which the number of selection memory cells C1 to C8 is eight (8) and the number of adjacent memory cells C1' to C8' is eight (8). However, the present disclosure is not limited in this regard.

In some embodiments, the adjacent word line WLa may be a single word line. In an example with reference to FIG. 3, when the selection word line WLs is an uppermost word line, such as an eighth word line WL8 as shown in FIG. 3, the adjacent word line WLa may be a seventh word line WL7. In another example with reference to FIG. 3, when the selection word line WLs is a lowermost word line, such as a first word line WL1 as shown in FIG. 3, the adjacent word line WLa may be a second word line WL2. In an example with reference to FIGS. 6 and 7, when the selection word line WLs is an n-th word line WLn or the first word line WL1, the adjacent word line WLa may be an n–1-th word line (not shown), which is physically adjacent to the n-th word line WLn or a second word line (not shown), which is physically adjacent to the first word line WL1. In another example with reference to FIGS. 6 and 7, when the selection word line WLs is the m+1-th word line WLm+1 or the m–1-th word line WLm–1, the adjacent word line WLa may be an m+2-th word line WLm+2, which is physically adjacent to the m+1-th word line WLm+1, or an m–2-th word line WLm–2, which is physically adjacent to the m–1-th word line WLm–1.

Since data may not be stored in the dummy memory cells DMCm connected to the dummy word line DWLm, the dummy memory cells DMCm may not have coupling effects on memory cells adjacent to the dummy memory cells DMCm. Accordingly, the dummy word line DWLm may not be included in the adjacent word line WLa.

The plurality of selection memory cells $C_1$ to $C_8$ may be respectively adjacent to the plurality of adjacent memory cells C1' to C8'. For example, a first selection memory cell C1 may be adjacent to a first adjacent memory cell C1', and a second selection memory cell C2 may be adjacent to a second adjacent memory cell C2'. Similarly, an eighth selection memory cell C8 may be adjacent to an eighth adjacent memory cell C8'. Because each selection memory cell may be coupled with an adjacent memory cell adjacent thereto, degradation may occur in each selection memory cell.

In some embodiments, each of the selection memory cells C1 to C8 may have a coupling pattern according to an aggressor cell group of each of the plurality of adjacent memory cells C1' to C8'. For example, the aggressor cell group may include a first aggressor cell group AG1 and a second aggressor cell group AG2. The selection memory cells C2, C5, C6, and C7, which are adjacent to the adjacent memory cells C2', C5', C6', and C7' included in the first aggressor cell group AG1, may have a first coupling pattern CP1. The selection memory cells C1, C3, C4, and C8, which are adjacent to the adjacent memory cells C1', C3', C4', and C8' included in the second aggressor cell group AG2, may have a second coupling pattern CP2. However, the present disclosure is not limited in this regard.

Hereinafter, a method of grouping a plurality of aggressor cell groups for the plurality of adjacent memory cells C1' to C8' is described with reference to FIG. 12.

Figure 12:
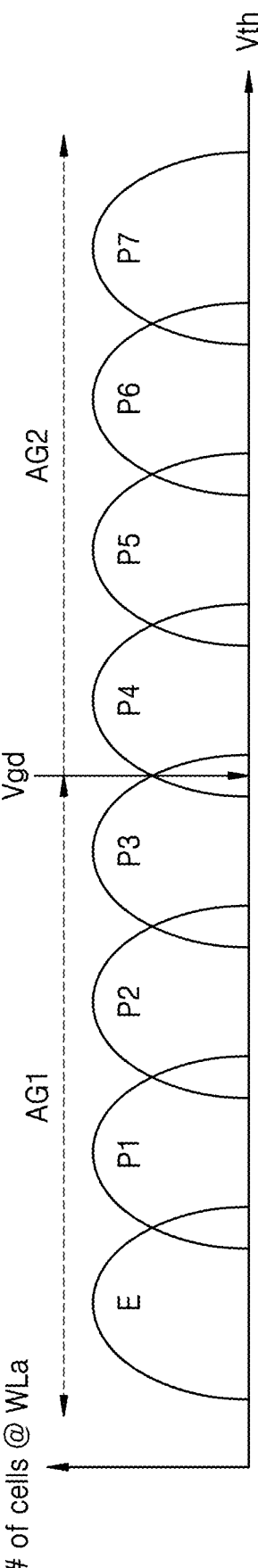
FIG. 12 is a graph illustrating a method of grouping a plurality of aggressor cell groups, according to an embodiment.

FIG. 12 is a graph illustrating a method of grouping a plurality of aggressor cell groups, according to an embodiment.

In FIG. 12, an abscissa denotes a threshold voltage Vth of a memory cell, and an ordinate denotes the number of adjacent memory cells (e.g., #of cells @ WLa) connected to an adjacent word line WLa and/or a memory cell count value.

By one group determination read voltage Vgd, each of adjacent memory cells connected to the adjacent word line WLa may be grouped into two (2) aggressor cell groups, for example, a first aggressor cell group AG1 and a second aggressor cell group AG2. In an embodiment, the first aggressor cell group AG1 and the second aggressor cell group AG2, which are distinguished from each other by one group determination read voltage Vgd, may be referred as a non-aggressor cell group and an aggressor cell group, respectively.

The first aggressor cell group AG1 may include a memory cell having a threshold voltage lower than one group determination read voltage Vgd. The second aggressor cell group AG2 may include a memory cell having a threshold voltage higher than one group determination read voltage Vgd. In an example with reference to FIGS. 11 and 12, when adjacent memory cells C2', C5', C6', and C7' have a threshold voltage lower than one group determination read voltage Vgd, the adjacent memory cells C2', C5', C6', and C7' may belong to the first aggressor cell group AG1. In another example with reference to FIGS. 11 and 12, when adjacent memory cells C1', C3', C4', and C8' have a threshold voltage higher than one group determination read voltage Vgd, the adjacent memory cells C2', C5', C6', and C7' may belong to the second aggressor cell group AG2.

A coupling pattern of each of the selection memory cells C1 to C8 may be determined according to an aggressor cell group to which an adjacent memory cell corresponding to the coupling pattern belongs.

Figure 13:
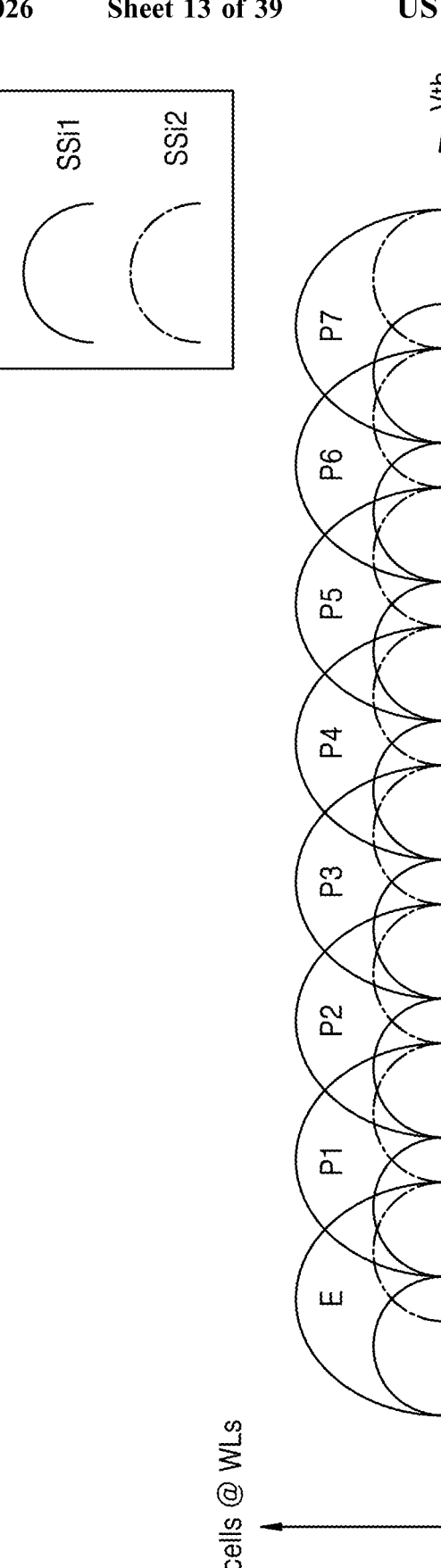
FIG. 13 is a graph showing sub-threshold voltage distributions, according to the plurality of aggressor cell groups, according to an embodiment.

FIG. 13 is a graph illustrating sub-threshold voltage distributions, according to the plurality of aggressor cell groups, according to an embodiment.

Referring to FIGS. 11, 12, and 13, in FIG. 13, an abscissa denotes a threshold voltage Vth of a memory cell, and an ordinate denotes the number of selection memory cells (e.g., of cells @ WLs) connected to a selection word line WLs and/or a memory cell count value.

The threshold voltage distributions of the selection memory cells may be divided into sub-threshold voltage distributions according to a coupling pattern of each selection memory cell. For example, each of states E and P1 to P7 of the selection memory cells may be subdivided into a first sub-state SSi1 corresponding to a first coupling pattern CP1 and a second sub-state SSi2 corresponding to a second coupling pattern CP2.

The sum of areas of the first and second sub-states SSi1 and SSi2 corresponding to each state may be equal to an area of each state. For example, the sum of areas of the first and second sub-states SSi1 and SSi2 corresponding to an erase state E may be equal to an area of the erase state E. The area of the first sub-state SSi1 (or the area of the second sub-state SSi2) corresponding to the erase state E may correspond to half the area of the erase state E.

Figure 14A:
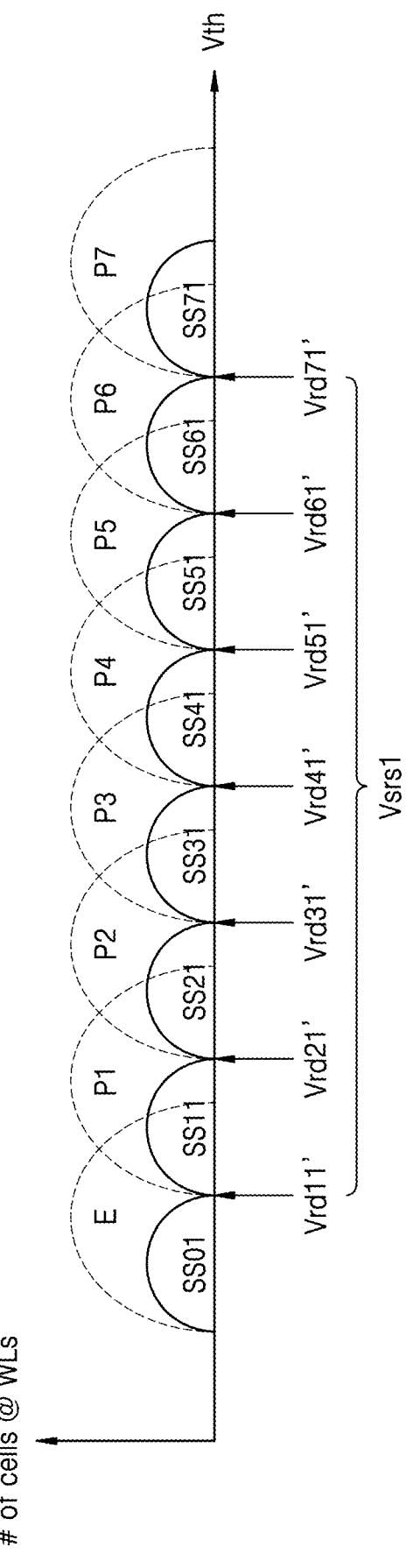
FIGS. 14A and 14B are graphs showing sub-read voltage sets for the sub-threshold voltage distributions, according to an embodiment.
Figure 14B:
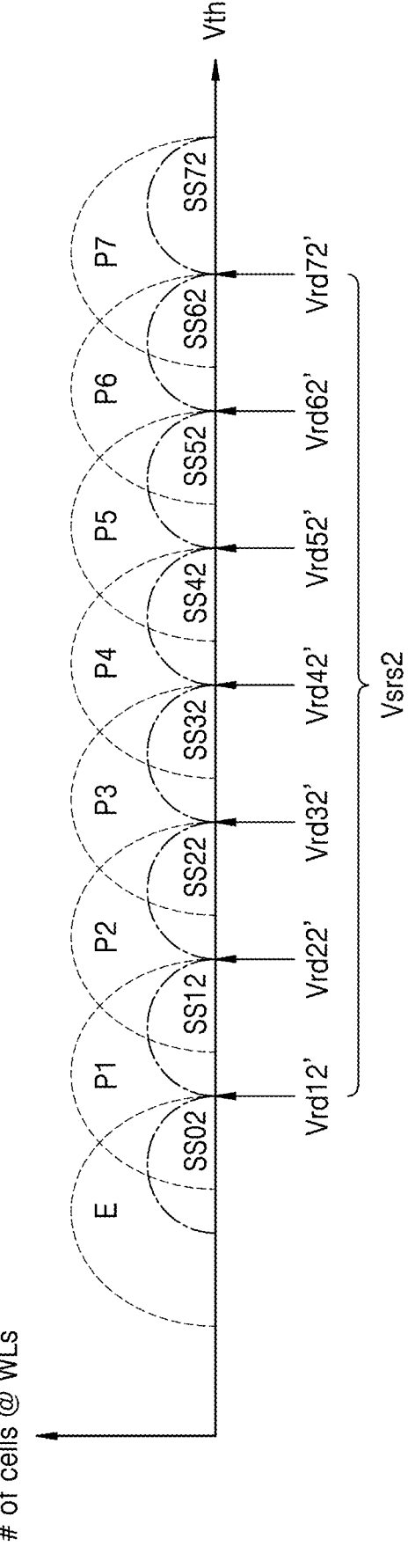

FIGS. 14A and 14B are graphs illustrating sub-read voltage sets for the sub-threshold voltage distributions of FIG. 13, according to an embodiment. For example, FIG. 14A illustrates first sub-states SS01 to SS71 of selection memory cells having a first coupling pattern CP1, and FIG. 14B illustrates second sub-states SS02 to SS72 of selection memory cells having a second coupling pattern CP2.

In FIGS. 14A and 14B, an abscissa denotes a threshold voltage Vth of a memory cell, and an ordinate denotes the number of selection memory cells (e.g., #of cells @ WLs) connected to a selection word line WLs and/or a memory cell count value.

Referring to FIG. 14A, when optimum sub-read voltages Vrd11' to Vrd71' (e.g., a first sub-read voltage set Vsrs1) for determining the first sub-states SS01 to SS71 are obtained, data stored in the selection memory cells having the first coupling pattern CP1 may be obtained by performing a read operation by using the first sub-read voltage set Vsrs1.

Referring to FIG. 14B, when optimum sub-read voltages Vrd12' to Vrd72' (e.g., a second sub-read voltage set Vsrs2) for determining the second sub-states SS02 to SS72 are obtained, data stored in the selection memory cells having the second coupling pattern CP2 may be obtained by performing a read operation by using the second sub-read voltage set Vsrs2.

A method of calculating the first sub-read voltage set Vsrs1 and the second sub-read voltage set Vsrs2 is described with reference to FIGS. 16 to 19.

Figure 15A:
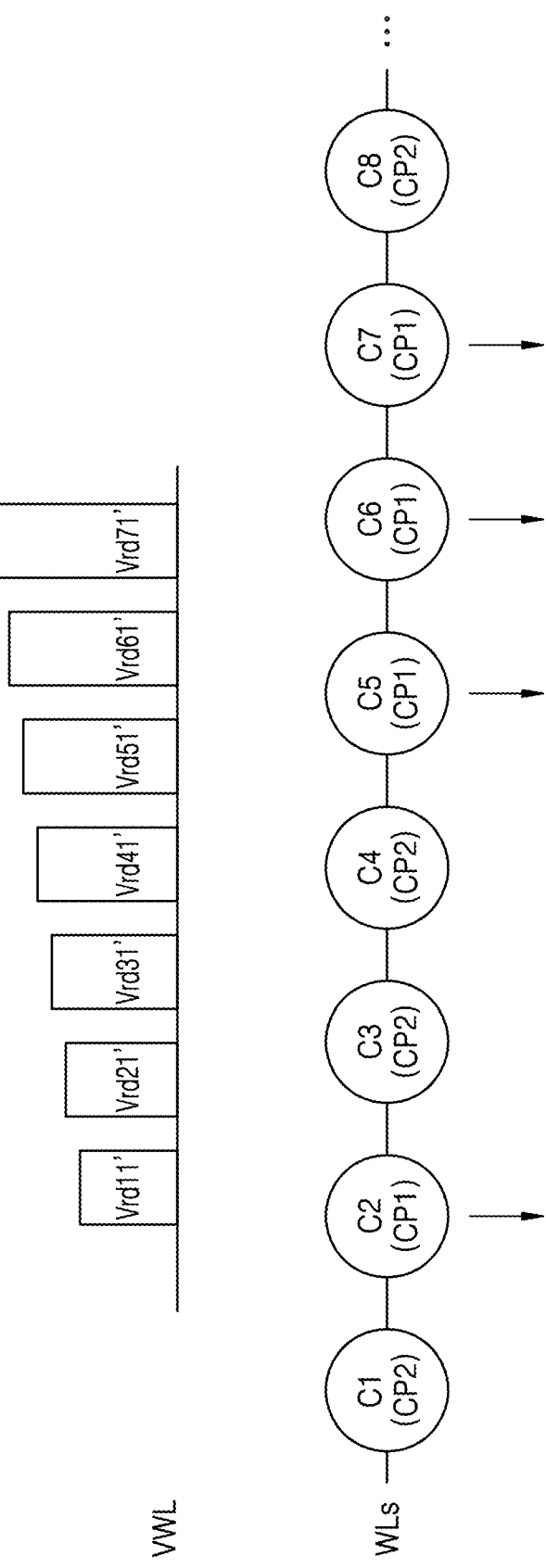
FIGS. 15A and 15B are diagrams of a read operation using the sub-read voltage sets, according to an embodiment.
Figure 15B:
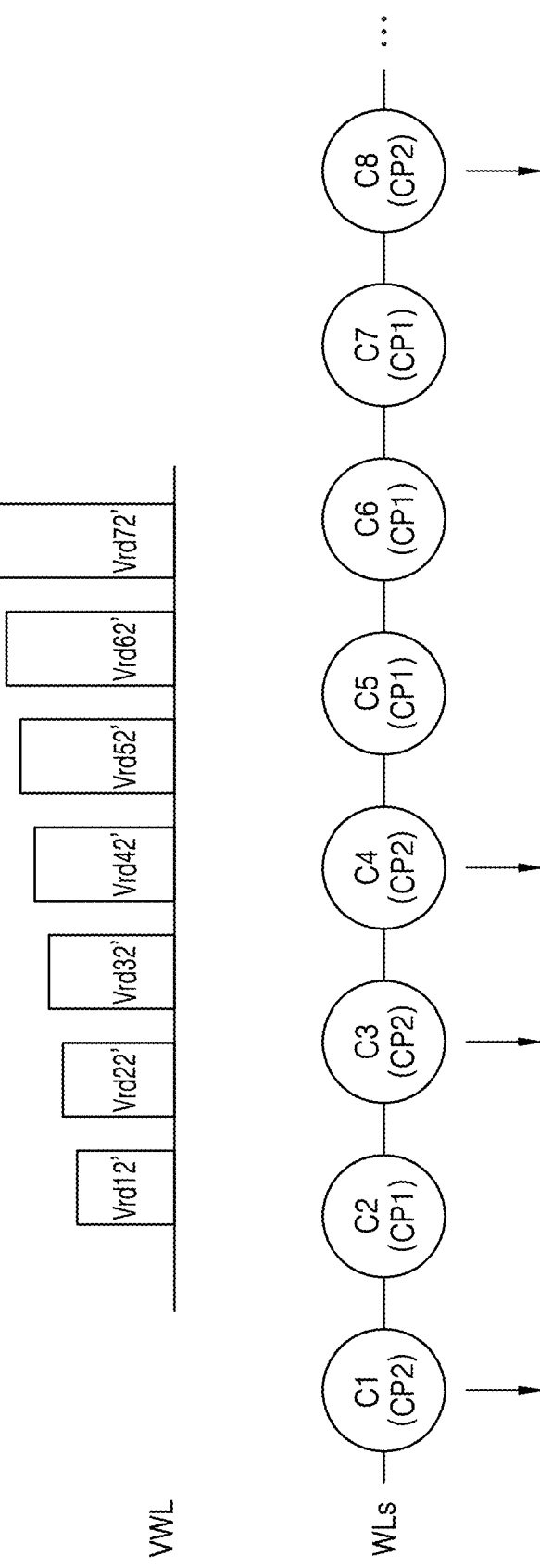

FIGS. 15A and 15B are diagrams of a read operation using the sub-read voltage sets shown in FIGS. 14A and 14B.

Referring to FIG. 15A, a storage controller 110 may provide, to a non-volatile memory 120, a control signal for instructing the sequential application of the sub-read voltages Vrd11' to Vrd71' to a selection word line WLs.

By applying the sub-read voltages Vrd11' to Vrd71' corresponding to the first coupling pattern CP1 to the selection word line WLs, a first partial read operation of reading data from selection memory cells C2, C5, C6, and C7 having the first coupling pattern CP1 may be performed. That is, data read from the selection memory cells C1, C3, C4, and C8 that does not have the first coupling pattern CP1 (e.g., that has the second coupling pattern CP2) may be ignored. In an embodiment, a selection word line voltage VWL may include the first sub-read voltage set Vsrs1. Although FIG. 15A illustrates an embodiment in which the first sub-read voltage set Vsrs1 is sequentially applied from the first sub-read voltage Vrd11' having a lowest voltage level to the seventh sub-read voltage Vrd71' having a highest voltage level, the present disclosure is not limited in this regard. For example, in some embodiments, the order in which the sub-read voltages Vrd11' to Vrd71' are applied to the selection word line WLs may be determined in various ways, such as, but not limited to, sequentially applying the sub-read voltages from highest to lowest voltage level.

Referring to FIG. 15B, the storage controller 110 may provide, to the non-volatile memory 120, a control signal for instructing the sequential application of sub-read voltages Vrd12' to Vrd72' to the selection word line WLs.

By applying the sub-read voltages Vrd12' to Vrd72' corresponding to the second coupling pattern CP2 to the selection word line WLs, a second partial read operation of reading data from selection memory cells C1, C3, C4, and C8 having the second coupling pattern CP2 may be performed. That is, data read from the selection memory cells C2, C5, C6, and C7 that does not have the second coupling pattern CP2 (e.g., that has the first coupling pattern CP1) may be ignored. Alternatively or additionally, the selection word line voltage VWL may include the second sub-read voltage set Vsrs2. The order in which the sub-read voltages Vrd12' to Vrd72' shown in FIG. 15B are applied to the selection word line WLs may be determined in various ways. For example, the sub-read voltages may be applied to the selection word line WLs by sequentially applying the sub-read voltages from highest to lowest voltage level (e.g., Vrd72' to Vrd12'). For another example, the sub-read voltages may be applied to the selection word line WLs by sequentially applying the sub-read voltages from lowest to highest voltage level (e.g., Vrd12' to Vrd72'). However, the present disclosure is not limited in this regard.

A read operation may be performed on the plurality of selection memory cells C1 to C8 having a plurality of coupling patterns (e.g., CP1, CP2), based on a plurality of sub-read voltage sets (e.g., Vsrs1 and Vsrs2). The read operation performed by using the sub-read voltage sets may be referred to as a data recovery read operation.

Hereinafter, a method of calculating the plurality of sub-read voltage sets Vsrs1 and Vsrs2 is described below.

Figure 16:
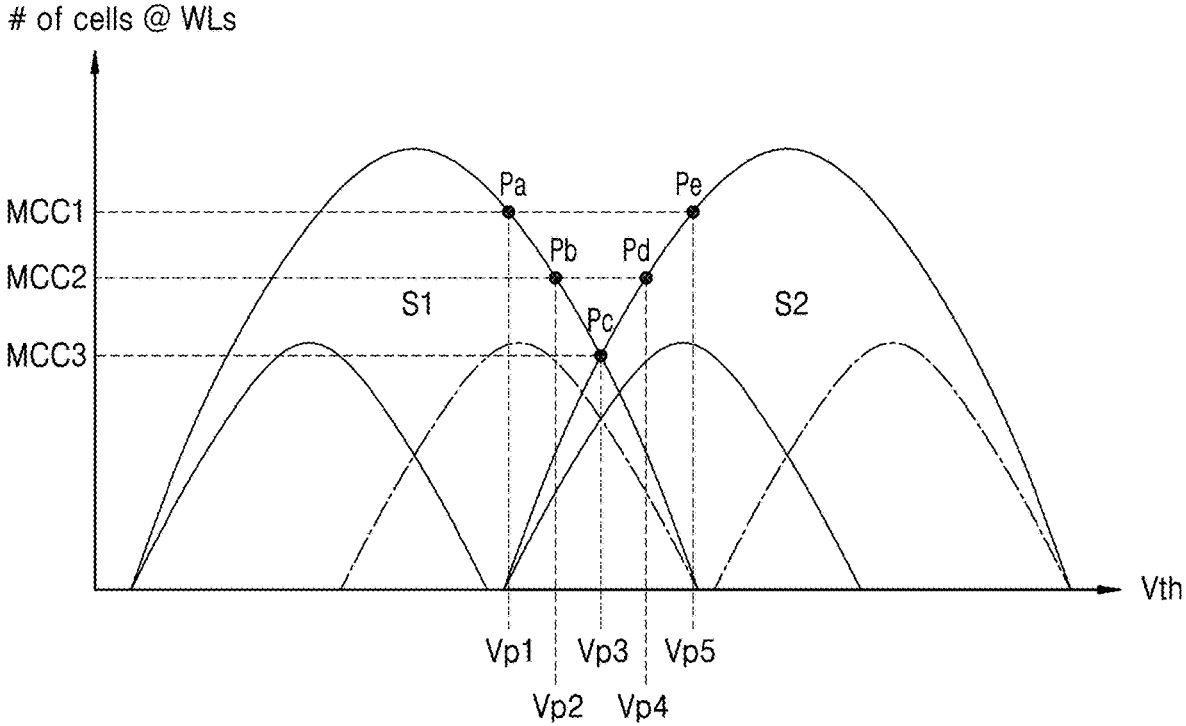
FIG. 16 is a graph illustrating a valley search operation and a method of obtaining a plurality of points, according to an embodiment.

FIG. 16 is a graph illustrating a valley search operation and a method of obtaining a plurality of points, according to an embodiment.

In FIG. 16, an abscissa denotes a threshold voltage Vth of a memory cell, and an ordinate denotes the number of a selection memory cell (e.g., #of cells @ WLs) connected to a selection word line WLs and/or a memory cell count value.

A first state S1 and a second state S2 may correspond to two (2) adjacent states of states (e.g., states E, P1 to P7 of a TLC of FIG. 13) of selection memory cells. For example, the first state S1 may be an erase state E, and the second state S2 may be a first program state P1. For another example, the first state S1 may be a sixth program state P6, and the second state S2 may be a seventh program state P7. However, the present disclosure is not limited in this regard.

A storage controller 110 may control a non-volatile memory 120 to perform a valley search operation. The valley search operation may refer to an operation of searching for a valley between threshold voltage distributions of the selection memory cells connected to the selection word line WLs, from among a plurality of word lines WL. Referring to FIG. 16, the valley search operation may be an operation of searching for a valley formed at a point (e.g., Pc) where a threshold voltage distribution of the first state S1 intersects with a threshold voltage distribution of the second state S2.

In an embodiment, the non-volatile memory 120 may perform the valley search operation. That is, the non-volatile memory 120 may apply a plurality of read voltages for searching for the valley to the selection word line WLs, obtain memory cell count values indicating the numbers of OFF cells, and search, as a valley, a point including a smallest memory cell count value and a read voltage corresponding to the smallest memory cell count value (e.g., Pc).

In some embodiments, during the valley search operation, the non-volatile memory 120 may perform a read operation five (5) times, for example. Consequently, the storage controller 110 may obtain five (5) points (e.g., first to fifth points Pa, Pb, Pc, Pd, and Pe). That is, first to fifth read voltages Vp1 to Vp5 may be sequentially applied to the selection word line WLs. In this case, voltage level intervals between the first to fifth read voltages Vp1 to Vp5 may be equal. For example, a voltage level interval between a k-th read voltage and a k+1-th read voltage may be constant (e.g., k may be an integer in the range of one (1) to four (4)). By sequentially applying the first to fifth read voltages Vp1 to Vp5 to the selection word line WLs, a memory cell count value may be obtained that indicates the number of memory cells (e.g., OFF cells) having a threshold voltage higher than each read voltage.

In an embodiment, each point points (e.g., first to fifth points Pa, Pb, Pc, Pd, and Pe) may be a two-dimensional (2D) coordinate including a read voltage level and the memory cell count value. For example, when the voltage level intervals between the first to fifth read voltages Vp1 to Vp5 are equal to each other and an area of the first state S1 is equal to an area of the second state S2, a memory cell count value of each of the first point Pa and the fifth point Pe may be substantially equal to a first memory cell count value MMC1, and a memory cell count value of each of the second point Pb and the fourth point Pd may be substantially equal to a second memory cell count value MMC2.

As shown in FIG. 16, the first point Pa may include a level of the first read voltage Vp1 and the first memory cell count value MMC1, the second point Pb may include a level of the second read voltage Vp2 and the second memory cell count value MMC2, the third point Pc may include a level of the third read voltage Vp3 and a third memory cell count value MMC3, the fourth point Pd may include a level of the fourth read voltage Vp4 and a fourth memory cell count value (e.g., the second memory cell count value MMC2), and the fifth point Pe may include a level of the fifth read voltage Vp5 and a fifth memory cell count value (e.g., the first memory cell count value MMC1). From among the first to fifth points Pa, Pb, Pc, Pd, and Pe, the third point Pc corresponding to the smallest memory cell count value may correspond to the valley, and a point corresponding to the valley may be referred to as a valley point.

In an embodiment, the first to fifth read voltages Vp1 to Vp5 for obtaining the first to fifth points Pa, Pb, Pc, Pd, and Pe may be applied to the selection word line WLs in ascending powers (e.g., voltage levels). For example, a read operation using the first read voltage Vp1 may be performed first, subsequent read operations may be performed in increasing order of voltage levels (e.g., Vp2, Vp3, and Vp4), and a read operation using the fifth read voltage Vp5 may be performed last.

In an optional or additional embodiment, the first to fifth read voltages Vp1 to Vp5 for obtaining the first to fifth points Pa, Pb, Pc, Pd, and Pe may be applied to the selection word line WLs in descending powers (e.g., voltage levels). For example, a read operation using the fifth read voltage Vp5 may be performed first, subsequent read operations may be performed in decreasing order of voltage levels (e.g., Vp4, Vp3, and Vp2), and a read operation using the first read voltage Vp1 may be performed last.

In other optional or additional embodiments, during the valley search operation, the non-volatile memory 120 may obtain the first to fifth points Pa, Pb, Pc, Pd, and Pe by performing five (5) read operations starting from a preset read voltage.

Valley search operations may be performed on the states E and P1 to P7 of the selection memory cells of FIG. 13, and the first to fifth points Pa, Pb, Pc, Pd, and Pe may be obtained for every two (2) states.

The non-volatile memory 120 may provide data indicating the first to fifth points Pa, Pb, Pc, Pd, and Pe to the storage controller 110.

Figure 17:
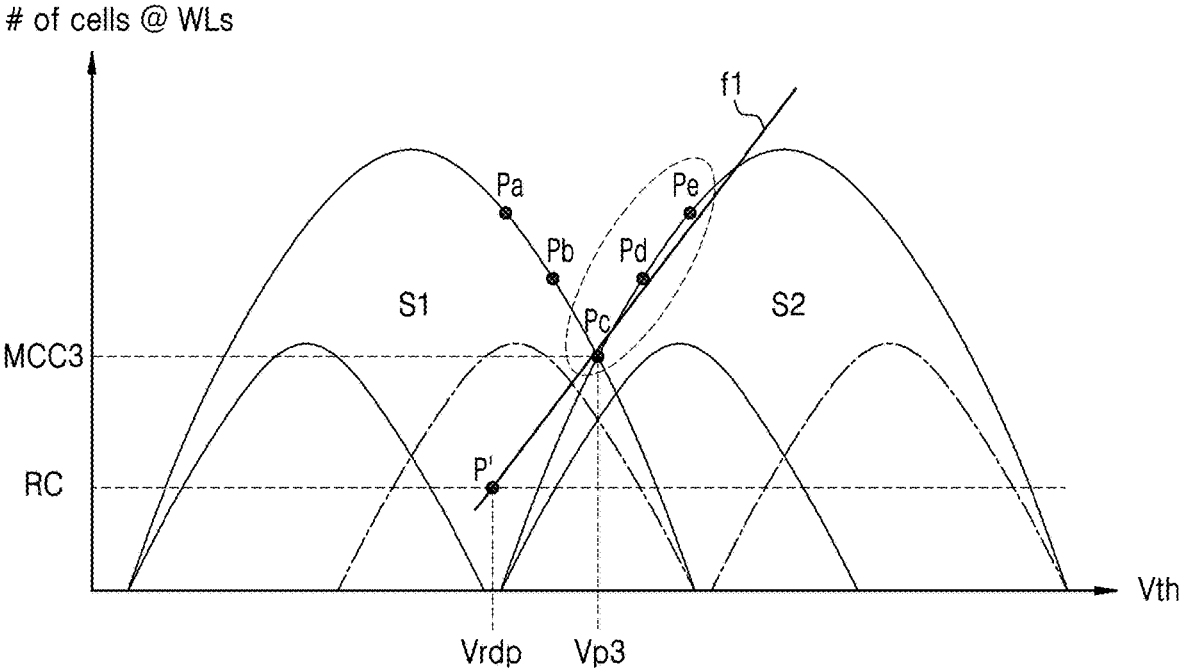
FIG. 17 is a graph illustrating a method of calculating a first voltage level in a first function, according to an embodiment.

FIG. 17 is a graph illustrating a method of calculating a first voltage level in a first function, according to an embodiment.

Referring to FIGS. 16 and 17, the storage controller 110 may set a first function f1, based on a valley point and at least two (2) points having a higher level than a read voltage included in the valley point, from among a plurality of points. For example, the valley point may be a third point Pc from among five (5) points (e.g., first to fifth points Pa, Pb, Pc, Pd, and Pe). Thus, points having levels higher than a level of a threshold read voltage Vp3 of the third point Pc may be the fourth point Pd and the fifth point Pe. By using a linear regression model, the storage controller 110 may set a first linear function, which may be closest to the third to fifth points Pc, Pd, and Pe, as the first function f1. For example, the first linear function may approximate a line that crosses, within a predetermined threshold, the third to fifth points Pc, Pd, and Pe. That is, the first linear function may minimize distances between the line and the third to fifth points Pc, Pd, and Pe. The first function f1 may be expressed using the following equation:

$$\log y = \hat{a} \times x + \hat{b} \qquad \text{[Eq. 1]}$$

Referring to Eq. 1, y represents a memory cell count value, â represents a predicted value of a slope of the first linear function (e.g., the first function f1), and 6 denotes a predicted value of an intercept of an abscissa (e.g., x-axis).

The first function f1 may correspond to points (e.g., the third to fifth points Pc, Pd, and Pe) having read voltage levels higher than or equal to a valley read voltage level (e.g., a level of the third read voltage Vp3 of the third point Pc) of the valley point, from among the plurality of points (e.g., five (5) points Pa, Pb, Pc, Pd, and Pe). Although the first function f1 may be a linear function in the embodiment shown in FIG. 17, the present disclosure is not limited in this regard. For example, the first function f1 may be a nonlinear function.

The storage controller 110 may obtain a point P' corresponding to a reference count value RC in the first function f1 and calculate a first voltage level Vrdp corresponding to an abscissa coordinate (e.g., x coordinate) included in the point P'. In a specific example, Eq. 1 may be rewritten using the following equation:

$$Vrdp = \frac{\log RC - \hat{b}}{\hat{a}} \qquad \text{[Eq. 2]}$$

In some embodiments, the reference count value RC may be smaller than a memory cell count value of the valley point. For example, when the valley point is the third point Pc, the reference count value RC may be smaller than a third memory cell count value MCC3.

In an embodiment, when the area of the first state S1 is equal to the area of the second state S2, an area of each sub-state (e.g., a first sub-state SSi1) corresponding to each state (e.g., the first state S1) may be half of the area of each state. Because a height ratio is geometrically equal to a ratio of a square root of an area, a memory cell count value corresponding to a height of the first sub-state SSi1 (and/or a second sub-state SSi2) may be $1/\sqrt{2}$ times a height of each state (e.g., the first state S1). Accordingly, the reference count value RC may be $1/\sqrt{2}$ times of the memory cell count value of the valley point. In an example with reference to FIG. 19, the reference count value RC may be $1/\sqrt{2}$ times the third memory cell count value MMC3. As the number of types of coupling patterns increases, a ratio of an area of one sub-state to an area of each state may be gradually reduced, and a memory cell count corresponding to a height of one sub-state may also be reduced in inverse proportion to a square root of the number of types of coupling patterns. Accordingly, the reference count value RC may be inversely proportional to the square root of the number of types of coupling patterns. An embodiment of the reference count value RC is described below with reference to FIG. 24.

In another embodiment, when the area of the first state S1 is different from the area of the second state S2, an area of sub-states corresponding to the first state S1 may be different from an area of sub-states corresponding to the second state S2. In this case, the reference count value RC may be smaller than or equal to the square root of the number of types of coupling patterns.

Figure 18:
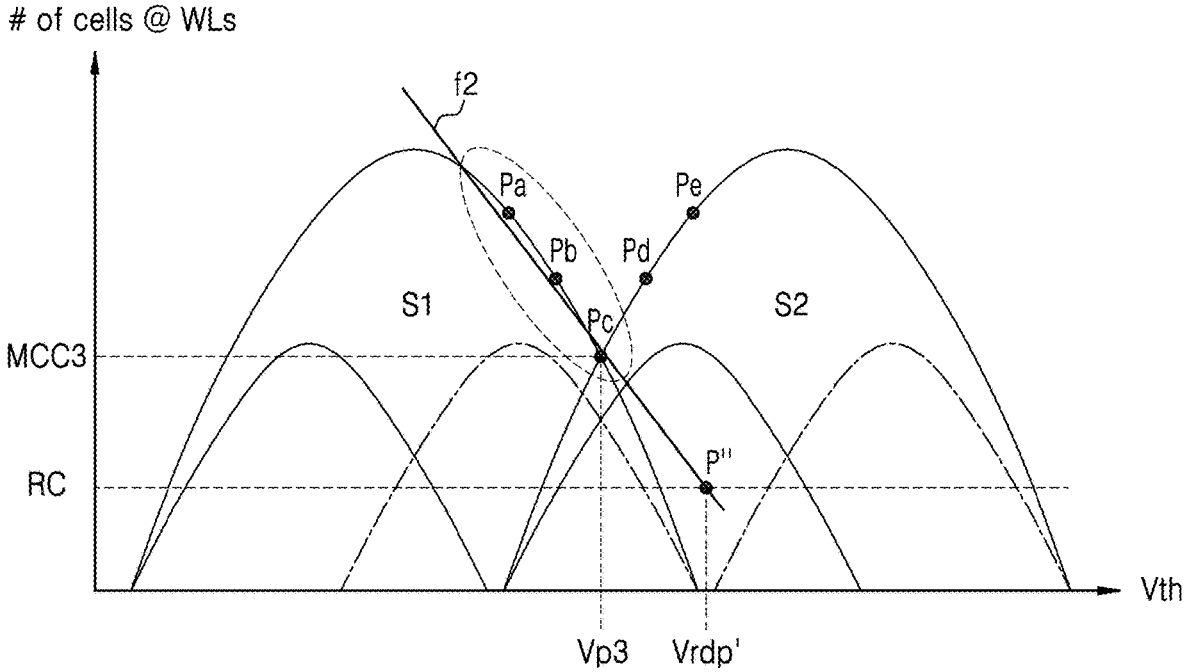
FIG. 18 is a graph illustrating a method of calculating a second voltage level in a second function, according to an embodiment.

FIG. 18 is a graph a method of calculating a second voltage level in a second function, according to an embodiment.

Referring to FIGS. 16 and 18, the storage controller 110 may set a second function f2, based on a valley point and at least two (2) points having a lower level than a read voltage included in the valley point, from among a plurality of points. For example, when the valley point is the third point Pc, points having levels lower than a level of a third read voltage Vp3 of the third point Pc may be the first point Pa and the second point Pb. By using a linear regression model, the storage controller 110 may set a second linear function, which may be closest to the first to third points Pa, Pb, and Pc, as the second function f2. For example, the second linear function may approximate a line that crosses, within a predetermined threshold, the first to third points Pa, Pb, and Pc. That is, the first linear function may minimize distances between the line and the first to third points Pa, Pb, and Pc. The second function f2 may be expressed using the following equation:

$$\log y = \hat{c} \times x + \hat{d} \qquad \text{[Eq. 3]}$$

Referring to Eq. 3, y represents a memory cell count value, $\hat{c}$ represents a predicted value of a slope of the second linear function, and $\hat{d}$ represents a predicted value of an intercept of an abscissa (e.g., x-axis).

The second function f2 may correspond to points (e.g., the first to third points Pa, Pb, and Pc) having read voltage levels equal to or smaller than a valley read voltage level (e.g., the level of the third read voltage Vp3 of the third point Pc) of the valley point, from among the plurality of points (e.g., the first to fifth points Pa, Pb, Pc, Pd, and Pe). In some embodiments, the second function f2 may be a nonlinear function.

The storage controller 110 may obtain a point P" corresponding to a reference count value RC in the second function f2, and calculate a second voltage level Vrdp' corresponding to an abscissa coordinate (e.g., x coordinate) included in the point P". In a specific example, Eq. 3 may be rewritten based on x using the following equation:

$$Vrdp' = \frac{\log RC - \hat{d}}{\hat{c}} \qquad \text{[Eq. 4]}$$

In some embodiments, the reference count value RC may be smaller than a memory cell count value of the valley point.

Figure 19:
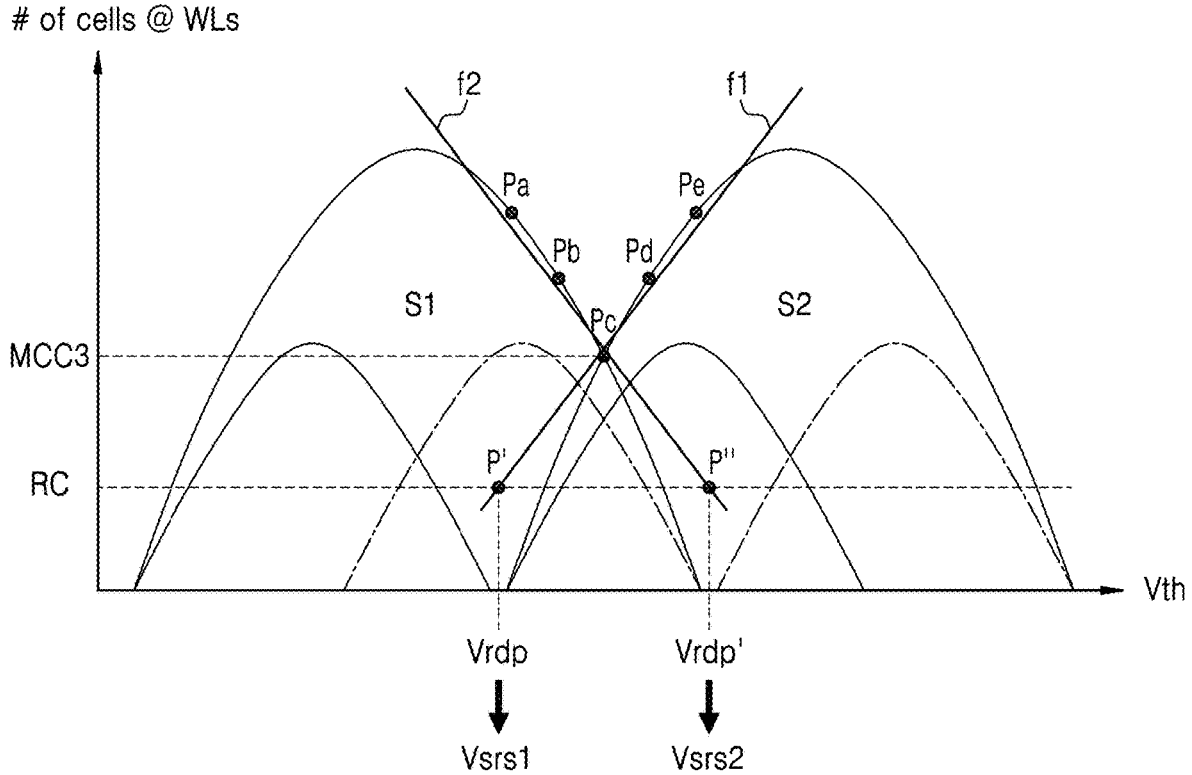
FIG. 19 is a graph illustrating a method of calculating sub-read voltage sets, according to an embodiment.

FIG. 19 is a graph illustrating a method of calculating sub-read voltage sets, according to an embodiment.

Referring to FIG. 19, a storage controller 110 may calculate sub-read voltage sets, based on a plurality of coupling patterns, a first voltage level Vrdp, and a second voltage level Vrdp'. For example, in FIG. 19, the plurality of coupling patterns may include a first coupling pattern CP1 and a second coupling pattern CP2. Thus, a sub-read voltage having the first voltage level Vrdp may be included in a first sub-read voltage set Vsrs1 corresponding to the first coupling pattern CP1, and a sub-read voltage having the second voltage level Vrdp' may be included in a second sub-read voltage set Vsrs2 corresponding to the second coupling pattern CP2.

According to the above-described method of calculating the first voltage level Vrdp and the second voltage level Vrdp', the sub-read voltages Vrd11 to Vrd71 shown in FIG. 14A and the sub-read voltages Vrd11' to Vrd71' shown in FIG. 14B may be calculated.

An optimum read voltage may be calculated according to an aggressor cell group of an adjacent memory cell, and thus, the performance of a read operation may be improved.

Figure 20:
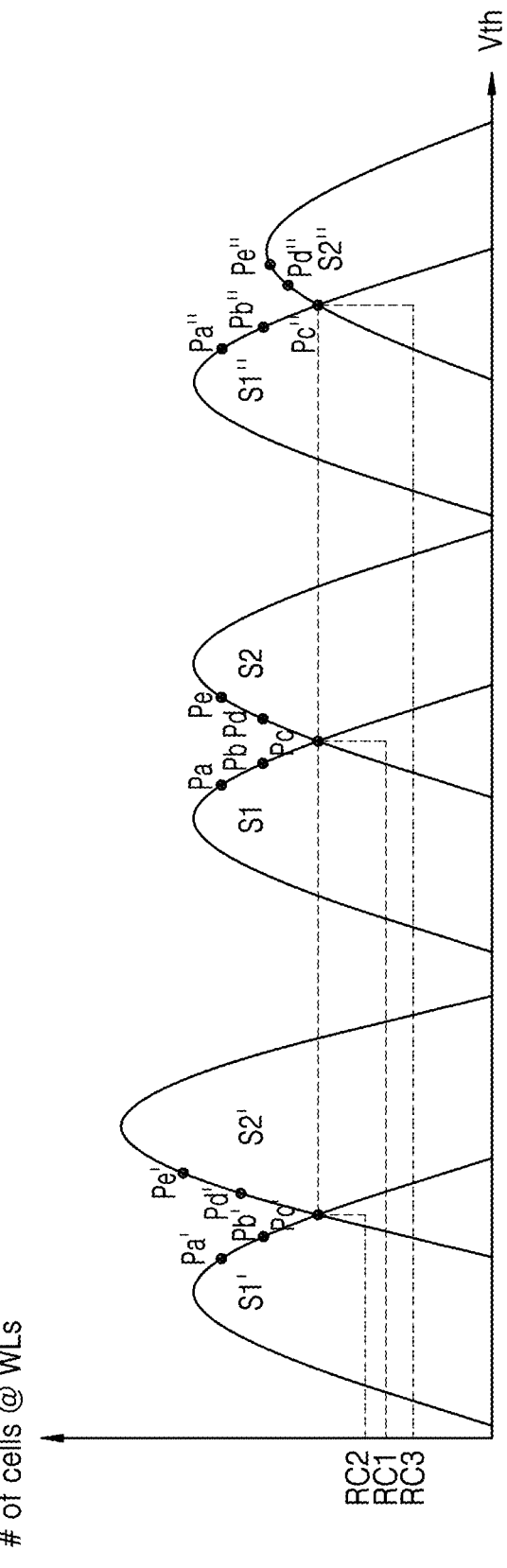
FIG. 20 is a graph illustrating a reference count value, according to an embodiment.

FIG. 20 is a graph illustrating a reference count value, according to an embodiment.

In FIG. 20, a valley point between a first state S1 and a second state S2 may be indicated by Pc, a valley point between a first state S1' and a second state S2' may be indicated by Pc', and a valley point between a first state S1" and a second state S2" may be indicated by Pc".

In some embodiments, a reference count value may vary with a difference between respective areas of two (2) threshold voltage distributions between which one valley occurs.

For example, a first reference count value RC1 may be smaller than a memory cell count value of a valley point, which may occur between a first threshold voltage distribution and a second threshold voltage distribution, which may have the same area. That is, when the first state S1 has substantially the same area as the second state S2, the first reference count value RC1 may be smaller than a memory cell count value of a valley point (e.g., a third point Pc). When the number of types of coupling patterns is two (2), the first reference count value RC1 may be approximately 0.7 times to approximately 0.8 times of the memory cell count value of the valley point (e.g., the third point Pc), without being limited in this regard.

For another example, a second reference count value RC2 may be smaller than a memory cell count value of a valley point, which may occur between a third threshold voltage distribution and a fourth threshold voltage distribution having a larger area than the third threshold voltage distribution. Here, the third threshold voltage distribution may have the same area as that of each of the first threshold voltage distribution and the second threshold voltage distribution, which are described above. That is, when an area of the first state S1' is substantially equal to the area of the first state S1 (or the second state S2)) and smaller than an area of the second state S2', the second reference count value RC2 may be smaller than a memory cell count value of a valley point Pc' and greater than the first reference count value RC1.

For yet another example, a third reference count value RC3 may be smaller than a memory cell count value of a valley point, which may occur between a fifth threshold voltage distribution and the fourth threshold voltage distribution having a smaller area than the fifth threshold voltage distribution. Here, the fifth threshold voltage distribution may have substantially the same area as each of the first threshold voltage distribution and the second threshold voltage distribution. That is, when an area of the first state S1" is substantially equal to the area of the first state S1 (or the second state S2) and greater than an area of the second state S2", the third reference count value RC3 may be smaller than a memory cell count value of a valley point Pc" and the first reference count value RC1.

In an embodiment, first to third reference count values RC1 to RC3 may be calculated by the storage controller 110.

A reference count value may be adjusted according to each state, and a read voltage to be used in a data recovery read operation may be precisely calculated. Thus, the performance of the data recovery read operation may be improved.

Figure 21:
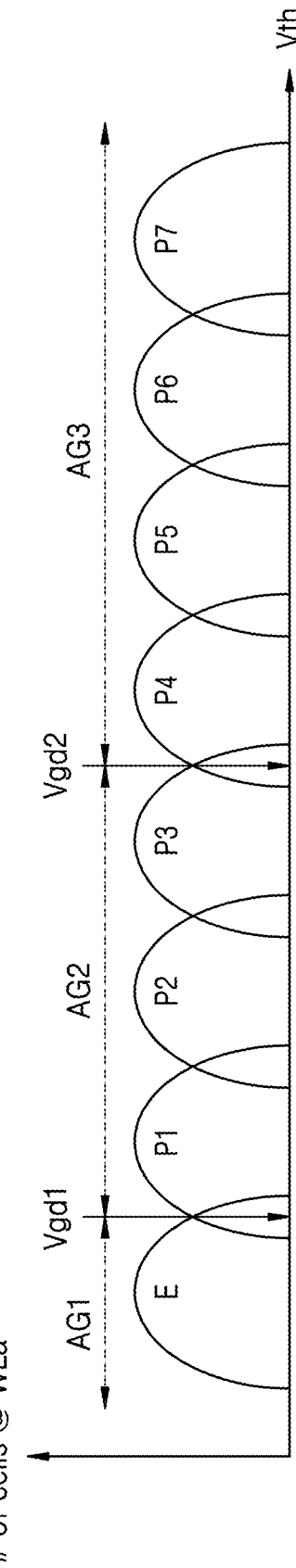
FIG. 21 is a graph showing a method of grouping a plurality of aggressor cell groups, according to an embodiment.

FIG. 21 is a graph illustrating a method of grouping a plurality of aggressor cell groups, according to an embodiment.

Referring to FIGS. 1 and 21, in FIG. 21, an abscissa denotes a threshold voltage Vth of a memory cell, and an ordinate denotes the number of (e.g., #of cells @ WLa) of adjacent memory cells connected to an adjacent word line WLa and/or a memory cell count value.

A storage controller 110 may provide a control signal CTRL and an adjacent address to a non-volatile memory 120. For example, the control signal CTRL may be a signal for instructing the sequential application of two (2) group determination read voltages (e.g., first and second group determination read voltages Vgd1 and Vgd2) to one adjacent word line WLa. The adjacent address may refer to an address corresponding to one adjacent word line WLa.

In an embodiment, each of adjacent memory cells connected to the adjacent word line WLa may be grouped into one of three (3) aggressor cell groups by the first and second group determination read voltages Vgd1 and Vgd2. For example, the adjacent memory cells may be group into a first aggressor cell group AG1, a second aggressor cell group AG2, or a third aggressor cell group AG3. The first aggressor cell group AG1 may be referred to as a non-aggressor cell group.

The storage controller 110 may group, into the same aggressor cell group, adjacent memory cells having a threshold voltage included in the same level section, out of level sections divided by levels of the first and second group determination read voltages Vgd1 and Vgd2, for each adjacent memory cell connected to one adjacent word line WLa.

For example, the first aggressor cell group AG1 may include a memory cell having a threshold voltage lower than the first group determination read voltage Vgd1. The second aggressor cell group AG2 may include a memory cell having a threshold voltage, which may be higher than the first group determination read voltage Vgd1 and lower than the second group determination read voltage Vgd2. The third aggressor cell group AG3 may include a memory cell having a threshold voltage higher than the second group determination read voltage Vgd2.

Respective voltage levels of the first and second group determination read voltages Vgd1, and Vgd2 may be set such that the number of states belonging to one of the first to third aggressor cell groups AG1 to AG3 is not equal to the number of states belonging to another one thereof. For example, as shown in FIG. 21, the first group determination read voltage Vgd1 may have a voltage level between the erase state E and the first program state P1. The second group determination read voltage Vgd2 may have a voltage level between the third program state P3 and the fourth program state P4. In such an example, the erase state E may belong to the first aggressor cell group AG1, the first to third program states P1 to P3 may belong to the second aggressor cell group AG2, and the fourth to seventh program states P4 to P7 may belong to the third aggressor cell group AG3. However, the present disclosure is not limited in this regard, and various other methods of setting voltage levels may be provided. For example, the first group determination read voltage Vgd1 may have a voltage level between the first program state P1 and the second program state P2, and the second group determination read voltage Vgd2 may have a voltage level between the third program state P3 and the fourth program state P4.

The storage controller 110 may classify, as an N-th coupling pattern, a coupling pattern of a selection memory cell corresponding to an adjacent memory cell included in an N-th aggressor cell group (where N is a positive integer greater than zero (0)).

In an embodiment, when the number of types of aggressor cell groups is three (3), the number of types of coupling patterns may also be three (3). For example, a plurality of coupling patterns may include first to third coupling patterns corresponding respectively to the first to third aggressor cell groups AG1, AG2, and AG3.

Figure 22:
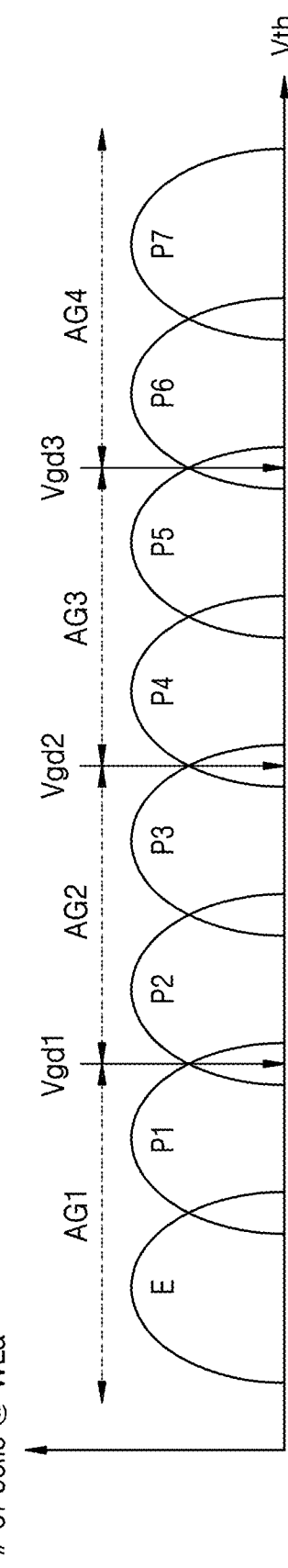
FIG. 22 is a graph showing a method of grouping a plurality of aggressor cell groups, according to an embodiment.

FIG. 22 is a graph illustrating a method of grouping a plurality of aggressor cell groups, according to an embodiment.

Referring to FIG. 22, each of adjacent memory cells connected to an adjacent word line WLa may be grouped into any one of four (4) aggressor cell groups (e.g., first to fourth aggressor cell groups AG1 to AG4), by three (3) group determination read voltages (e.g., first to third group determination read voltages Vgd1, Vgd2, and Vgd3). In an embodiment, a first aggressor cell group AG1 may be referred to as a non-aggressor cell group.

The first aggressor cell group AG1 may include a memory cell having a threshold voltage lower than the first group determination read voltage Vgd1. The second aggressor cell group AG2 may include a memory cell having a threshold voltage, which may be higher than the first group determination read voltage Vgd1 and lower than the second group determination read voltage Vgd2. The third aggressor cell group AG3 may include a memory cell having a threshold voltage, which may be higher than the second group determination read voltage Vgd2 and lower than the third group determination read voltage Vgd3. The fourth aggressor cell group AG4 may include a memory cell having a threshold voltage, which may be higher than the third group determination read voltage Vgd3.

As shown in FIG. 22, the first to third group determination read voltages Vgd1, Vgd2, and Vgd3 may be set such that the number of states belonging to one of the first to fourth aggressor cell groups AG1 to AG4 may be equal to the number of states belonging to another one thereof. However, the present disclosure is not limited in this regard. For example, as described with reference to FIG. 21, the first to third group determination read voltages Vgd1, Vgd2, and Vgd3 may be set such that the numbers of states belonging to the first to fourth aggressor cell groups AG1 to AG4 are not the same.

In an embodiment, when the number of types of aggressor cell groups is four (4), the number of types of coupling patterns may also be four (4). For example, a plurality of coupling patterns may include first to fourth coupling patterns corresponding respectively to the first to fourth aggressor cell groups AG1 to AG4.

Figure 23:
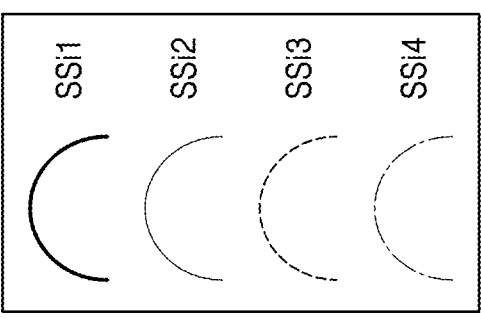
FIG. 23 is a graph showing sub-threshold voltage distributions, according to the plurality of aggressor cell groups, according to an embodiment.

Although three (3) group determination read voltages Vgd1, Vgd2, and Vgd3 are illustrated in FIG. 23, the present disclosure is not limited in this regard. For example, a storage controller 110 may generate a control signal for instructing the application of at least four (4) group determination read voltages.

FIG. 23 is a graph illustrating sub-threshold voltage distributions, according to the plurality of aggressor cell groups, according to an embodiment.

In FIG. 23, an abscissa denotes a threshold voltage Vth of a memory cell, and an ordinate denotes the number of selection memory cells (e.g., #of cells @ WLs) connected to a selection word line WLs and/or a memory cell count value.

Referring to FIG. 23, when the number of types of aggressor cell groups is four (4), each of an erase state E and first to seventh program states P1 to P7 of the selection memory cells may be subdivided into first to fourth sub-states SSi1 to SSi4, which respectively correspond to first to fourth coupling patterns. For example, the first sub-state SSi1 may correspond to the first coupling pattern, the second sub-state SSi2 may correspond to the second coupling pattern, the third sub-state SSi3 may correspond to the third coupling pattern, and the fourth sub-state SSi4 may correspond to the fourth coupling pattern.

The sum of areas of the four (4) sub-states SSi1 to SSi4 corresponding to each state (e.g., an erase state E) may be substantially equal to an area of each state. That is, an area of one sub-state (e.g., the first sub-state SSi1) may correspond to ¼ of an area of a state corresponding thereto.

Figure 24:
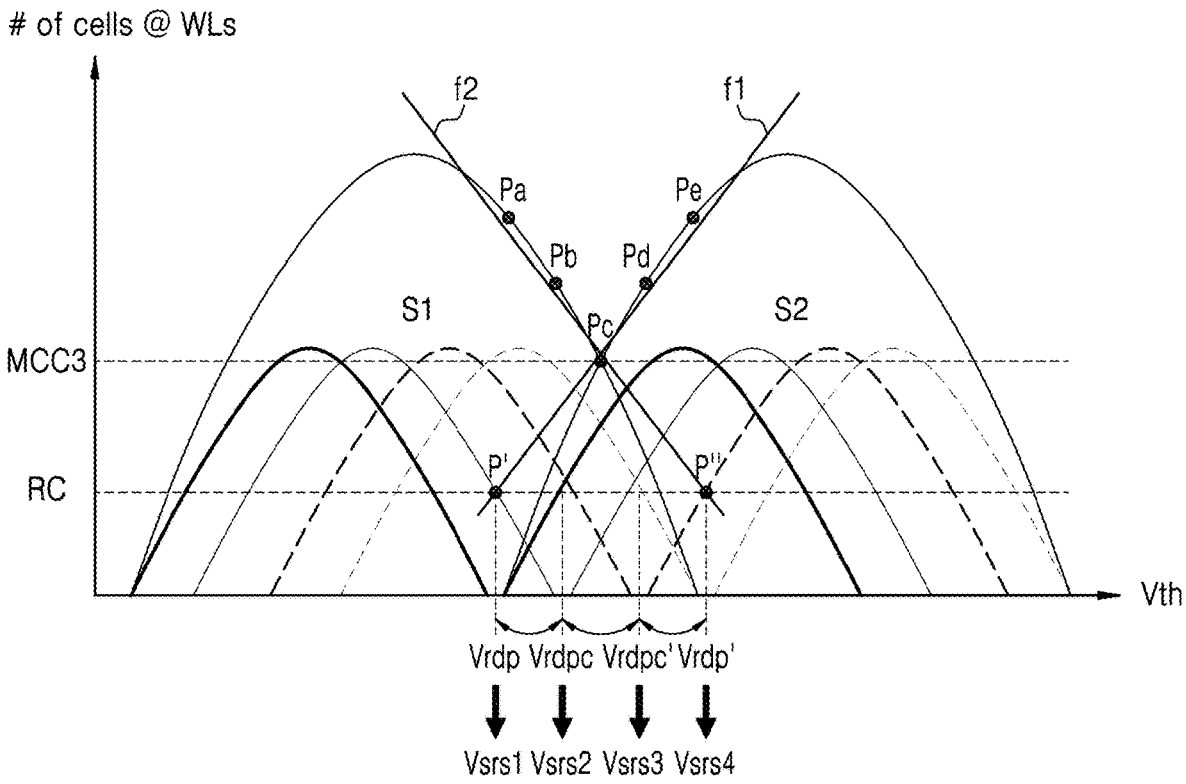
FIG. 24 is a graph showing a method of calculating sub-read voltage sets for the threshold voltage distributions, according to an embodiment.

FIG. 24 is a graph illustrating a method of calculating sub-read voltage sets for the sub-threshold voltage distributions, according to an embodiment.

In FIG. 24, an abscissa denotes a threshold voltage Vth of a memory cell, and an ordinate denotes the number of selection memory cells (e.g., #of cells @ WLs) connected to a selection word line WLs and/or a memory cell count value.

The non-volatile memory 120 may perform a valley search operation, and/or a storage controller 110 may obtain five (5) points (e.g., first to third points Pa, Pb, Pc, Pd, and Pe). The storage controller 110 may obtain a valley point (e.g., third point Pc) from among the first to fifth points Pa, Pb, Pc, Pd, and Pe. The storage controller 110 may set a first function f1, which may be a linear function closest to the third to fifth points Pc, Pd, and Pe, and a second function f2, which may be a linear function closest to the first to third points Pa, Pb, and Pc. The storage controller 110 may respectively calculate a first voltage level Vrdp and a second voltage level Vrdp' of points P' and P'' corresponding to a reference count value RC' in the first function f1 and the second function f2.

In some embodiments, the reference count value RC' may vary with the number of types of coupling patterns. In an optional or additional embodiment, when the area of the first state S1 is substantially equal to the area of the second state S2, the reference count value RC' may be inversely proportional to the number of types of coupling patterns. For example, as shown in FIG. 24, because the number of types of coupling patterns is four (4), the reference count value RC' may be $1/\sqrt{4}$ times the third memory cell count value MMC3.

The non-volatile memory 120 may apply three (3) group determination read voltages (e.g., Vgd1, Vgd2, and Vgd3) to an adjacent word line WLa via the control of the storage controller 110. Alternatively or additionally, the storage controller 110 may group respective aggressor cell groups of adjacent memory cells connected to the adjacent word line WLa. For example, a plurality of aggressor cell groups may include first to fourth aggressor cell groups AG1 to AG4. In an embodiment, the storage controller 110 may classify respective coupling patterns of selection memory cells into first to fourth coupling patterns.

In some embodiments, the storage controller 110 may calculate a plurality of sub-read voltage sets, based on the first voltage level Vrdp and the second voltage level Vrdp'. As shown in FIG. 24, because the number of types of coupling patterns is four (4), the number of types of sub-read voltage sets may be four (4). A sub-read voltage having the first voltage level Vrdp may be included in a first sub-read voltage set Vsrs1 corresponding to the first coupling pattern. The storage controller 110 may calculate a voltage level Vrdpc higher than the first voltage level Vrdp. A sub-read voltage having the voltage level Vrdpc may be included in a second sub-read voltage set Vsrs2 corresponding to the second coupling pattern. The storage controller 110 may calculate a voltage level Vrdpc', which may be higher than the voltage level Vrdpc and lower than the second voltage level Vrdp'. A sub-read voltage having the voltage level Vrdpc' may be included in a third sub-read voltage set Vsrs3 corresponding to the third coupling pattern. A sub-read voltage having the second voltage level Vrdp' may be included in a fourth sub-read voltage set Vsrs4 corresponding to the fourth coupling pattern.

In an embodiment, level intervals between the first voltage level Vrdp, the voltage level Vrdpc, the voltage level Vrdpc', and the second voltage level Vrdp' may be constant. For example, a level interval between the first voltage level Vrdp and the voltage level Vrdpc, a level interval between the voltage level Vrdpc and the voltage level Vrdpc', and a level interval between the voltage level Vrdpc' and the second voltage level Vrdp' may be equal to each other.

The number of types of sub-read voltage sets may correspond to the number of types of coupling patterns. For example, when the number of types of coupling patterns is at least three (3), the storage controller 110 may additionally calculate at least one voltage level between the first voltage level Vrdp and the second voltage level Vrdp', and a sub-read voltage having the calculated voltage level may be included in a specific sub-read voltage set.

FIG. 25 illustrates a table of sub-read voltage sets for a TLC, according to an embodiment.

Referring to FIG. 25, four (4) sub-read voltage sets Vsrs1, Vsrs2, Vsrs3, and Vsrs4 may be sub-read voltage sets for a TLC in which the number of types of coupling patterns is four (4). Each of the four (4) sub-read voltage sets Vsrs1, Vsrs2, Vsrs3, and Vsrs4 may include seven (7) sub-read voltages Vrd11' to Vrd71', Vrd12' to Vrd72', Vrd13' to Vrd73', or Vrd14' to Vrd74'.

The four (4) sub-read voltage sets Vsrs1, Vsrs2, Vsrs3, and Vsrs4 may be stored in the storage controller 110 as a data structure of the read voltage set table 112 of FIG. 1, for example.

Although the sub-read voltage sets for the TLC are shown in FIG. 25 as having seven (7) sub-read voltages, the present disclosure is not limited in this regard. For example, each sub-read voltage set for an SLC may include two (2) sub-read voltages, each sub-read voltage set for an MLC may include four (4) sub-read voltages, and each sub-read voltage set for a QLC may include 16 sub-read voltages.

Moreover, although FIG. 25 shows a case in which the number of types of sub-read voltage sets for the TLC is four (4), the present disclosure is not limited in this regard, and the number of types of sub-read voltage sets may be equal to the number of types of coupling patterns.

Figure 26:
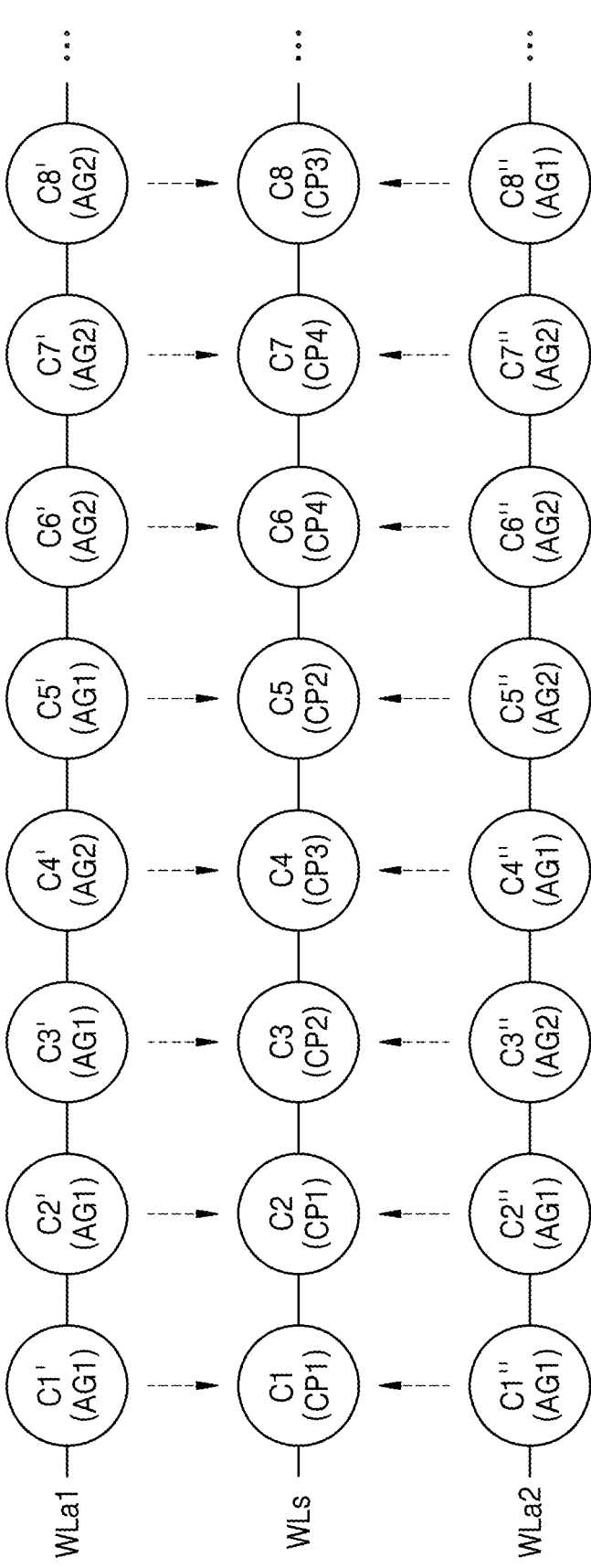
FIG. 26 is a diagram illustrating coupling patterns of selection memory cells coupled to adjacent word lines, according to an embodiment.

FIG. 26 is a diagram illustrating coupling patterns of selection memory cells coupled to adjacent word lines, according to an embodiment.

Referring to FIG. 26, in some embodiments, the number of adjacent word lines may be two (2), and a plurality of adjacent word lines may include a first adjacent word line WLa1 and a second adjacent word line WLa2. The first adjacent word line WLa1 may be adjacent to a selection word line WLs in one direction, and the second adjacent word line WLa2 may be adjacent to the selection word line WLs in a direction opposite to the one direction. For example, with reference to FIG. 3, when the selection word line WLs is a k-th word line (where k is a positive integer greater than one (1) and smaller than eight (8), e.g., 1>k>8), a k−1-th word line and a k+1-th word line may be adjacent word lines. For another example, with reference to FIGS. 6 and 7, when the selection word line WLs is an a-th word line (where a is a positive integer greater than one (1) and smaller than or equal to m−2, e.g., 1<a≤m−2) in the first stack ST1, an a−1-th word line and an a+1-th word line may be adjacent word lines. For yet another example, with reference to FIGS. 6 and 7, when the selection word line WLs is a b-th word line (where b is a positive integer greater than or equal to m+2 and less than or equal to n−1) in the second stack ST2, a b−1-th word line and a b+1-th word line may be adjacent word lines.

Adjacent memory cells C1' to C8' may be connected to the first adjacent word line WLa1. The adjacent memory cells C1' to C8' connected to the first adjacent word line WLa1 may be referred to as first adjacent memory cells. Adjacent memory cells C1" to C8" may be connected to the second adjacent word line WLa2. The adjacent memory cells C1" to C8" connected to the second adjacent word line WLa2 may be referred to as second adjacent memory cells.

A plurality of selection memory cells (e.g., first to eighth selection memory cells C1 to C8) may be respectively adjacent to the first adjacent memory cells C1' to C8' and the second adjacent memory cells C1" to C8". For example, the first selection memory cell C1 may be adjacent to the adjacent memory cells C1' and C1", and the second selection memory cell C2 may be adjacent to the adjacent memory cells C2' and C2". Similarly, the eighth selection memory cell C8 may be adjacent to the adjacent memory cells C8' and C8".

In some embodiments, each selection memory cell may have a coupling pattern according to an aggressor cell group of each of the first adjacent memory cells C1' to C8' and an aggressor cell group of each of the second adjacent memory cells C1" to C8". For example, a plurality of aggressor cell groups may include a first aggressor cell group AG1 and a second aggressor cell group AG2. That is, a first adjacent memory cell connected to the first adjacent word line WLa1 may be included in the first aggressor cell group AG1 and/or the second aggressor cell group AG2, and a second adjacent memory cell connected to the second adjacent word line WLa2 may be included in the first aggressor cell group AG1 and/or the second aggressor cell group AG2. Thus, the number of cases of combinations of aggressor cell groups of the first adjacent memory cell and aggressor cell groups of the second adjacent memory cell may be four (4). For example, the cases of combinations of the aggressor cell groups of the first adjacent memory cell and the aggressor cell groups of the second adjacent memory cell may be "the first aggressor cell group AG1, the first aggressor cell group AG1", "the first aggressor cell group AG1, the second aggressor cell group AG2", "the second aggressor cell group AG2, the first aggressor cell group AG1", and "the second aggressor cell group AG2, the second aggressor cell group AG2." Accordingly, coupling patterns of each selection memory cell may include a first coupling pattern CP1, a second coupling pattern CP2, a third coupling pattern CP3, and a fourth coupling pattern CP4. Although coupling patterns of each of the first to eighth selection memory cells C1 to C8 may be shown in FIG. 26, the present disclosure is not limited to the example embodiments shown in FIG. 26.

Figure 27:
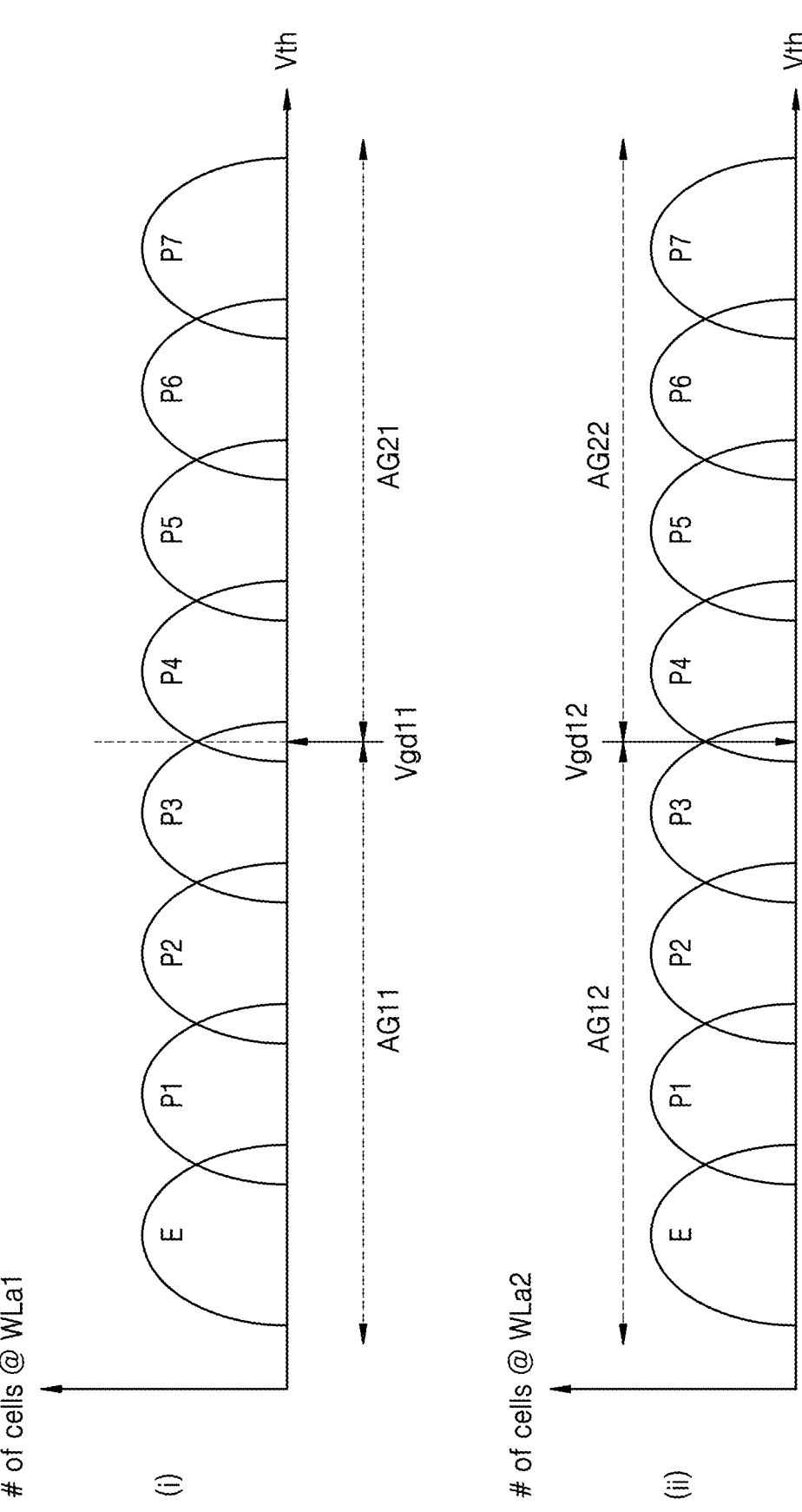
FIG. 27 shows graphs illustrating a method of grouping a plurality of aggressor cell groups of adjacent memory cells corresponding respectively to adjacent word lines, according to an embodiment.

FIG. 27 shows graphs illustrating a method of grouping a plurality of aggressor cell groups of adjacent memory cells corresponding respectively to adjacent word lines, according to an embodiment.

Referring to FIGS. 26 and 27, in graph (i) and graph (ii) of FIG. 27, an abscissa denotes a threshold voltage Vth of a memory cell. In graph (i) of FIG. 27, an ordinate denotes the number of adjacent memory cells (e.g., #of cells @ WLa1) connected to a first adjacent word line WLa1 and/or a memory cell count value. In graph (ii) of FIG. 27, an ordinate denotes the number of adjacent memory cells (e.g., #of cells @ WLa2) connected to a second adjacent word line WLa2 and/or a memory cell count value.

A storage controller 110 may provide, to a non-volatile memory 120, a first adjacent address and a first control signal for instructing the application of at least one first group determination read voltage to the first adjacent word line WLa1, which may be adjacent to a selection word line in one direction. The first adjacent address may be an address corresponding to the first adjacent word line WLa1. The storage controller 110 may group, into the same aggressor cell group, adjacent memory cells having a threshold voltage included in the same level section, out of level sections divided by a level of at least one first group determination read voltage, for each first adjacent memory cell connected to the first adjacent word line WLa1.

Each of the first adjacent memory cells connected to the first adjacent word line WLa1 may be grouped into a first aggressor cell group AG11 and/or a second aggressor cell group AG21 by one group determination read voltage Vgd11 for the first adjacent word line WLa1. The first aggressor cell group AG11 may include a memory cell having a threshold voltage lower than the group determination read voltage Vgd11. The second aggressor cell group AG21 may include a memory cell having a threshold voltage higher than the group determination read voltage Vgd11.

Alternatively or additionally, the storage controller 110 may provide, to the non-volatile memory 120, a second adjacent address and a second control signal for instructing the application of at least one second group determination read voltage to the second adjacent word line WLa2, which may be adjacent to the selection word line in a direction opposite to the one direction. The second adjacent address may be an address corresponding to the second adjacent word line WLa2. The storage controller 110 may group, into the same aggressor cell group, adjacent memory cells having a threshold voltage included in the same level section, out of level sections divided by a level of at least second group determination read voltage, for each second adjacent memory cell connected to the second adjacent word line WLa2.

Each of the second adjacent memory cells connected to the second adjacent word line WLa2 may be grouped into a first aggressor cell group AG12 and/or a second aggressor cell group AG22 by one group determination read voltage Vgd12 for the second adjacent word line WLa2. The first aggressor cell group AG12 may include a memory cell having a threshold voltage lower than the group determination read voltage Vgd12. The second aggressor cell group AG22 may include a memory cell having a threshold voltage higher than the group determination read voltage Vgd12.

In some embodiments, a voltage level of the one group determination read voltage Vgd11 for the first adjacent word line WLa1 may be equal to or different from a voltage level of the one group determination read voltage Vgd12 for the second adjacent word line WLa2.

The one group determination read voltage Vgd11 for the first adjacent word line WLa1 and the one group determination read voltage Vgd12 for the second adjacent word line WLa2 are shown in FIG. 27, but the present disclosure is not limited in this regard. For example, the number of group determination read voltages for the first adjacent word line WLa1 may be at least two (2). For another example, the number of group determination read voltages for the second adjacent word line WLa2 may be at least two (2).

In an embodiment, the storage controller 110 may classify a coupling pattern of one section memory cell, based on an aggressor cell group including one first adjacent memory cell adjacent to the one selection memory cell and an aggressor cell group including one second adjacent memory cell adjacent to the one selection memory cell. For example, respective coupling patterns of a plurality of selection memory cells (e.g., C1 to C8) may be classified as shown in FIG. 26.

Figure 28:
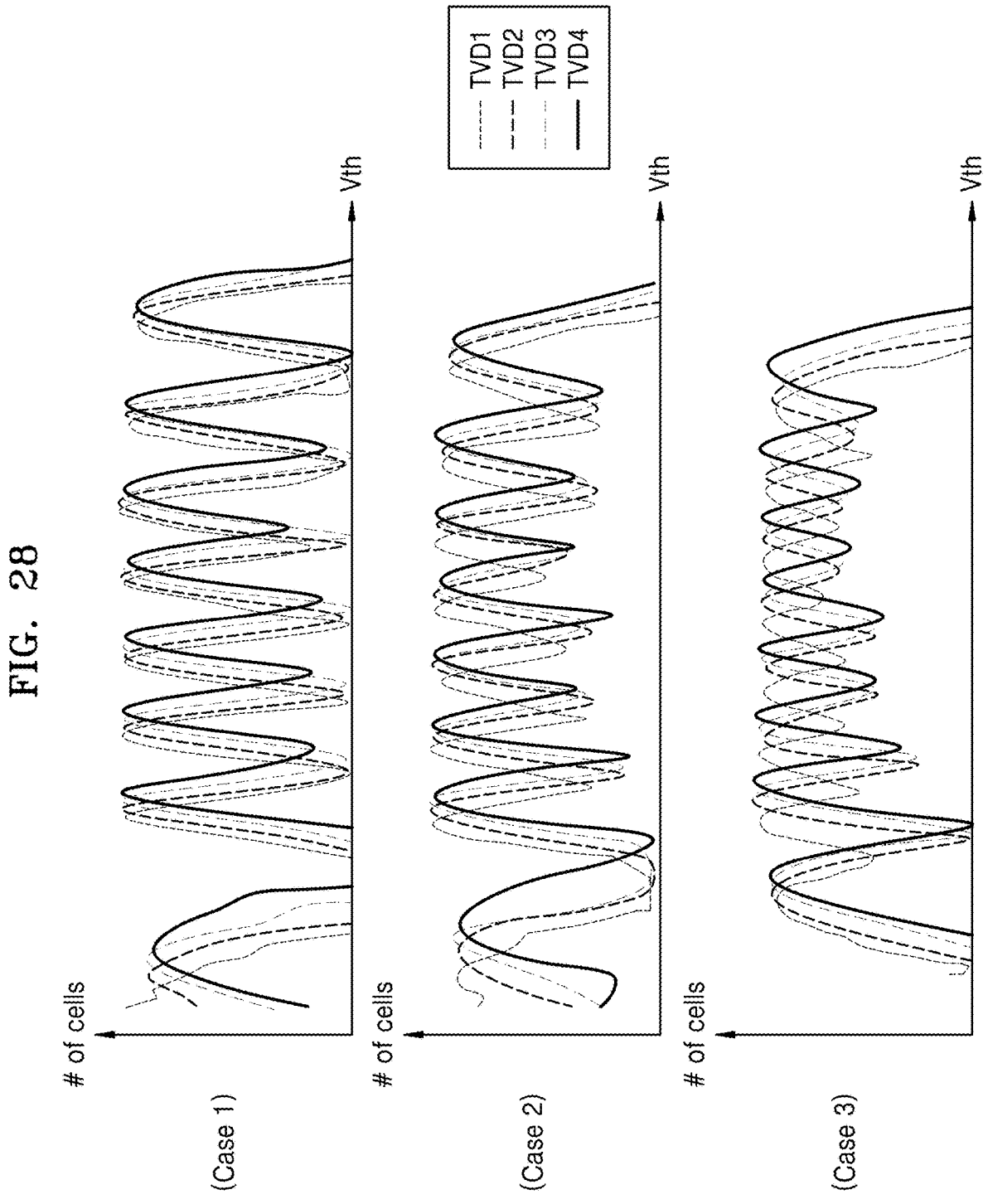
FIG. 28 shows graphs of threshold voltage distributions of selection memory cells coupled to adjacent word lines, according to an embodiment.

FIG. 28 shows graphs of threshold voltage distributions of selection memory cells coupled to adjacent word lines, according to an embodiment.

Referring to FIG. 28, Case 1 may schematically show first to fourth threshold voltage distributions TVD1, TVD2, TVD3, and TVD4 of a plurality of selection memory cells, according to the coupling effects of adjacent memory cells in an initial state of a non-volatile memory 120. The number of threshold voltage distributions (e.g., TVD1, TVD2, TVD3, and TVD4) may be four (4), and the number of coupling patterns may be four (4). The first threshold voltage distributions TVD1 may be, for example, threshold voltage distributions of a plurality of selection memory cells having a first coupling pattern CP1 from among the plurality of coupling patterns. The second threshold voltage distributions TVD2 may be, for example, threshold voltage distributions of a plurality of selection memory cells having a second coupling pattern CP2 from among the plurality of coupling patterns. The third threshold voltage distributions TVD3 may be, for example, threshold voltage distributions of a plurality of selection memory cells having a third coupling pattern CP3 from among the plurality of coupling patterns. The fourth threshold voltage distributions TVD4 may be, for example, threshold voltage distributions of a plurality of selection memory cells having a fourth coupling pattern CP4 from among the plurality of coupling patterns.

Case 2 may schematically show the threshold voltage distributions TVD1, TVD2, TVD3, and TVD4 of the plurality of selection memory cells, according to the coupling effects of adjacent memory cells in a state of the non-volatile memory 120, after a predetermined retention period. A degree to which the threshold voltage distributions TVD1, TVD2, TVD3, and TVD4 are distorted due to coupling between the adjacent memory cells in Case 2 may be greater than in Case 1. A degree to which the threshold voltage distributions TVD1, TVD2, TVD3, and TVD4 are widened and/or shifted in Case 2 may be greater than in Case 1.

Case 3 may correspond to a case in which infrared radiation (IR) is irradiated during a process of the non-volatile memory 120. A degree to which the threshold voltage distributions TVD1, TVD2, TVD3, and TVD4 are distorted due to coupling between the adjacent memory cells in Case 3 may be greater than in Case 1 and Case 2. A degree to which the threshold voltage distributions TVD1, TVD2, TVD3, and TVD4 are widened and/or shifted in Case 3 may be greater than in Case 1 and Case 2.

Figure 29:
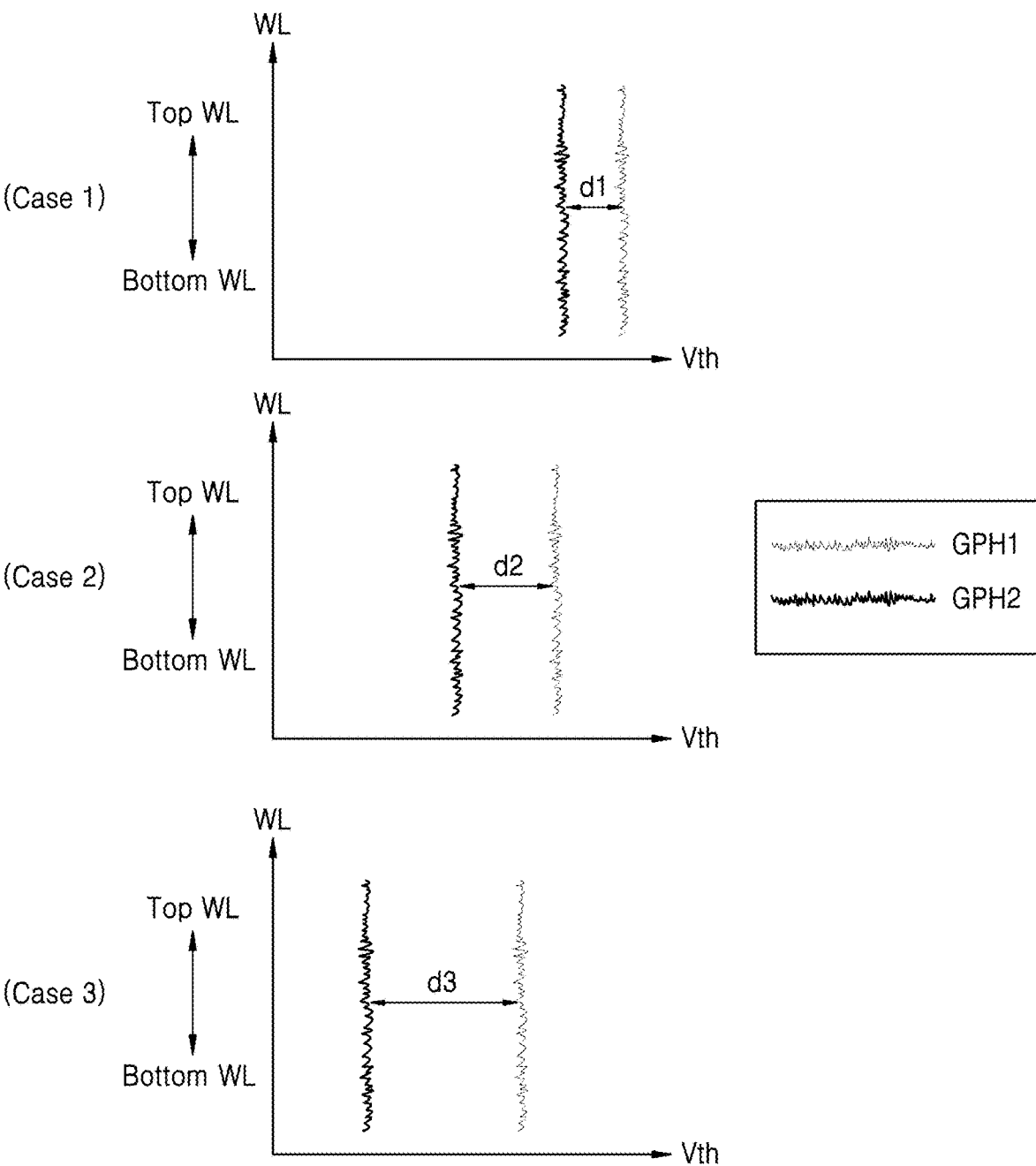
FIG. 29 shows graphs of threshold voltages of selection memory cells coupled to adjacent word lines for each word line, according to an embodiment.

FIG. 29 shows graphs of threshold voltages of selection memory cells coupled to adjacent word lines for each word line, in an embodiment. Referring to FIG. 29, graphs of voltage levels of a threshold voltage Vth corresponding to levels of a specific read voltage for selection memory cells having each of two (2) different coupling patterns are illustrated.

In FIG. 29, an abscissa denotes a threshold voltage Vth of a selection memory cell corresponding to a specific read voltage, and an ordinate denotes word lines WL. The specific read voltage may be, for example, the seventh read voltage Vrd7 of FIG. 9, without being limited in this regard.

First graph GPH1 may show a level of the specific read voltage for selection memory cells having one specific coupling pattern. Second graph GPH2 may show a level of the specific read voltage for selection memory cells having a coupling pattern that is different from the specific coupling pattern. Referring to first graph GPH1 and second graph GPH2, a substantially constant voltage level may be maintained between a top word line Top WL and a bottom word line Bottom WL.

Case 1, Case 2, and Case 3 as shown and described in reference to FIG. 29, may respectively correspond to Case 1, Case 2, and Case 3, as shown and described in reference to FIG. 28.

In Case 1, a first voltage level difference d1 may occur between first graph GPH1 and second graph GPH2.

In Case 2, first graph GPH1 and second graph GPH2 may be shifted due to coupling effects of adjacent memory cells. A second voltage level difference d2 between first graph GPH1 and second graph GPH2 may be greater than the first voltage level difference d1.

In Case 3, first graph GPH1 and second graph GPH2 may be further shifted by the coupling effects of the adjacent memory cells. A third voltage level difference d3 between first graph GPH1 and second graph GPH2 may be greater than the second voltage level difference d2.

The widening and/or shifting of the voltage levels may be a result of skews of voltage levels increase due to the charge loss of memory cells, which may vary according to a state of the adjacent memory cells. That is, a skew for each state of the adjacent memory cells may be different for each chip, memory block, or word line.

Therefore, according to the above-described embodiment, the performance of a data recovery read operation may be improved by calculating optimum sub-read voltages in response to coupling effects of adjacent memory cells, which may be different for each word line.

Figure 30:
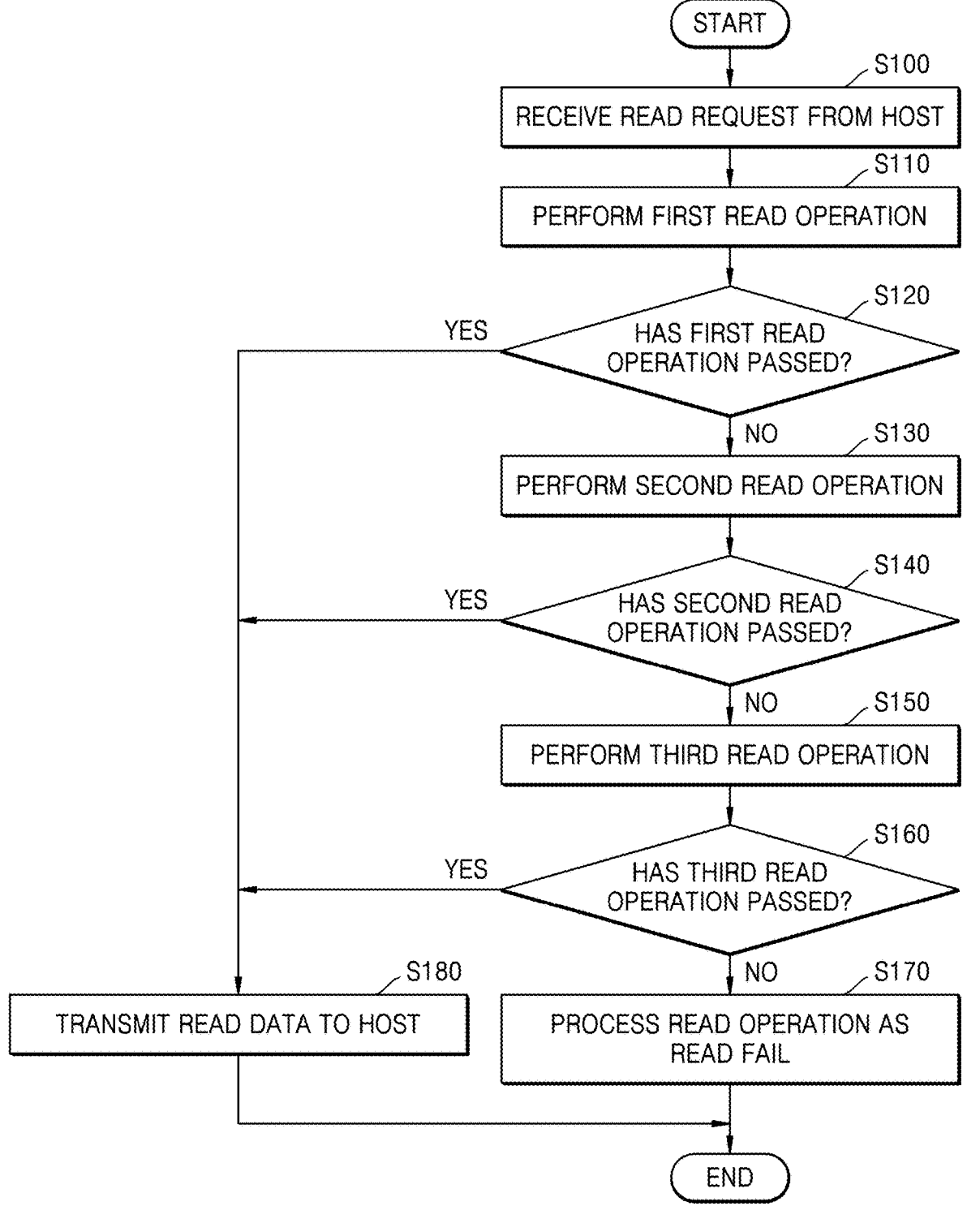
FIG. 30 is a flowchart of a read operation method, according to an embodiment.

FIG. 30 is a flowchart of a read operation method, according to an embodiment.

Referring to FIG. 30, in operation S100, an operation of receiving a read request from a host may be performed.

In operation S110, a first read operation may be performed in response to the read request provided from the host. The first read operation may be an operation of reading, by the non-volatile memory 120, stored data based on a default read voltage set. The first read operation may be referred to as a normal read operation.

In operation S120, the storage control may check whether the first read operation has passed. Whether or not the first read operation passes may be determined according to whether read data is normal data and/or data including an error that is correctable by the ECC circuit 113. In an embodiment, the read manager 111 may determine whether the first read operation has passed, according to whether an error in the read data is correctable by the ECC circuit 113.

When the first read operation has failed (No in operation S120), a second read operation may be performed in operation S130. The second read operation may be an operation of reading data based on a history read voltage set. The second read operation may be referred to as a history read operation.

In operation S140, the storage control may check whether the second read operation has passed. In an embodiment, the read manager 111 may determine whether the second read operation has passed, according to whether an error in the read data is correctable by the ECC circuit 113.

When the second read operation has failed (No in operation S140), a third read operation may be performed in operation S150. The third read operation may be an operation of reading data based on at least one sub-read voltage set by executing a recovery code. The third read operation may be referred to as a data recovery read operation.

In operation S160, the storage controller may check whether the third read operation has passed. In an embodiment, the read manager 111 may determine whether the third read operation has passed, according to whether an error in the read data is correctable by the ECC circuit 113. If the third read operation has failed (No at operation S160), the read operation may be processed as a read fail in operation S170.

If the first read operation has passed (Yes in operation S120), or if the second read operation has passed (Yes in operation S140), or if the third read operation has passed (Yes in operation S160), the read data may be transmitted to the host in operation S180.

A data recovery read operation may be performed by using an optimum read voltage, which may be calculated according to an aggressor cell group of adjacent memory cells. As a result, the probability of a read pass may be increased, and the performance and reliability of the storage device 100 may be improved.

Figure 31:
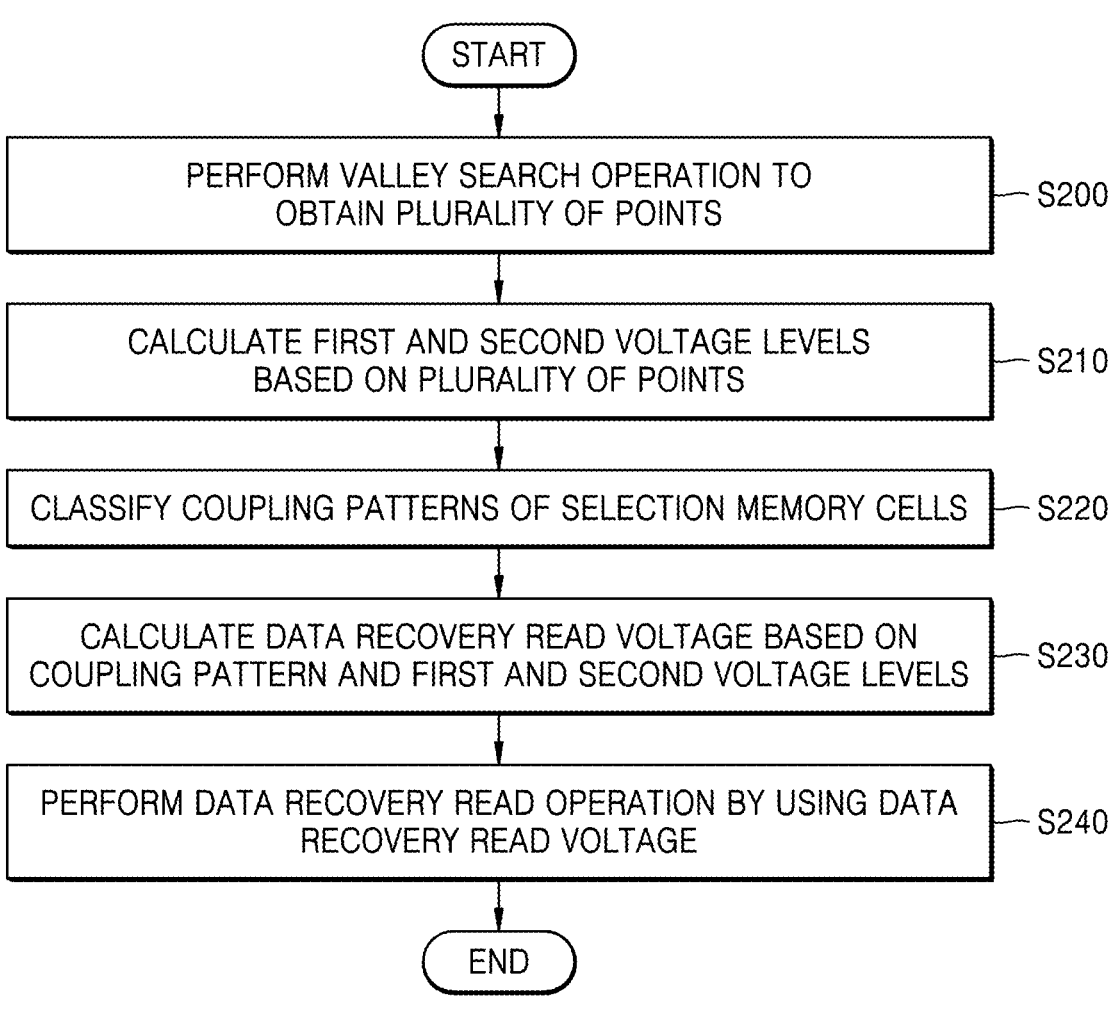
FIG. 31 is a flowchart of a data recovery read operation method, according to an embodiment.

FIG. 31 is a flowchart of a data recovery read operation method, according to an embodiment.

Referring to FIG. 31, in operation S200, a plurality of points may be obtained by performing a valley search operation. Operation S200 may be performed by a storage controller 110. In some embodiments, in operation S200, first to fifth points respectively including levels of first to fifth read voltages and first to fifth memory cell count values may be obtained by sequentially applying the first to fifth read voltages to a selection word line. In this case, a valley point may be a third point of the first to fifth points. For example, with reference to FIG. 16, the non-volatile memory 120 may sequentially apply first to fifth read voltages Vp1 to Vp5 to a selection word line WLs, sense bit lines BL, and calculate memory cell count values indicating the number of OFF cells. As a result of the valley search operation of the non-volatile memory 120, the storage controller 110 may obtain five (5) points (e.g., first to five (5) points Pa, Pb, Pc, Pd, and Pe). In some embodiments, the third point Pc may be a valley point from among the first to fifth points Pa, Pb, Pc, Pd, and Pe.

Operation S210 of calculating first and second voltage levels, based on the plurality of points, may be performed. Operation S210 may be performed by the storage controller 110. For example, with reference to FIG. 17, the storage controller 110 may calculate, by a linear regression model, a first voltage level Vrdp of a point P' corresponding to a reference count value RC in a first function f1, which may be a linear function closest to the third to fifth points Pc, Pd, and Pe. For another example, with reference to FIG. 18, the storage controller 110 may calculate, by a linear regression model, a second voltage level Vrdp' of a point P'' corresponding to the reference count value RC in a second function f2, which may be linear function closest to the first to third points Pa, Pb, and Pc.

In operation S220, coupling patterns of selection memory cells may be classified according to an aggressor cell group of each of adjacent memory cells. Operation S220 may be performed by the storage controller 110.

In some embodiments, operation S220 may include grouping adjacent memory cells, which may be connected to at least one adjacent word line physically adjacent to the selection word line, into a plurality of aggressor cell groups and classifying the selection memory cells into a plurality of coupling patterns, according to each of the plurality of aggressor cell groups.

In an embodiment, operation S220 may include applying one group determination read voltage to one adjacent word line, grouping memory cells having a threshold voltage at a level lower than a level of a group determination read voltage of one of adjacent memory cells connected to the one adjacent word line, into a first aggressor cell group. The operation S220 may further include grouping memory cells having a threshold voltage at a level higher than or equal to a level of a group determination read voltage of one of the adjacent memory cells connected to the one adjacent word line, into a second aggressor cell group. The operation S220 may further include classifying, as a first coupling pattern, a coupling pattern of a selection memory cell corresponding to an adjacent memory cell included in the first aggressor cell group, and classifying, as a second coupling pattern, a coupling pattern of a selection memory cell corresponding to an adjacent memory cell included in the second aggressor cell group. For example, with reference to FIGS. 11 and 12, the non-volatile memory 120 may apply one group determination read voltage Vgd to one adjacent word line WLa and sense the bit lines BL. The storage controller 110 may group each of the adjacent memory cells into a first aggressor cell group AG1 and/or a second aggressor cell group AG2, based on sensed values of the bit lines BL (e.g., bit values stored in the adjacent memory cells). The storage controller 110 may group the coupling pattern of each of the selection memory cells into a first coupling pattern CP1 and/or a second coupling pattern CP2 according to the plurality of aggressor cell groups.

In an optional or additional embodiment, operation S220 may include sequentially applying at least two (2) group determination read voltages to one adjacent word line. The operation S220 may further include grouping, into the same aggressor cell group, adjacent memory cells having a threshold voltage included in the same level section, out of level sections divided by levels of at least two (2) group determination read voltages, from among the adjacent memory cells connected to the one adjacent word line. The operation S220 may further include classifying, as an N-th coupling pattern, a coupling pattern of a selection memory cell corresponding to an adjacent memory cell included in an N-th aggressor cell group, where N is a positive integer greater than zero (0). For example, with reference to FIGS. 21 and 22, at least two (2) group determination read voltages (e.g., Vgd1, Vgd2, and Vgd3) may be applied to one adjacent word line WLa. The adjacent memory cells may be grouped into at least three (3) aggressor cell groups, and the selection memory cells may have coupling patterns corresponding to the aggressor cell groups.

In another optional or additional embodiment, operation S220 may include applying at least one first group determination read voltage to a first adjacent word line, which may be adjacent to a selection word line in one direction. The operation S220 may further include grouping, into the same aggressor cell group, adjacent memory cells having a threshold voltage included in the same level section, out of level sections divided by a level of at least one first group determination read voltage, for each first adjacent memory cell connected to the first adjacent word line. The operation S220 may further include applying at least one second group determination read voltage to a second adjacent word line, which may be adjacent to the section word line in a direction opposite to the one direction. The operation S220 may further include grouping, into the same aggressor cell group, adjacent memory cells having a threshold voltage included in the same level section, out of level sections divided by a level of at least one second group determination read voltage, for each second adjacent memory cell connected to the second adjacent word line. The operation S220 may further include classifying a coupling pattern of one selection memory cell, based on an aggressor cell group including one first adjacent memory cell adjacent to the one selection memory cell and an aggressor cell group including one second adjacent memory cell adjacent to the one selection memory cell. For example, with reference to FIGS. 26 and 27, the non-volatile memory 120 may sequentially sense the bit lines BL by applying at least one group determination read voltage (e.g., Vgd11) to the first adjacent word line WLa1 and applying at least one group determination read voltage (e.g., Vgd12) to the second adjacent word line WLa2. The storage controller 110 may group a plurality of aggressor cells groups of adjacent memory cells connected to each adjacent word line, based on the sensed values of the bit lines BL, and classify a coupling pattern of each of the selection memory cells according to a combination of the plurality of aggressor cell groups.

In operation S230, a data recovery read voltage may be calculated based on the coupling pattern and the first and second voltage levels. Operation S230 may be performed by the storage controller 110.

In some embodiments, operation S230 may include calculating sub-read voltage levels corresponding respectively to the plurality of coupling patterns, based on the first voltage level and the second voltage level.

In an embodiment, the plurality of coupling patterns may include a first coupling pattern CP1 and a second coupling pattern CP2, and the calculation of the sub-read voltage levels may include calculating the first voltage level as a first sub-read voltage level corresponding to the first coupling pattern CP1 and calculating the second voltage level as a second sub-read voltage level corresponding to the second coupling pattern CP2. For example, with reference to FIG. 19, because the plurality of coupling patterns includes the first coupling pattern CP1 and the second coupling pattern CP2, a sub-read voltage having the first voltage level Vrdp may be included in a first sub-read voltage set Vsrs1 corresponding to the first coupling pattern CP1, and a sub-read voltage having the second voltage level Vrdp' may be included in a second sub-read voltage set Vsrs2 corresponding to the second coupling pattern CP2. The first sub-read voltage set Vsrs1 and the second sub-read voltage set Vsrs2 may correspond to the data recovery read voltage.

In an optional or additional embodiment, the plurality of coupling patterns may include first to M-th coupling patterns (where M is positive integer greater than two (2)), and the calculation of the sub-read voltage levels may include calculating the first voltage level as a first sub-read voltage level corresponding to the first coupling pattern CP1, calculating the second voltage level as an M-th sub-read voltage level corresponding to an M-th coupling pattern, and sequentially calculating voltage levels, which are equidistantly divided between the first voltage level and the second voltage level as second to M−1-th sub-read voltage levels corresponding respectively to the second to M−1-th coupling patterns. For example, with reference to FIGS. 24 and 26, because types of the coupling patterns include first to fourth coupling patterns CP1 to CP4, two (2) voltage levels Vrdpc and Vrdpc', which are between the first voltage level Vrdp and the second voltage level Vrdp', may be further calculated. Alternatively or additionally, each of the first voltage level Vrdp, two (2) voltage levels Vrdpc and Vrdpc', and the second voltage level Vrdp' may be included in each of the first to fourth sub-read voltage sets Vsrs1 to Vsrs4.

Operation S240 of performing a data recovery read operation by using the data recovery read voltage may be performed. Operation S240 may be performed by the storage controller 110.

In some embodiments, operation S240 may include sequentially reading data stored in memory cells having the same coupling pattern, from among the selection memory cells, by sequentially applying sub-read voltages having sub-read voltage levels to the selection word line.

For example, with reference to FIG. 15A, by applying sub-read voltages Vrd11' to Vrd71' included in the first sub-read voltage set Vsrs1 to the selection word line WLs, a first partial read operation of reading data from selection memory cells C2, C5, C6, and C7 having the first coupling pattern CP1 may be performed. In such an example, data read from selection memory cells C1, C3, C4, C8 having the second coupling pattern CP2 may be ignored. For another example, with reference to FIGS. 15B, by sequentially applying sub-read voltages Vrd12' to Vrd72' included in the second sub-read voltage set Vsrs2 to the selection word line WLs, a second partial read operation of reading data from the selection memory cells C1, C3, C4, and C8 having the second coupling pattern CP2 may be performed. In this case, the selection memory cells C2, C5, C6, and C7 having the first coupling pattern CP1 may be ignored. The first partial read operation and second partial read operation may be included in the data recovery read operation.

A data recovery read operation may be performed by using an optimum read voltage, which may be calculated according to an aggressor cell group of adjacent memory cells, and thus, the probability of a read pass may be increased, and the performance and reliability of a device may be improved.

Figure 32:
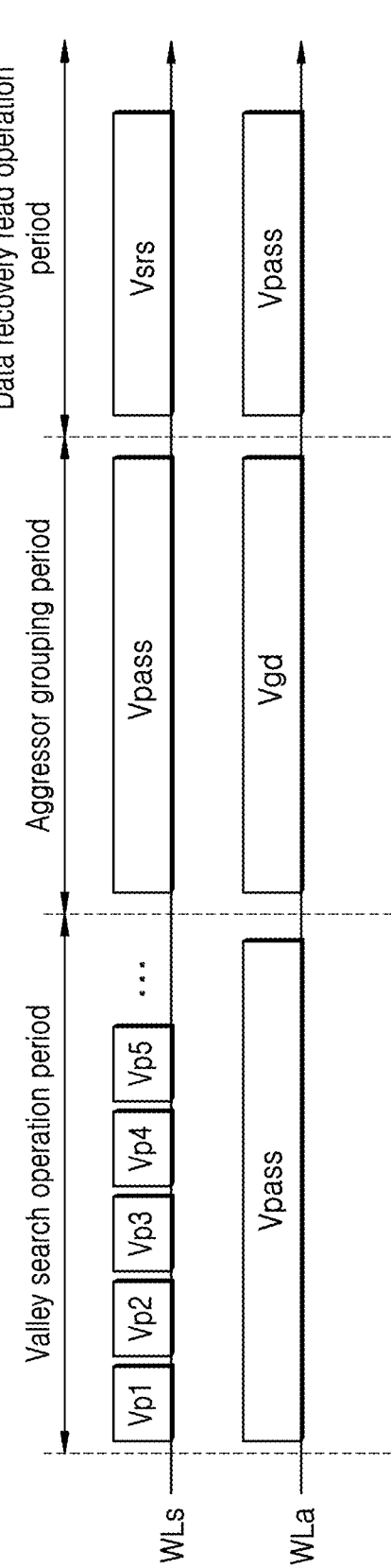
FIG. 32 is a timing diagram of word line voltages applied to a selection word line and an adjacent word line, according to an embodiment.

FIG. 32 illustrates a timing diagram of word line voltages applied to a selection word line and an adjacent word line, according to an embodiment.

Referring to FIGS. 2 and 32, during a first period, the voltage generator 230 may sequentially apply a plurality of read voltages (e.g., Vp1, Vp2, Vp3, Vp4, Vp5, . . . , hereinafter "Vp" generally) for performing a valley search operation to a selection word line WLs. In an embodiment, the number of read voltages Vp may be at least five (5). For example, first to fifth read voltages Vp, which may be sequentially increased, may be applied to the selection word line WLs. However, the present disclosure is not limited in this regard. From among the first to fifth read voltages Vp, the first read voltage Vp1 may have a lowest level, and the fifth read voltage Vp5 may have a highest level. Alternatively or additionally, the voltage generator 230 may apply a pass voltage Vpass to at least one adjacent word line WLa. A valley search operation may be performed in the first period. Consequently, the first period may be referred to as a valley search operation period.

During a second period, the voltage generator 230 may apply at least one group determination read voltage Vgd to at least one adjacent word line (e.g., WLa, or WLa1 and WLa2). Alternatively or additionally, the voltage generator 230 may apply the pass voltage Vpass to the selection word line WLs. An aggressor cell group of an adjacent memory cell may be determined during the second period. Consequently, the second period may be referred to as an aggressor grouping period.

In an embodiment, when the number of adjacent word lines WLa is two (2), the voltage generator 230 may apply at least one first group determination read voltage (e.g., Vgd11) to the first adjacent word line (e.g., WLa1) and apply at least one second group determination read voltage (e.g., Vgd12) to the second adjacent word line (e.g., WLa2). The at least one first group determination read voltage (e.g., Vgd11) and the at least one second group determination read voltage (e.g., Vgd12) may be sequentially applied. For example, after the first group determination read voltage (e.g., Vgd11) is applied, the second group determination read voltage (e.g., Vgd12) may be applied. Alternatively or additionally, after the second group determination read voltage (e.g., Vgd12) is applied, the first group determination read voltage (e.g., Vgd11) may be applied.

During a third period, the voltage generator 230 may sequentially apply sub-read voltage sets Vsrs to the selection word line WLs. Each of the sub-read voltage sets Vsrs may include sub-read voltages. Alternatively or additionally, the voltage generator 230 may apply the pass voltage Vpass to at least one adjacent word line WLa. A data read operation may be performed during the third period. Consequently, the third period may be referred to as a data recovery read operation period.

In some embodiments, the sub-read voltages included in each of the sub-read voltage sets Vsrs may include a first voltage level Vrdp and a second voltage level Vrdp'. The first voltage level Vrdp may correspond to a reference count value (e.g., RC) in a linear function that may be closest to points corresponding to read voltages having a level higher than or equal to a level of a valley read voltage, from among the plurality of read voltages Vp. When the valley read voltage is the third read voltage Vp3, from among the first to fifth read voltages Vp, the read voltages having the level higher than or equal to the level of the valley read voltage may be the third to fifth read voltages Vp3, Vp4, and Vp5.

The second voltage level Vrdp' may correspond to a reference count value (e.g., RC) in a linear function that is closest to points corresponding to read voltages having a level equal to or smaller than the level of the valley read voltage, from among the plurality of read voltages Vp. When the valley read voltage is the third read voltage Vp3, from among the first to fifth read voltages Vp, the read voltages having the level equal to or smaller than the level of the valley read voltage may be the first to third read voltages Vp1, Vp2, and Vp3.

In some embodiments, when the number of group determination read voltage Vgd for one adjacent word line WLa is at least two (2), the sub-read voltages included in each of the sub-read voltage sets Vsrs may further include at least one voltage level that is equidistantly divided between the first voltage level Vrdp and the second voltage level Vrdp'.

In some embodiments, when the number of adjacent word line WLa is two (2), the sub-read voltages included in each of the sub-read voltage sets Vsrs may further include at least two (2) voltage levels that are equidistantly divided between the first voltage level Vrdp and the second voltage level Vrdp'.

FIG. 33 is a block diagram of a memory system 15, according to an embodiment.

The memory system 15 may include a memory controller 16 and a memory device 17. The memory system 15 may support a plurality of channels CH1 to CHm, where m is a positive integer greater than zero (0). The memory controller 16 may be connected to the memory device 17 through the plurality of channels CH1 to CHm. For example, the memory system 15 may be implemented as a storage device, such as an SSD. The memory system 15 may be implemented to execute a recovery code.

The memory controller 16 may transmit and/or receive signals to and/or from the memory device 17 through the plurality of channels CH1 to CHm. For example, the memory controller 16 may transmit commands CMDa to CMDm, addresses ADDRa to ADDRm, and/or data DATAa to DATAm to the memory device 17 through the channels CH1 to CHm and/or receive data DATAa to DATAm from the memory device 17 through the channels CH1 to CHm.

The memory controller 16 may select one of non-volatile memory devices NVM11 to NVMmn connected to each channel through the channel, and transmit and/or receive signals to and/or from the selected non-volatile memory device, where n is a positive integer greater than zero (0). For example, the memory controller 16 may select the non-volatile memory device NVM11 out of the non-volatile memory devices NVM11 to NVM1n connected to a first channel CH1. The memory controller 16 may transmit the command CMDa, the address ADDRa, and/or the data DATAa to the selected the non-volatile memory device NVM11 through the first channel CH1 and/or receive the data DATAa from the selected the non-volatile memory device NVM11 through the first channel CH1.

The memory controller 16 may transmit and/or receive signals to and/or from the memory device 17 in parallel through different channels. For example, the memory controller 16 may transmit the command CMDb to the memory device 17 through a second channel CH2 while transmitting the command CMDa to the memory device 17 through the first channel CH1. For another example, the memory controller 16 may receive data DATAb from the memory device 17 through the second channel CH2 while receiving the data DATAa from the memory device 17 through the first channel CH1.

The memory controller 16 may control the operations of the memory device 17. The memory controller 16 may transmit signals to the channels CH1 to CHm and each of the non-volatile memory devices NVM11 to NVMmn connected to the channels CH1 to CHm. For example, the memory controller 16 may transmit the command CMDa and the address ADDRa to the first channel CH1 and control a selected one of the non-volatile memory devices NVM11 to NVM1n.

The memory device 17 may include a plurality of non-volatile memory devices NVM11 to NVMmn. Each of the non-volatile memory devices NVM11 to NVMmn may be connected to one of the channels CH1 to CHm through a way corresponding thereto. For example, the non-volatile memory devices NVM11 to NVM1n may be connected to the first channel CH1 through ways W11 to W1n, respectively, and the non-volatile memory devices NVM21 to NVM2n may be connected to the second channel CH2 through ways W21 to W2n, respectively. In an embodiment, each of the non-volatile memory devices NVM11 to NVMmn may be implemented as an arbitrary memory unit capable of operating in response to an individual command from the memory controller 16. For example, each of the non-volatile memory devices NVM11 to NVMmn may be implemented as a chip or a die, without being limited in this regard.

When each of the non-volatile memory devices NVM11 to NVMmn is implemented as the chip (or the die), for reasons of a manufacturing process, a degree of degradation of threshold voltage distributions caused by coupling between adjacent memory cells may be different for each chip. According to the data recovery read operation described above, even when degrees of degradation of different threshold voltage distribution are different for each chip, a read voltage optimized for each chip may be calculated. Accordingly, a data recovery read operation on each chip may be determined as a read pass. Therefore, by calculating, for each chip, optimum sub-read voltages corresponding to coupling effects of different adjacent memory cells, the performance of the data recovery read operation on each chip may be improved.

Each of the non-volatile memory devices NVM11 to NVMmn may operate via the control of the memory controller 16. For example, the non-volatile memory device NVM11 may program the data DATAa in response to the command CMDa, the address ADDRa, and the data DATAa, which are provided to the first channel CH1. For another example, the non-volatile memory device NVM21 may read the data DATAb in response to the command CMDb and the address ADDRb, which are provided to the second channel CH2, and transmit the read data DATAb to a memory controller.

Although FIG. 33 illustrates a case in which the memory device 17 may communicate with the memory controller 16 through m channels and includes n non-volatile memory devices corresponding to each channel, the present disclosure is not limited in this regard. That is, the number of channels and/or the number of non-volatile memory devices connected to one channel may be variously changed without deviating from the scope of the present disclosure.

In an embodiment, a non-volatile memory device may be implemented using a chip-to-chip (C2C) structure. The non-volatile memory device having the C2C structure is described with reference to FIG. 36.

Figure 34:
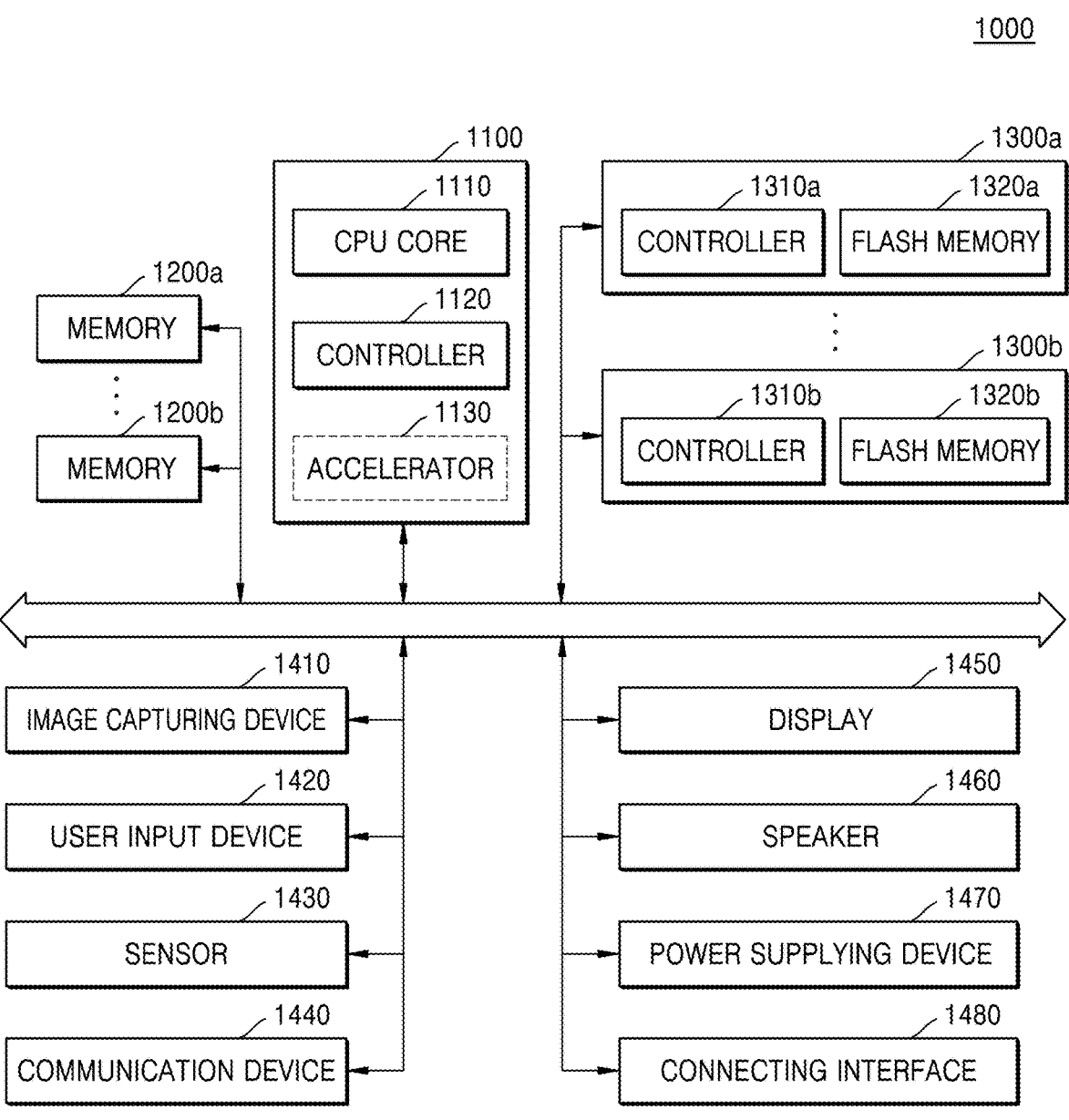
FIG. 34 is a block diagram of a system to which a storage device is applied, according to an embodiment.

FIG. 34 is a block diagram of a system 1000 to which a storage device is applied, according to an embodiment.

Referring to FIG. 34, the system 1000 may include a mobile system, such as, but not limited to, a portable communication terminal (e.g., a mobile phone), a smart-phone, a tablet personal computer (PC), a wearable device, a healthcare device, or an Internet of things (IoT) device. However, the system 1000 is not limited to the mobile system and may include another electronic device, such as, but not limited to, a PC, a laptop computer, a server, a media player, or an automotive device (e.g., a navigation device).

The system 1000 may include a main processor 1100, memories 1200a and 1200b, and storage devices 1300a and 1300b.Alternatively or additionally, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control the operations of the system 1000. Alternatively or additionally, the main processor 1100 may control operations of other components included in the system 1000. The main processor 1100 may be implemented as a general-purpose processor, a dedicated processor, and/or an application processor.

The main processor 1100 may include at least one central processing unit (CPU) core 1110 and further include a controller 1120 configured to control the memories 1200a and 1200b and/or the storage devices 1300a and 1300b. In some embodiments, the main processor 1100 may further include an accelerator 1130, which may include a dedicated circuit for a high-speed data operation, such as, but not limited to, an artificial intelligence (AI) data operation. For example, the accelerator 1130 may include a graphics processing unit (GPU), a neural processing unit (NPU) and/or a data processing unit (DPU) and/or be implemented as a chip that is physically separated from the other components of the main processor 1100.

The memories 1200a and 1200b may be used as main memory devices of the system 1000. Each of the memories 1200a and 1200b may include a volatile memory, such as, but not limited to, static random access memory (SRAM) and/or dynamic random access memory (DRAM), and/or a non-volatile memory, such as, but not limited to, a flash memory, phase-change RAM (PRAM), and/or resistive random access memory (RRAM). In some embodiments, the memories 1200a and 1200b may be implemented in the same package as the main processor 1100.

The storage devices 1300a and 1300b may serve as non-volatile storage devices configured to store data regardless of whether power is supplied thereto, and may have a larger storage capacity than the memories 1200a and 1200b. The storage devices 1300a and 1300b may respectively include storage controllers 1310a and 1310b and flash memories 1320a and 1320b and be configured to store data via the control of the storage controllers 1310a and 1310b. Although the flash memories 1320a and 1320b may include vertical NAND (V-NAND) flash memories having a two-dimensional (2D) structure or a three-dimensional (3D) structure, the flash memories 1320a and 1320b may include other types of non-volatile memories (NVMs), such as PRAM and/or RRAM.

The storage devices 1300a and 1300b may be physically separated from the main processor 1100 and be included in the system 1000 and/or implemented in the same package as the main processor 1100. Alternatively or additionally, the storage devices 1300a and 1300b may have types of SSDs or memory cards and may be removably combined with other components of the system 1000 through an interface, such as a connecting interface 1480 that is described below. The storage devices 1300a and 1300b may be devices to which a standard protocol, such as, but not limited to, UFS, eMMC, NVMe, and the like may be applied, without being limited in this regard.

The image capturing device 1410 may capture still images and/or moving images. The image capturing device 1410 may include, but not be limited to, a camera, a camcorder, and/or a webcam. The user input device 1420 may receive various types of data input by a user of the system 1000 and may include, but not be limited to, a touch pad, a keypad, a keyboard, a mouse, and a microphone. The sensor 1430 may detect various types of physical quantities, which may be obtained from the outside of the system 1000, and convert the detected physical quantities into electric signals. For example, the sensor 1430 may include, but not be limited to, a temperature sensor, a pressure sensor, an illuminance sensor, a position sensor, an acceleration sensor, a biosensor, and/or a gyroscope sensor. The communication device 1440 may transmit and/or receive signals between other devices outside the system 1000, according to various communication protocols. The communication device 1440 may include, but not be limited to, an antenna, a transceiver, and/or a modem.

The display 1450 and the speaker 1460 may serve as output devices configured to respectively output visual information and auditory information to the user of the system 1000. The power supplying device 1470 may appropriately convert power supplied from a battery (not shown) embedded in the system 1000 and/or an external power source and supply the converted power to each of components of the system 1000. The connecting interface 1480 may provide connection between the system 1000 and an external device, which may be connected to the system 1000 and capable of transmitting and/or receiving data to and/or from the system 1000. The connecting interface 1480 may be implemented by using various interface schemes, such as, but not limited to, ATA, SATA, e-SATA, SCSI, SAS, PCI, PCIe, NVMe, FireWire, a USB interface, a SD card interface, an MMC interface, an eMMC interface, a UFS interface, an embedded UFS (eUFS) interface, and a CF card interface.

Figure 35:
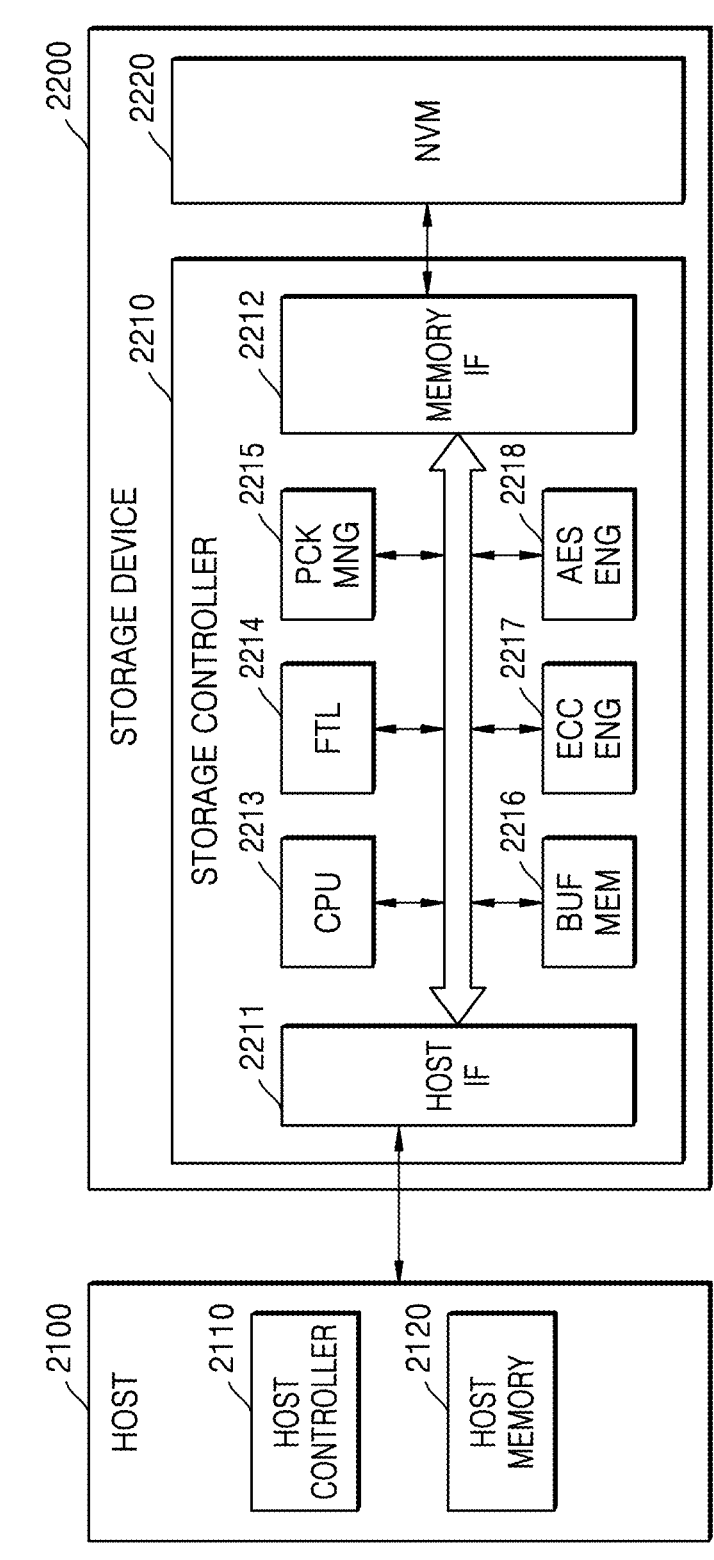
FIG. 35 is a block diagram of a storage system, according to an embodiment.

FIG. 35 is a block diagram of a storage system 2000, according to an embodiment.

Referring to FIG. 35, the storage system 2000 may include a host 2100 and a storage device 2200. In an embodiment, the storage device 2200 may include a storage controller 2210 and a non-volatile memory (e.g., NVM 2220). In an optional or additional embodiment, the host 2100 may include a host controller 2110 and a host memory 2120. The host memory 2120 may serve as a buffer memory configured to temporarily store data to be transmitted to the storage device 2200 and/or data transmitted from the storage device 2200.

The storage device 2200 may include storage media configured to store data in response to requests from the host 2100. For example, the storage device 2200 may include at least one of an SSD, an embedded memory, and a detachable external memory. When the storage device 2200 is the SSD, the storage device 2200 may be a device that conforms to an NVMe standard, for example. Alternatively or additionally, when the storage device 2200 is an embedded memory or an external memory, the storage device 2200 may be a device that conforms to a UFS standard or an eMMC standard.

Each of the host 2100 and the storage device 2200 may generate a packet according to an adopted standard protocol and transmit the packet.

When the NVM 2220 of the storage device 2200 includes a flash memory, the flash memory may include a 2D NAND memory array or a 3D (or vertical) NAND (VNAND) memory array. Alternatively or additionally, the storage device 2200 may include various other types of non-volatile memories. For example, the storage device 2200 may include, but not be limited to, MRAM, spin-transfer torque MRAM (STT-MRAM), conductive bridging RAM (CBRAM), ferroelectric RAM (FRAM), PRAM, RRAM.

According to an embodiment, the host controller 2110 and the host memory 2120 may be implemented as separate semiconductor chips. Alternatively or additionally, in some embodiments, the host controller 2110 and the host memory 2120 may be integrated into the same semiconductor chip. For example, the host controller 2110 may include any one of a plurality of modules included in an application processor. For another example, the application processor may be implemented as a System on Chip (SoC). Alternatively or additionally, the host memory 2120 may be an embedded memory included in the application processor or a non-volatile memory or a memory module, which may be outside the application processor.

The host controller 2110 may manage an operation of storing data (e.g., write data) of a buffer region of the host memory 2120 in the non-volatile memory 2220 and/or storing data (e.g., read data) of the non-volatile memory 2220 in the buffer region.

The storage controller 2210 may include a host interface 2211, a memory interface 2212, and a CPU 2213. In an embodiment, the storage controller 2210 may further include a flash translation layer (FTL) 2214, a packet manager 2215, a buffer memory 2216, an ECC engine 2217, and an advanced encryption standard (AES) engine 2218. The storage controller 2210 may further include a working memory (not shown) in which the FTL 2214 is loaded. The CPU 2213 may execute the FTL 2214 to control write and read operations on the NVM 2220.

The host interface 2211 may transmit and/or receive packets to and/or from the host 2100. A packet transmitted from the host 2100 to the host interface 2211 may include a command and/or data to be written the non-volatile memory 2220. A packet transmitted from the host interface 2211 to the host 2100 may include a response to the command and/or data read from the non-volatile memory 2220. The memory interface 2212 may transmit data to be written to the non-volatile memory 2220 and/or receive data read from the non-volatile memory 2220. The memory interface 2212 may be configured to comply with one or more standard protocols, such as, but not limited to, Toggle and/or open NAND flash interface (ONFI).

The FTL 2214 may perform various functions, such as, but not limited to, an address mapping operation, a wear-leveling operation, and a garbage collection operation. The address mapping operation may refer to an operation of converting a logical address received from the host 2100 into a physical address used to physically store data in the non-volatile memory 2220. The wear-leveling operation may refer to a technique for preventing excessive deterioration of a specific block by allowing blocks of the non-volatile memory 2220 to be uniformly used. For example, the wear-leveling operation may be implemented using a firmware technique that balances erase counts of physical blocks. The garbage collection operation may refer to a technique for ensuring usable capacity in the non-volatile memory 2220 by erasing an existing block after copying valid data of the existing block to a new block.

The packet manager 2215 may generate a packet according to a protocol of an interface, which interfaces with the host 2100, and/or parse various types of information from the packet received from the host 2100. Alternatively or additionally, the buffer memory 2216 may temporarily store data to be written to the NVM 2220 and/or data to be read from the NVM 2220. Although, in some embodiments, the buffer memory 2216 may be a component included in the storage controllers 2210, the buffer memory 2216 may be outside the storage controllers 2210.

The ECC engine 2217 may perform error detection and correction operations on read data read from the NVM 2220. For example, the ECC engine 2217 may generate parity bits for write data to be written to the NVM 2220, and the generated parity bits may be stored in the NVM 2220 together with write data. During the reading of data from the NVM 2220, the ECC engine 2217 may correct an error in the read data by using the parity bits read from the NVM 2220 along with the read data, and output error-corrected read data.

The AES engine 2218 may perform, by using a symmetric-key algorithm, at least one of an encryption operation and a decryption operation on data input to the storage controllers 2210.

Figure 36:
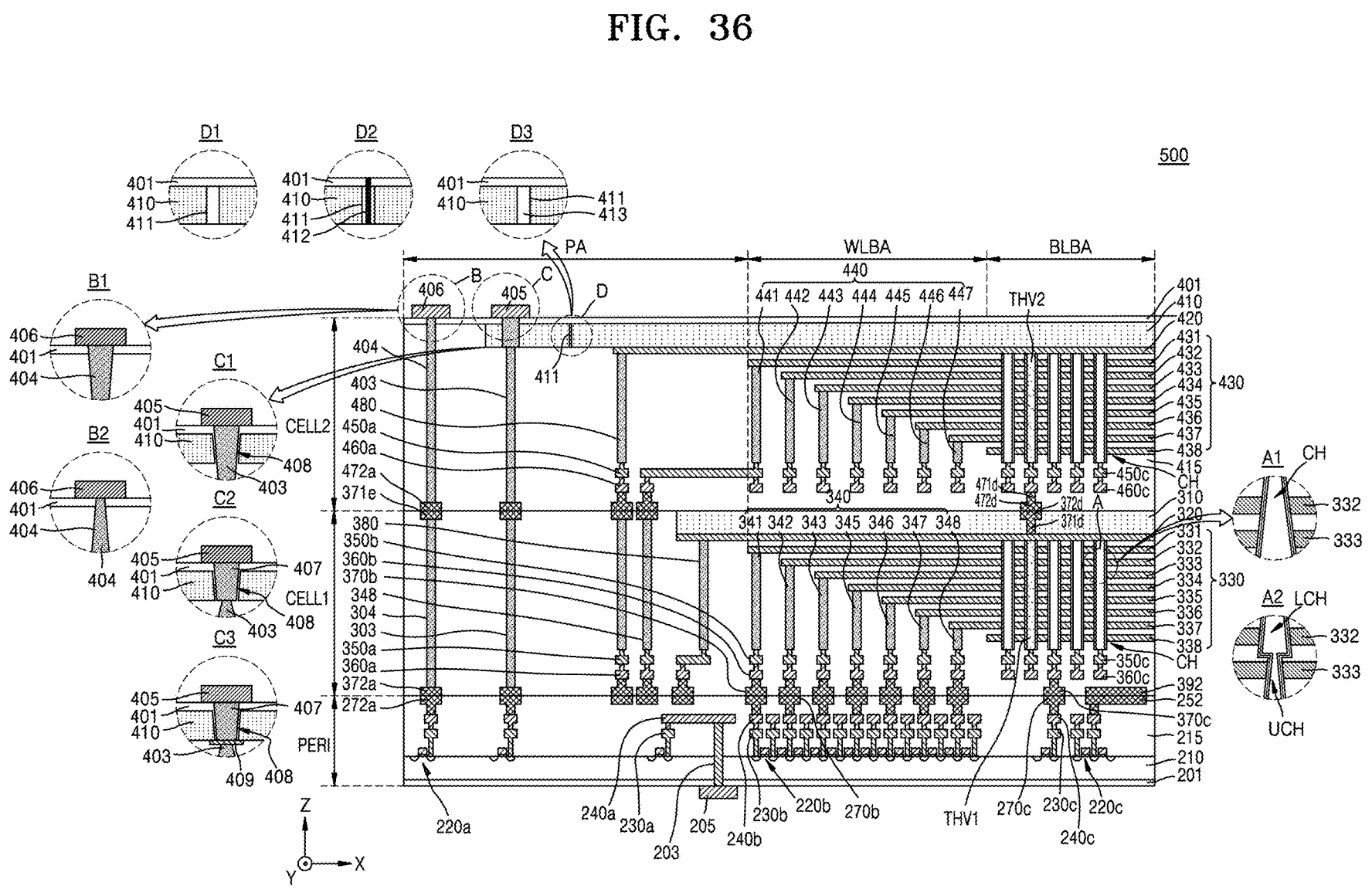

FIG. 36 is a diagram of a memory device 500, according to an embodiment.

Referring to FIG. 36, the memory device 500 may have a C2C structure. The C2C structure may refer to a structure obtained by connecting at least one upper chip including a cell area and a lower chip including a peripheral circuit area PERI to each other by using a bonding method after separately manufacturing the at least one upper chip including the cell area CELL and the lower chip including the peripheral circuit area PERI. The bonding method may refer to a method of electrically and/or physically connecting a bonding metal pattern formed on an uppermost metal layer of an upper chip and a bonding metal pattern formed on an uppermost metal layer of a lower chip to each other. For example, when the bonding metal patterns include copper (Cu), the bonding method may be a Cu-Cu bonding method. For another example, the bonding metal patterns may include, but not be limited to, aluminum (Al) and tungsten (W).

The memory device 500 may include at least one upper chip including the cell area. For example, the memory device 500 may be implemented as including two (2) upper chips. However, the number of upper chips is not limited in this regard. When the memory device 500 is implemented as including two (2) upper chips, after a first upper chip including a first cell area CELL1, a second upper chip including a second cell area CELL2, and a lower chip including the peripheral circuit area PERI are each manufactured, the first upper chip, the second upper chip, and the lower chip may be connected to each other by using a bonding method, and thus, the memory device 500 may be manufactured.

The first upper chip may be reversed and connected to the lower chip by using a bonding method, and the second upper chip may also be reversed and connected to the first upper chip by using a bonding method. In the following description, upper and lower portions of the first and second upper chips may be referred to based on orientations of the first and second upper chips before the first and second upper chips are reversed. That is, in FIG. 36, an upper portion of the lower chip may refer to an upper portion defined based on a +Z-axial direction, and the upper portion of each of the first and second upper chips may refer to an upper portion defined based on a-Z-axial direction. However, the present disclosure is not limited in this regard, and only one of the first upper chip and the second upper chip may be connected by using a bonding method.

In the memory device 500, each of the peripheral circuit area PERI and the first and second cell areas CELL1 and CELL2 may include an outer pad bonding area PA, a word line bonding area WLBA, and a bit line bonding area BLBA.

The peripheral circuit area PERI may include a first substrate 210 and a plurality of circuit elements (e.g., 220*a*, 220*b*, and 220*c*) on the first substrate 210. An interlayer insulating layer 215 including at least one insulating layer may be provided on the plurality of circuit elements 220*a*, 220*b*, and 220*c*. A plurality of metal wirings configured to connect the plurality of circuit elements 220*a*, 220*b*, and 220*c* may be provided in the interlayer insulating layer 215. For example, the plurality metal wirings may include first metal wirings 230*a*, 230*b*, and 230*c*, which are respectively connected to the circuit elements 220*a*, 220*b*, and 220*c*, and second metal wirings 240*a*, 240*b*, and 240*c*, which are formed on the first metal wirings 230*a*, 230*b*, and 230*c*. The plurality metal wirings may include at least one of various conductive materials. For example, the first metal wirings 230*a*, 230*b*, and 230*c* may include tungsten having a relatively high electrical resistivity, and the second metal wirings 240*a*, 240*b*, and 240*c* may include copper having a relatively low electrical resistivity. However, the present disclosure is not limited in this regard. That is the first and second metal lines may be formed of other materials without deviating from the scope of the disclosure.

Although only the first metal wirings 230*a*, 230*b*, and 230*c* and the second metal wirings 240*a*, 240*b*, and 240*c* are illustrated in FIG. 36, the present disclosure is not limited in this regard, and at least one additional wiring may be further formed on the second metal wirings 240*a*, 240*b*, and 240*c*. In this case, the second metal wirings 240*a*, 240*b*, and 240*c* may include aluminum. Alternatively or additionally, at least some of the additional metal wirings formed on the second metal wirings 240*a*, 240*b*, and 240*c* may include copper having a lower electrical resistivity than aluminum included in the second metal wirings 240*a*, 240*b*, and 240*c*.

The interlayer insulating layer 215 may be on the first substrate 210 and include an insulating material, such as silicon oxide and silicon nitride.

Each of the first and second cell areas CELL1 and CELL2 may include at least one memory block. The first cell area CELL1 may include a second substrate 310 and a common source line 320. A plurality of word lines 331 to 338 (or 330) may be stacked on the second substrate 310 in a direction (e.g., a Z-axial direction) perpendicular to a top surface of the second substrate 310. String selection lines and a ground selection line may be respectively above and below the plurality of word lines 330. The plurality of word lines 330 may be between the string selection lines and the ground selection line. Similarly, the second cell area CELL2 may include a third substrate 410 and a common source line 420, and a plurality of word lines 431 to 438 (or 430) may be stacked in a direction (e.g., a Z-axial direction) vertical to a top surface of the third substrate 410.

The second substrate 310 and the third substrate 410 may include various materials. For example, each of the second substrate 310 and the third substrate 410 may be a silicon substrate, a silicon-germanium substrate, a germanium substrate, or a substrate having a monocrystalline epitaxial layer grown on a monocrystalline silicon substrate. A plurality of channel structures CH may be formed on each of the first and second cell areas CELL1 and CELL2.

In an embodiment, as shown in region A1 of FIG. 36, the channel structure CH may be provided in the bit line bonding area BLBA. The channel structure CH may extend in a direction perpendicular to the top surface of the second substrate 310 and pass through the word lines 330, the string selection lines, and the ground selection line. The channel structure CH may include a data storage layer, a channel layer, and a buried insulating layer. The channel layer may be electrically connected to a first metal wiring 350c and a second metal wiring 360c in the bit line bonding area BLBA. For example, the second metal wiring 360c may be a bit line and connected to the channel structure CH through the first metal wiring 350c. The second metal wiring 360c may extend in a first direction (e.g., Y-axial direction) that is parallel to the top surface of the second substrate 310.

In an embodiment, as shown in region A2 of FIG. 36, the channel structure CH may include a lower channel LCH and an upper channel UCH, which may be connected to each other. For example, the channel structure CH may be formed by using a process of forming the lower channel LCH and a process of forming the upper channel UCH. The lower channel LCH may extend in a direction perpendicular to the top surface of the second substrate 310 and pass through the common source line 320 and lower word lines 331 and 332. The lower channel LCH may include a data storage layer, a channel layer, and a buried insulating layer and be connected to the upper channel UCH. The upper channel UCH may pass through upper word lines 333 to 338. The upper channel UCH may include a data storage layer, a channel layer, and a buried insulating layer, and the channel layer of the upper channel UCH may be electrically connected to the first metal wiring 350c and the second metal wiring 360c. As a length of a channel becomes greater, forming a channel having a constant width may be more difficult for reasons of a manufacturing process. The memory device 500 according to the embodiment may include a channel having improved width uniformity due to the lower channel LCH and the upper channel UCH, which are formed by using sequential processes.

As shown in region A2 of FIG. 36, when the channel structure CH including the lower channel LCH and the upper channel UCH is formed, a word line located near a boundary between the lower channel LCH and the upper channel UCH may be a dummy word line. For example, the lower word line 332 and the upper word line 333, which form the boundary between the lower channel LCH and the upper channel UCH, may be dummy word lines. That is, data may not be stored in memory cells connected to the dummy word line. Alternatively or additionally, the number of pages corresponding to memory cells connected to the dummy word line may be smaller than the number of pages corresponding to memory cells connected to a typical word line. A voltage level applied to the dummy word line may be different from a voltage level applied to the typical word line. Accordingly, the influence of non-uniformity between channel widths of the lower channel LCH and the upper channel UCH upon operations of the memory device 500 may be reduced.

Moreover, region A2 of FIG. 36 illustrates a case in which the number of lower word lines (e.g., 331 and 332) passing through the lower channel LCH is smaller than the number of upper word lines (e.g., 333 to 338) passing through the upper channel UCH. However, the present disclosure is not limited in this regard. For example, the number of lower word lines passing through the lower channel LCH may be greater than or equal to the number of upper word lines passing through the upper channel UCH. The above-described structure and connection relationship of the channel structure CH in the first cell area CELL1 may be equally applied to the channel structure CH in the second cell area CELL2.

In the bit line bonding area BLBA, a first through-silicon via (TSV) THV1 may be provided in the first cell area CELL1, and a second TSV THV2 may be provided in the second cell area CELL2. The first TSV THV1 may pass through the common source line 320 and a plurality of word lines 330. However, the present disclosure is not limited in this regard, the first TSV THV1 may further pass through the second substrate 310. The first TSV THV1 may include a conductive material. Alternatively or additionally, the first TSV THV1 may include a conductive material surrounded by an insulating material. The second TSV THV2 may have substantially the same shape and structure as the first TSV THV1.

In an embodiment, the first TSV THV1 may be electrically connected to the second TSV THV2 through a first through metal pattern 372d and a second through metal pattern 472d. The first through metal pattern 372d may be formed at a lower end of the first upper chip including the first cell area CELL1, and the second through metal pattern 472d may be formed at an upper end of the second upper chip including the second cell area CELL2. The first TSV THV1 may be electrically connected to the first metal wiring 350c and the second metal wiring 360c. A lower via 371d may be formed between the first TSV THV1 and the first through metal pattern 372d, and an upper via 471d may be formed between the second TSV THV2 and the second through metal pattern 472d. The first through metal pattern 372d may be connected to the second through metal pattern 472d by using a bonding method.

Alternatively or additionally, in the bit line bonding area BLBA, an upper metal pattern 252 may be formed in an uppermost metal layer of the peripheral circuit area PERI, and an upper metal pattern 392 having substantially the same shape as the upper metal pattern 252 may be formed in an uppermost metal layer of the first cell area CELL1. The upper metal pattern 392 of the first cell area CELL1 and the upper metal pattern 252 of the peripheral circuit area PERI may be electrically connected to each other by using a bonding method. In the bit line bonding area BLBA, the second metal wiring 360c may be electrically connected to a page buffer included in the peripheral circuit area PERI. For example, some of the circuit elements 220c in the peripheral circuit area PERI may provide a page buffer, and the second metal wiring 360c may be electrically connected to the circuit elements 220c, which provide the page buffer, through an upper bonding metal 370c of the first cell area CELL1 and an upper bonding metal 270c of the peripheral circuit area PERI.

In the word line bonding area WLBA, the word lines 330 of the first cell area CELL1 may extend in a second direction (e.g., X-axial direction), which are parallel to the top surface of the second substrate 310, and be connected to a plurality of cell contact plugs 341 to 347 (or 340). A first metal wiring 350b and a second metal wiring 360b may be sequentially connected to upper portions of the cell contact plugs 340 connected to the word lines 330. The cell contact plugs 340 may be connected to the peripheral circuit area PERI through an upper bonding metal 370b of the first cell area CELL1 and an upper bonding metal 270b of the peripheral circuit area PERI in the word line bonding area WLBA.

The cell contact plugs 340 may be electrically connected to a row decoder included in the peripheral circuit area PERI. For example, some of the circuit elements 220*b* in the peripheral circuit area PERI may provide the row decoder, and the cell contact plugs 340 may be electrically connected to the circuit elements 220*b*, which provides the row decoder, through the upper bonding metal 370*b* of the first cell area CELL1 and the upper bonding metal 270*b* of the peripheral circuit area PERI. In an embodiment, an operating voltage of the circuit elements 220*b* that provide the row decoder may be different from an operating voltage of the circuit elements 220*c* that provide the page buffer. For example, the operating voltage of the circuit elements 220*c* that provide the page buffer may be higher than the operating voltage of the circuit elements 220*b* that provide the row decoder.

Similarly, in the word line bonding area WLBA, the word lines 430 of the second cell area CELL2 may extend in the second direction (e.g., X-axial direction), which may be parallel to the top surface of the third substrate 410, and be connected to a plurality of cell contact plugs 441 to 447 (or 440). The cell contact plugs 440 may be connected to the peripheral circuit area PERI through an upper metal pattern 472*a* of the second cell area CELL2, a lower metal pattern 371*e* and an upper metal pattern 372*a* of the first cell area CELL1, and a cell contact plug 348.

In the word line bonding area WLBA, an upper bonding metal 370*b* may be formed in the first cell area CELL1, and an upper bonding metal 270*b* may be formed in the peripheral circuit area PERI. The upper bonding metal 370*b* of the first cell area CELL1 and the upper bonding metal 270*b* of the peripheral circuit area PERI may be electrically connected to each other by a bonding method. The upper bonding metal 370*b* and the upper bonding metal 270*b* may include, but not be limited to, aluminum, copper, and tungsten.

In the outer pad bonding area PA, a lower metal pattern 371*e* may be formed under the first cell area CELL1, and an upper metal pattern 472*a* may be formed over the second cell area CELL2. The lower metal pattern 371*e* of the first cell area CELL1 may be connected to the upper metal pattern 472*a* of the second cell area CELL2 by a bonding method in the outer pad bonding area PA. Similarly, an upper metal pattern 372*a* may be formed over the first cell area CELL1, and an upper metal pattern 272*a* may be formed over the peripheral circuit area PERI. The upper metal pattern 372*a* of the first cell area CELL1 may be connected to the upper metal pattern 272*a* of the peripheral circuit area PERI by using a bonding method.

Common source line contact plugs 380 and 480 may be in the outer pad bonding area PA. The common source line contact plugs 380 and 480 may include a conductive material, such as a metal, a metal compound, or doped polysilicon. The common source line contact plug 380 in the first cell area CELL1 may be electrically connected to the common source line 320, and the common source line contact plug 480 in the second cell area CELL2 may be electrically connected to the common source line 420. A first metal wiring 350*a* and a second metal wiring 360*a* may be sequentially stacked over the common source line contact plug 380 of the first cell area CELL1, and a first metal wiring 450*a* and a second metal wiring 460*a* may be sequentially stacked over the common source line contact plug 480 of the second cell area CELL2.

I/O pads (e.g., first to third I/O pads 205, 405, and 406) may be disposed in the outer pad bonding area PA. A lower insulating film 201 may cover a bottom surface of the first substrate 210, and the first I/O pad 205 may be formed on the lower insulating film 201. The first I/O pad 205 may be connected to at least one of the circuit elements 220*a* located in the peripheral circuit area PERI, through a first I/O contact plug 203. The first I/O pad 205 may be isolated from the first substrate 210 by the lower insulating film 201. Alternatively or additionally, a side insulating film may be between the first I/O contact plug 203 and the first substrate 210 to electrically isolate the first I/O contact plug 203 from the first substrate 210.

An upper insulating film 401 may be formed over the third substrate 410 to cover the top surface of the third substrate 410. A second I/O pad 405 and/or a third I/O pad 406 may be on the upper insulating film 401. The second I/O pad 405 may be connected to at least one of the circuit elements 220*a* located in the peripheral circuit area PERI, through second I/O contact plugs 403 and 303. The third I/O pad 406 may be connected to at least one of the circuit elements 220*a* located in the peripheral circuit area PERI, through third I/O contact plugs 404 and 304.

In an embodiment, the third substrate 410 may not be in a region in which I/O contact plugs are arranged. For example, as shown in region B of FIG. 36, the third I/O contact plug 404 may be isolated from the third substrate 410 in a direction that is parallel to the top surface of the third substrate 410. The third I/O contact plug 404 may pass through an interlayer insulating layer 415 of the second cell area CELL2 and be connected to the third I/O pad 406. In this case the, the third I/O contact plug 404 may be formed by using various processes.

In an optional or additional embodiment, as shown in region B1 of FIG. 36, the third I/O contact plug 404 may extend in a third direction (e.g., Z-axial direction), and may be formed to have a greater diameter toward the upper insulating film 401. That is, the channel structure CH described with reference to region A1 of FIG. 36 may be formed to a smaller diameter toward the upper insulating film 401, while the third I/O contact plug 404 may be formed to have a greater diameter toward the upper insulating film 401. For example, third I/O contact plug 404 may be formed after the second cell area CELL2 is bonded to the first cell area CELL1 by using a bonding method.

In an optional or additional embodiment, as shown in region B2 of FIG. 36, the third I/O contact plug 404 may extend in the third direction (e.g., Z-axial direction), and may be formed to have a smaller diameter toward the upper insulating film 401. That is, like the channel structure CH, the third I/O contact plug 404 may be formed to have a smaller diameter toward the upper insulating film 401. For example, third I/O contact plug 404 may be formed together with the cell contact plugs 440 before the second cell area CELL2 is bonded to the first cell area CELL1.

In an optional or additional embodiment, an I/O contact plug may overlap the third substrate 410. For example, as shown in C of FIG. 36, the second I/O contact plug 403 may be formed to pass through the interlayer insulating layer 415 of the second cell area CELL2 in the third direction (e.g., Z-axial direction). The second I/O contact plug 403 may be electrically connected to the second I/O pad 405 through the third substrate 410. In this case, a structure configured to connect the second I/O contact plug 403 and the second I/O pad 405 may be implemented in various ways.

In an optional or additional embodiment, as shown in region C1 of FIG. 36, an opening 408 may be formed to pass through the third substrate 410, and the second I/O contact plug 403 may be directly connected to the second I/O pad 405 through the opening 408 formed in the third substrate 410. In this case, as shown in region C1 of FIG. 36, the second I/O contact plug 403 may be formed to have a greater diameter toward the second I/O pad 405. However, the present disclosure is not limited in this regard. For example, the second I/O contact plug 403 may be formed to have a smaller diameter toward the second I/O pad 405.

In an optional or additional embodiment, as shown in region C2 of FIG. 36, the opening 408 may be formed to pass through the third substrate 410, and a contact 407 may be formed inside the opening 408. One end of the contact 407 may be connected to the second I/O pad 405, while another end of the contact 407 may be connected to the second I/O contact plug 403. Accordingly, the second I/O contact plug 403 may be electrically connected to the second I/O pad 405 through the contact 407 formed inside the opening 408. That is, as shown in C2 of FIG. 36, a diameter of the contact 407 may increase toward the second I/O pad 405, and the second I/O contact plug 403 may be formed to have a smaller diameter toward the second I/O pad 405. For example, the third I/O contact plug 404 may be formed together with the cell contact plugs 440 before the second cell area CELL2 is bonded to the first cell area CELL1, while the contact 407 may be formed after the second cell area CELL2 is bonded to the first cell area CELL1.

In an optional or additional embodiment, as shown in region C3 of FIG. 36, unlike region C2, a stopper 409 may be further formed on a top surface of the opening 408 of the third substrate 410. The stopper 409 may be a metal wiring formed at the same layer as the common source line 420. However, the present disclosure is not limited in this regard, and the stopper 409 may be a metal wiring formed at the same layer as at least one of the word lines 430. The second I/O contact plug 403 may be electrically connected to the second I/O pad 405 through the contact 407 and the stopper 409.

Similarly to the second and third I/O contact plug 403 and 404 of the second cell area CELL2, each of the second and third I/O contact plugs 303 and 304 of the first cell area CELL1 may be formed to a smaller diameter toward the lower metal pattern 371e and/or may be formed to a greater diameter toward the lower metal pattern 371e.

In some embodiments, a slit 411 may be formed in the third substrate 410. For example, the slit 411 may be formed at an arbitrary position of the outer pad bonding area PA. For example, as shown in region D of FIG. 36, the slit 411 may be between the second I/O pad 405 and the cell contact plugs 440 in a view from above. However, the present disclosure is not limited in this regard. In a view from above, the slit 411 may be formed such that the second I/O pad 405 is between the slit 411 and the cell contact plugs 440.

In an optional or additional embodiment, as shown in region D1 of FIG. 36, the slit 411 may be formed to pass through the third substrate 410. For example, the slit 411 may be used to prevent the third substrate 410 from being finely split during the formation of the opening 408. However, the present disclosure is not limited in this regard. For example, the slit 411 may be formed to a depth of approximately 60% to approximately 70% of a thickness of the third substrate 410.

For example, as shown in region D2 of FIG. 36, a conductive material 412 may be formed inside the slit 411. The conductive material 412 may be used to discharge leakage current, which may be generated during the driving of the circuit elements in the outer pad bonding area PA, to the outside. In this case, the conductive material 412 may be connected to an external ground line.

In an optional or additional embodiment, as shown in region D3 of FIG. 36, an insulating material 413 may be formed inside the slit 411. For example, the insulating material 413, may be formed to electrically isolate the second I/O pad 405 and the second I/O contact plug 403, which are in the outer pad bonding area PA, from the word line bonding area WLBA. By forming the insulating material 413 inside the slit 411, a voltage provided through the second I/O pad 405 may be blocked from affecting a metal layer located on the third substrate 410 in the word line bonding area WLBA.

In some embodiments, first to third I/O pads 205, 405, and 406 may be optionally formed. For example, the memory device 500 may include only the first I/O pad 205 located over the first substrate 210, include only the second I/O pad 405 located over the third substrate 410, or include only the third I/O pad 406 located over the upper insulating film 401.

In some embodiments, at least one of the second substrate 310 of the first cell area CELL1 and the third substrate 410 of the second cell area CELL2 may be used as a sacrificial substrate and may be completely or partially removed before or after the bonding process. After the sacrificial substrate is removed, an additional film may be stacked on the resultant structure. For example, the second substrate 310 of the first cell area CELL1 may be removed before or after the peripheral circuit area PERI is bonded to the first cell area CELL1, and an insulating film covering a top surface of the common source line 320 or a conductive film for connection may be formed on the resultant structure. Similarly, the third substrate 410 of the second cell area CELL2 may be removed before or after the first cell area CELL1 is bonded to the second cell area CELL2, and the upper insulating film 401 covering the top surface of the common source line 420 or a conductive film for connection may be formed on the resultant structure.

Figure 37:
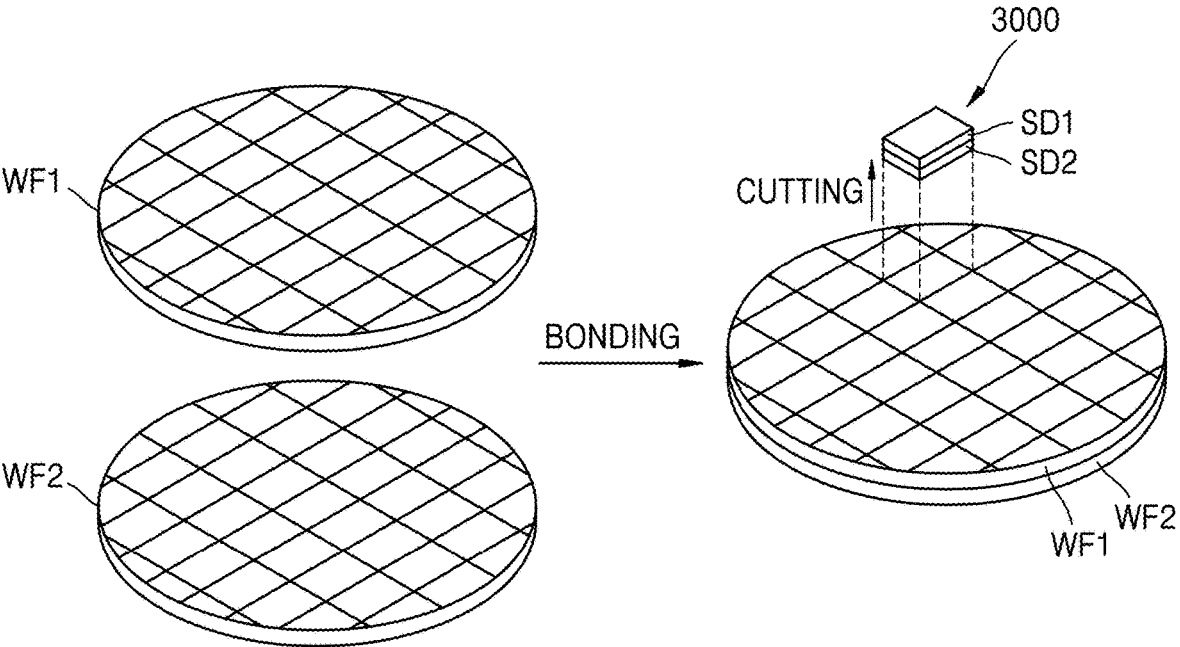
FIG. 37 is a diagram of a process of manufacturing a stack-type semiconductor device, according to an embodiment.

FIG. 37 is a diagram of a process of manufacturing a semiconductor device 3000 of a stack type, according to an embodiment.

Referring to FIG. 37, integrated circuits (ICs) may be respectively formed on a first wafer WF1 and a second wafer WF2. For example, the memory cell array 211 described above with reference to FIG. 2 may be formed on the first wafer WF1, and peripheral circuits (e.g., a control logic 220, a voltage generator 230, a row decoder 240, and a page buffer circuit 250), which are described above with reference to FIG. 2, may be formed on the second wafer WF2.

While the ICs are being formed on the first wafer WF1 and the second wafer WF2, the first wafer WF1 and the second wafer WF2 may be adhered to each other by using a bonding method. The first and second wafers WF1 and WF2, which are bonded to each other, may be cut into a plurality of chips, each of which may correspond to a semiconductor device 3000 including first and second semiconductor dies SD1 and SD2 that are stacked. A cut portion of the first wafer WF1 may correspond to the first semiconductor die SD1, and a cut portion of the second wafer WF2 may correspond to the second semiconductor die SD2.

Because the memory cell array 211 is formed in the first wafer WF1, the first wafer WF1 may include a plurality of memory blocks BLK. When the first wafer WF1 is cut into the plurality of chips, the first wafer WF1 may have a circular shape as shown in FIG. 37. As a result, physical properties of the plurality of memory blocks BLK may vary according to a position of a chip that is cut from the first wafer WF1. Accordingly, a degree of coupling effects of adjacent memory cells may be different for each specific chip, and also may be different for each of the plurality of memory blocks BLK included in the specific chip. In a data recovery read operation described above, even when degrees of degradation of different threshold voltage distributions are different for each chip and/or each memory block, an optimized read voltage corresponding to each chip and/or each memory block may be calculated. Consequently, probability that the data recovery read operation is a read pass may increase.

While the present disclosure has been particularly shown and described with reference to embodiments thereof, it is to be understood that various changes in form and details may be made therein without departing from the spirit and scope of the following claims.

What is claimed is:

1. An operating method of a storage device, the operating method comprising:

obtaining a first valley point from among a plurality of points by sequentially applying voltages that correspond to read voltage levels of the plurality of points to a selection word line, each point of the plurality of points comprising a read voltage level and a memory cell count value;

calculating, using a first function, a first voltage level that corresponds to a first reference count value;

calculating, using a second function, a second voltage level that corresponds to the first reference count value;

classifying selection memory cells coupled to the selection word line into a plurality of coupling patterns, according to an aggressor cell group of each of adjacent memory cells coupled to at least one adjacent word line adjacent to the selection word line; and performing a read operation, based on the plurality of coupling patterns, the first voltage level, and the second voltage level.

2. The operating method of claim 1, wherein the plurality of points comprises:

first points comprising a first read voltage level and a first memory cell count value;

second points comprising a second read voltage level and a second memory cell count value;

third points comprising a third read voltage level and a third memory cell count value fourth points comprising a fourth read voltage level and a fourth memory cell count value fifth points comprising a fifth read voltage level and a fifth memory cell count value, and wherein the first valley point corresponds to a point comprising a smallest memory cell count from among memory cell count values of the plurality of points.

3. The operating method of claim 1, wherein:

the first function corresponds to first points from among the plurality of points, the first points have first read voltage levels higher than or equal to a valley read voltage level of the first valley point, the first reference count value is smaller than a first memory cell count value of the first valley point, the second function corresponds to second points from among the plurality of points, and the second points have second read voltage levels smaller than or equal to the valley read voltage level of the first valley point.

4. The operating method of claim 1, wherein:

the first valley point occurs between a first threshold voltage distribution and a second threshold voltage distribution, and the first reference count value corresponds to a difference between a first area of the first threshold voltage distribution and a second area of the second threshold voltage distribution.

5. The operating method of claim 4, wherein:

a second reference count value is smaller than a second memory cell count value of a second valley point that occurs between a third threshold voltage distribution and a fourth threshold voltage distribution, the first reference count value is smaller than the second reference count value, a third area of the third threshold voltage distribution matches the first area of the first threshold voltage distribution and the second area of the second threshold voltage distribution, and a fourth area of the fourth threshold voltage distribution is greater than the third area of the third threshold voltage distribution.

6. The operating method of claim 5, wherein:

a third reference count value is smaller than a third memory cell count value of a third valley point that occurs between a fifth threshold voltage distribution and a sixth threshold voltage distribution, the first reference count value is greater than the third reference count value, a fifth area of the fifth threshold voltage distribution matches the first area of the first threshold voltage distribution and the second area of the second threshold voltage distribution, and a sixth area of the sixth threshold voltage distribution is smaller area than the fifth area of the fifth threshold voltage distribution.

7. The operating method of claim 1, wherein the first reference count value is inversely proportional to a square root of a number of types of the plurality of coupling patterns.

8. The operating method of claim 1, wherein the performing of the read operation comprises:

calculating sub-read voltage levels corresponding to the plurality of coupling patterns, based on the first voltage level and the second voltage level; and sequentially reading data stored in memory cells having a matching coupling pattern, from among the selection memory cells, by sequentially applying, to the selection word line, sub-read voltages having the sub-read voltage levels.

9. The operating method of claim 8, wherein:

the plurality of coupling patterns comprise a first coupling pattern and a second coupling pattern, and the calculating of the sub-read voltage levels comprises:

calculating the first voltage level as a first sub-read voltage level corresponding to the first coupling pattern; and calculating the second voltage level as a second sub-read voltage level corresponding to the second coupling pattern.

10. The operating method of claim 8, wherein:

the plurality of coupling patterns comprise M coupling patterns, wherein M is an integer greater than two, and the calculating of the sub-read voltage levels comprises:

calculating the first voltage level as a first sub-read voltage level corresponding to a first coupling pattern of the plurality of coupling patterns;

calculating the second voltage level as an M-th sub-read voltage level corresponding to an M-th coupling pattern of the plurality of coupling patterns; and sequentially calculating voltage levels, which are equidistantly divided between the first voltage level and the second voltage level, as second to M−1-th sub-read voltage levels corresponding to the second to M−1-th coupling patterns.

11. An operating method of a storage controller, the operating method comprising:

obtaining a plurality of points by searching for a valley point between threshold voltage distributions of selection memory cells of a plurality of word lines, each point of the plurality of points comprising a read voltage level and a memory cell count value;

calculating, using a first function, a first voltage level that corresponds to a first reference count value, the first function corresponding to first points from among the plurality of points having first read voltage levels higher than or equal to a valley read voltage level of the valley point, the first reference count value being smaller than a first memory cell count value of the valley point;

calculating, using a second function, a second voltage level that corresponds to the first reference count value, the second function corresponding to second points from among the plurality of points having second read voltage levels smaller than or equal to the valley read voltage level of the valley point;

grouping, into a plurality of aggressor cell groups, adjacent memory cells connected to at least one adjacent word line, the at least one adjacent word line being adjacent to a selection word line coupled to the selection memory cells;

classifying the selection memory cells into a plurality of coupling patterns according to each of the plurality of aggressor cell groups; and calculating a third read voltage level to be applied to the selection memory cells, based on the plurality of coupling patterns of the selection memory cells, the first voltage level, and the second voltage level.

12. The operating method of claim 11, wherein the calculating of the first voltage level and the calculating of the second voltage level comprises:

obtaining, using a linear regression model, a first linear function that minimizes distances between the first linear function and the first points from among the plurality of points, the first points comprising at least two points from among the plurality of points and the valley point; and obtaining, using the linear regression model, a second linear function that minimizes distances between the second linear function and the second points from among the plurality of points, the second points comprising at least two other points from among the plurality of points and the valley point.

13. The operating method of claim 11, wherein the grouping of the adjacent memory cells into the plurality of aggressor cell groups comprises:

controlling a non-volatile memory to sequentially apply at least one group determination read voltage to one adjacent word line; and grouping, into a same cell group, adjacent memory cells having corresponding threshold voltages comprised in a same voltage level section from among voltage level sections divided by a voltage level of the at least one group determination read voltage, from among the adjacent memory cells connected to the at least one adjacent word line.

14. The operating method of claim 11, wherein the grouping of the adjacent memory cells into the plurality of aggressor cell groups comprises:

controlling a non-volatile memory to apply at least one first group determination read voltage to a first adjacent word line, which is adjacent to the selection word line in a first direction;

grouping, into a first aggressor cell group, adjacent memory cells having first corresponding threshold voltages comprised in a same voltage level section from among voltage level sections divided by at least one first voltage level of the at least one first group determination read voltage, from among first adjacent memory cells coupled to the first adjacent word line;

controlling the non-volatile memory to apply at least one second group determination read voltage to a second adjacent word line, which is adjacent to the selection word line in a second direction opposite to the first direction; and grouping, into a second aggressor cell group, adjacent memory cells having second corresponding threshold voltages comprised in a same voltage level section from among voltage level sections divided by at least one second voltage level of the at least one second group determination read voltage, from among second adjacent memory cells coupled to the second adjacent word line.

15. The operating method of claim 11, wherein:

the plurality of coupling patterns comprise a first coupling pattern and a second coupling pattern, the calculating of the third read voltage level comprises:

calculating the first voltage level as a first sub-read voltage level corresponding to the first coupling pattern; and calculating the second voltage level as a second sub-read voltage level corresponding to the second coupling pattern.

16. The operating method of claim 11, wherein:

the plurality of coupling patterns comprise M coupling patterns, wherein M is an integer greater than two, the calculating of the third read voltage level comprises:

calculating the first voltage level as a first sub-read voltage level corresponding to a first coupling pattern;

calculating the second voltage level as an M-th sub-read voltage level corresponding to an M-th coupling pattern; and sequentially calculating voltage levels, which are equidistantly divided between the first voltage level and the second voltage level, as second to M−1-th sub-read voltage levels corresponding respectively to second to M−1-th coupling patterns, and first to M-th sub-read voltages having the first to M-th sub-read voltage levels are calculated as the third read voltage level.

17. A non-volatile memory device, comprising:

a memory cell array comprising a plurality of memory cells coupled to a plurality of word lines;

a voltage generator configured to generate word line voltages that are applied to the plurality of word lines; and a control logic circuit configured to provide a voltage control signal to the voltage generator, the voltage control signal instructing generation of the word line voltages, wherein the voltage generator is further configured to:

sequentially apply, during a first period, a plurality of read voltages to a selection word line from among the plurality of word lines;

apply, during a second period, at least one group determination read voltage to at least one adjacent word line, which is adjacent to the selection word line; and sequentially apply, during a third period, sub-read voltages to the selection word line, the sub-read voltages corresponding to a plurality of coupling patterns of selection memory cells having been determined according to a plurality of aggressor cell groups classified after the second period.

18. The non-volatile memory device of claim 17, wherein the sub-read voltages comprise:

a first voltage level corresponding to a reference count value in a first linear function that minimizes first distances between the first linear function and points comprising first read voltages and memory cell count values corresponding to the first read voltages in threshold voltage distributions of the selection memory cells; and a second voltage level corresponding to the reference count value in a second linear function that minimizes second distances between the second linear function and points comprising second read voltages and memory cell count values corresponding to the second read voltages in the threshold voltage distributions of the selection memory cells, wherein the first read voltages having levels higher than or equal to a level of a valley read voltage corresponding to a valley point searched after the first period, from among the plurality of read voltages, wherein the reference count value is smaller than a memory cell count value corresponding to the valley point, and wherein the second read voltages having levels equal to or smaller than the level of the valley read voltage corresponding to the valley point, from among the plurality of read voltages.

19. The non-volatile memory device of claim 17, wherein:

the voltage generator is further configured to sequentially apply at least one first group determination read voltage to a first adjacent word line and at least one second group determination read voltage to a second adjacent word line, the first adjacent word line being adjacent to the selection word line in a first direction, and the second adjacent word line being adjacent to the selection word line in a second direction opposite to the first direction.

20. The non-volatile memory device of claim 17, wherein the control logic circuit comprises a cell counter configured to generate another memory cell count value corresponding to a number of OFF cells, from among the plurality of memory cells.

* * * * *